(12) United States Patent
Makita et al.

(10) Patent No.: US 9,117,704 B2
(45) Date of Patent: Aug. 25, 2015

(54) SEMICONDUCTOR DEVICE, AND MANUFACTURING METHOD FOR SAME

(71) Applicant: Sharp Kabushiki Kaisha, Osaka-shi, Osaka (JP)

(72) Inventors: Naoki Makita, Osaka (JP); Hiroki Mori, Osaka (JP); Masaki Saitoh, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/526,587

(22) Filed: Oct. 29, 2014

(65) Prior Publication Data

US 2015/0048377 A1    Feb. 19, 2015

Related U.S. Application Data

(62) Division of application No. 13/575,959, filed as application No. PCT/JP2011/052010 on Feb. 1, 2011, now Pat. No. 8,901,650.

(30) Foreign Application Priority Data

Feb. 2, 2010 (JP) ................................ 2010-021616

(51) Int. Cl.
*H01L 27/12* (2006.01)
*H01L 29/786* (2006.01)
(Continued)

(52) U.S. Cl.
CPC .......... *H01L 27/1214* (2013.01); *H01L 27/092* (2013.01); *H01L 27/1108* (2013.01); *H01L 27/1222* (2013.01); *H01L 27/1277* (2013.01); (Continued)

(58) Field of Classification Search
CPC .............. H01L 2251/308; H01L 27/12; H01L 29/66772; H01L 29/78696; H01L 51/0052; H01L 51/0067; H01L 51/0068; H01L 51/007; H01L 51/0072; H01L 51/0081; H01L 51/0085; H01L 51/0545; H01L 51/5012
See application file for complete search history.

(56) References Cited

U.S. PATENT DOCUMENTS 7,846,783 B2 * 12/2010 Mehrotra et al. ............. 438/142
8,283,711 B2 * 10/2012 Jin et al. ......................... 257/295
(Continued)

OTHER PUBLICATIONS

Makita et al., "Semiconductor Device, and Manufacturing Method for Same", U.S. Appl. No. 13/575,959, filed Jul. 30, 2012.

*Primary Examiner* — Stephen W Smoot
*Assistant Examiner* — Edward Chin
(74) *Attorney, Agent, or Firm* — Keating & Bennett, LLP

(57) ABSTRACT

A semiconductor device of the present invention includes an n-channel first thin film transistor and a p-channel second thin film transistor on one and the same substrate. The first thin film transistor has a first semiconductor layer (27), and the second thin film transistor has a second semiconductor layer (22). The first semiconductor layer (27) and the second semiconductor layer (22) are formed from one and the same film. Each of the first semiconductor layer (27) and the second semiconductor layer (22) has a slope portion (27e, 22e) positioned in the periphery and a main portion (27m, 22m) which is a portion excluding the slope portion. A p-type impurity is introduced into only a part of the slope portion (27e) of the first semiconductor layer with higher density than the main portion (27m) of the first semiconductor layer, the main portion (22m) of the second semiconductor layer, and the slope portion (22e) of the second semiconductor layer. Accordingly, a driving voltage of the semiconductor device provided with the n-type TFT and the p-type TFT can be reduced.

18 Claims, 37 Drawing Sheets

(51) Int. Cl.
  *H01L 27/092*  (2006.01)
  *H01L 27/11*  (2006.01)
  *H01L 29/04*  (2006.01)

(52) U.S. Cl.
  CPC .......... *H01L 27/1288* (2013.01); *H01L 29/045* (2013.01); *H01L 29/78696* (2013.01)

(56) References Cited

U.S. PATENT DOCUMENTS

| | | | |
|---|---|---|---|
| 8,334,579 B2 * | 12/2012 | Yeh et al. | 257/475 |
| 8,361,848 B2 * | 1/2013 | Lee et al. | 438/171 |
| 8,465,795 B2 * | 6/2013 | Lujan et al. | 427/97.1 |
| 2003/0077453 A1 * | 4/2003 | Oaku et al. | 428/415 |
| 2006/0157748 A1 * | 7/2006 | Chong et al. | 257/288 |
| 2008/0014693 A1 * | 1/2008 | Matocha | 438/238 |
| 2009/0096965 A1 * | 4/2009 | Nagata | 349/103 |
| 2010/0078645 A1 * | 4/2010 | Kurz et al. | 257/66 |
| 2010/0164001 A1 * | 7/2010 | Park et al. | 257/369 |
| 2010/0308335 A1 * | 12/2010 | Kim et al. | 257/59 |
| 2010/0327370 A1 * | 12/2010 | Jan et al. | 257/380 |
| 2011/0171810 A1 * | 7/2011 | Tseng et al. | 438/382 |
| 2011/0318897 A1 * | 12/2011 | Shang et al. | 438/382 |
| 2013/0049168 A1 * | 2/2013 | Yang et al. | 257/538 |
| 2013/0105912 A1 * | 5/2013 | Hsu et al. | 257/379 |
| 2013/0126955 A1 * | 5/2013 | Wang et al. | 257/296 |

* cited by examiner

FIG.4
(a)
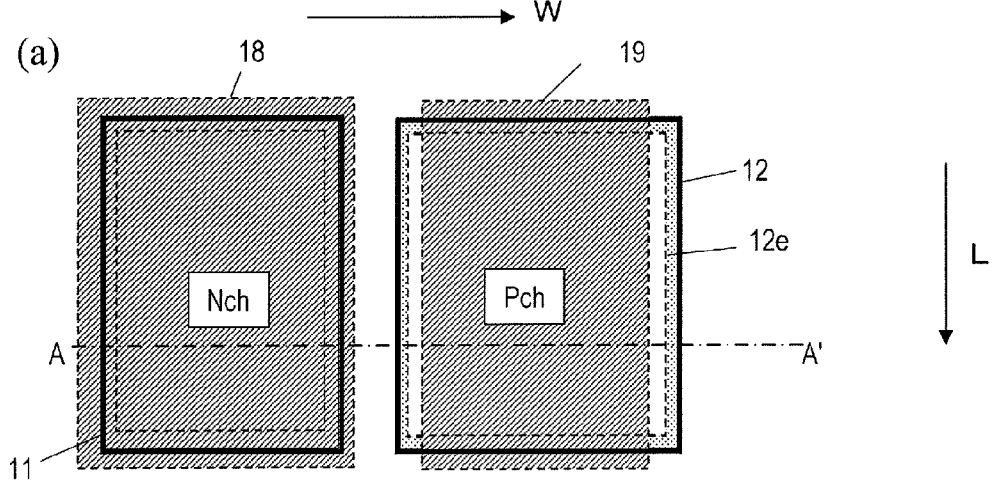
(b)
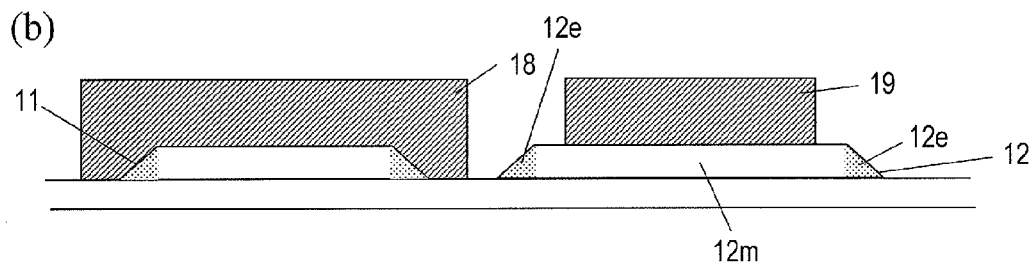
FIG.5
(a)
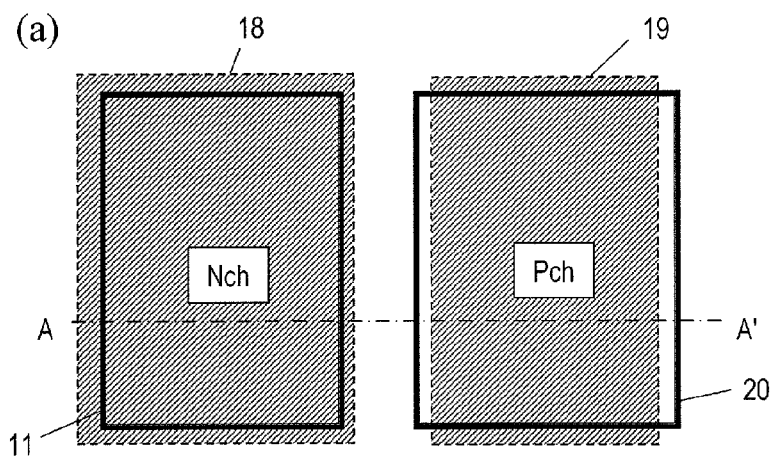
(b)
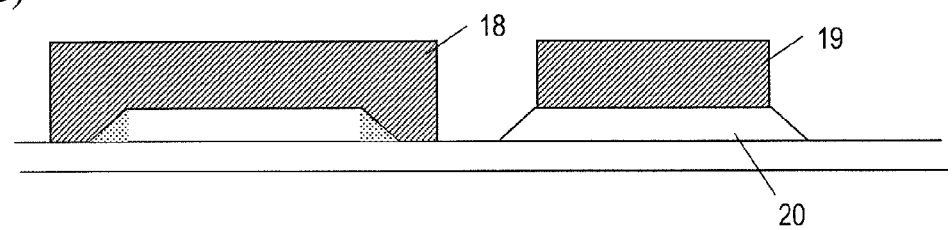

n-TYPE TFT REGION | p-TYPE TFT REGION

FIG.15
(a)
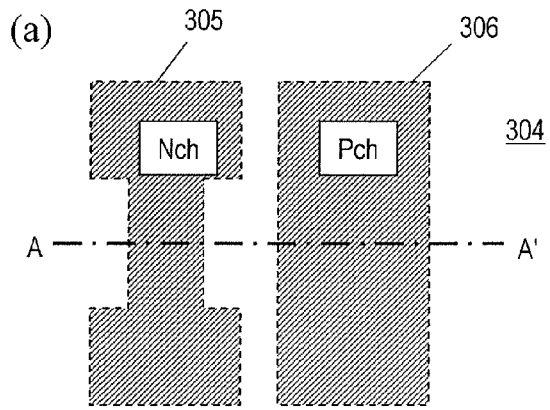
(b)
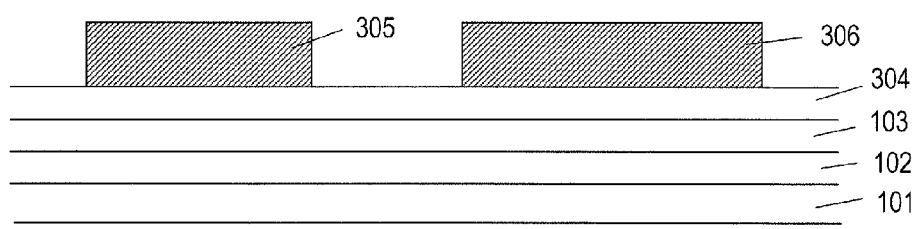
FIG.16
(a)
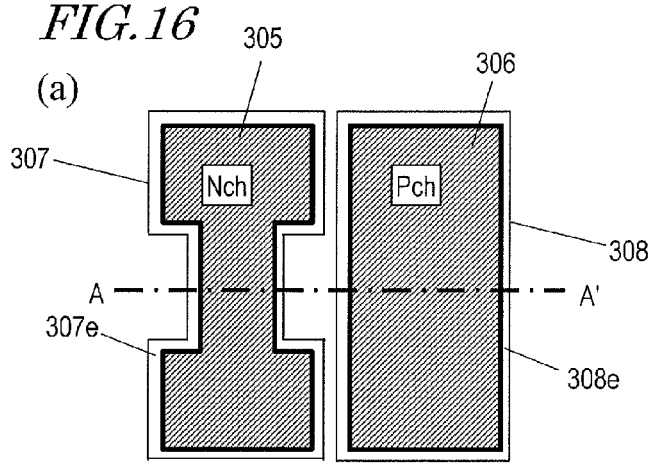
(b)
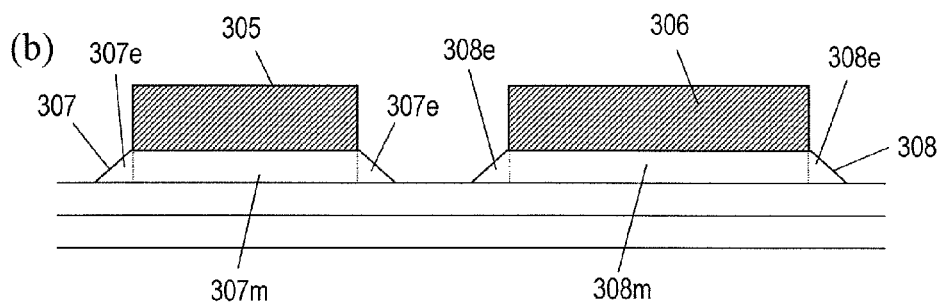

FIG.21
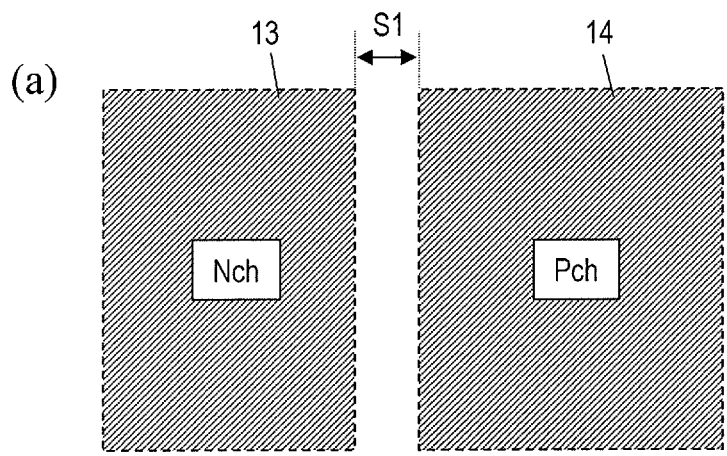
(a)
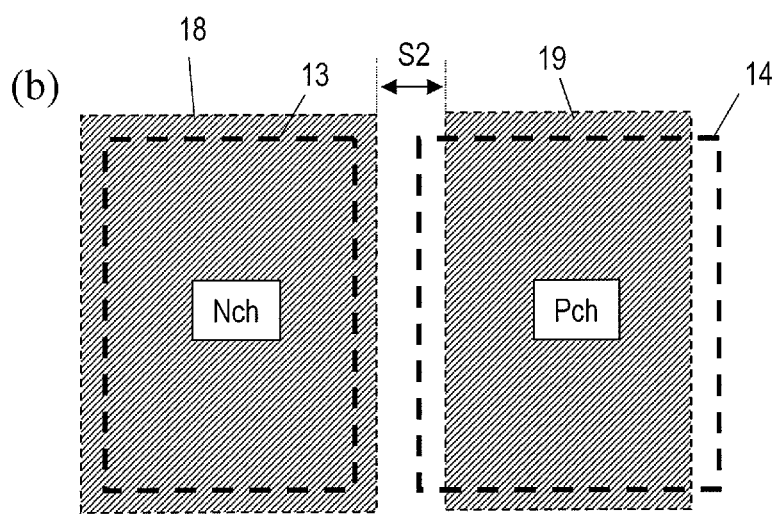
(b)
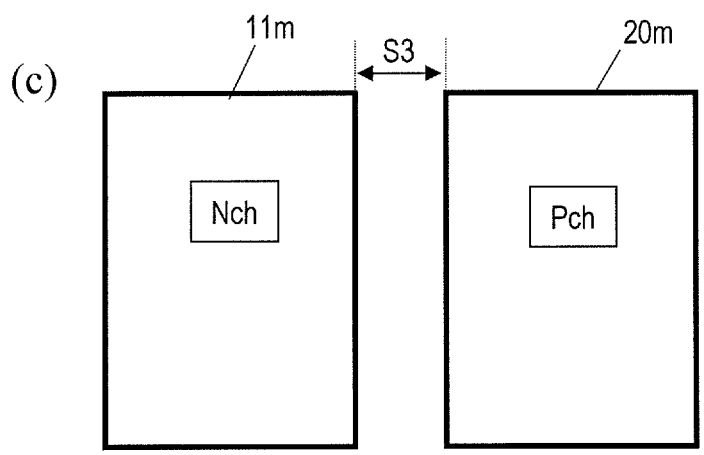
(c)

FIG. 30
(a) 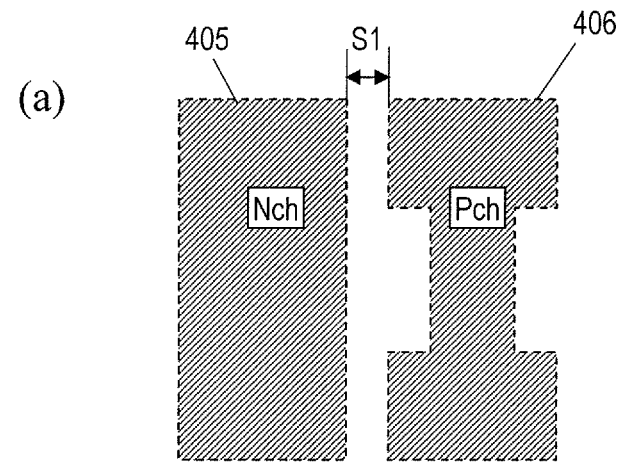
(b) 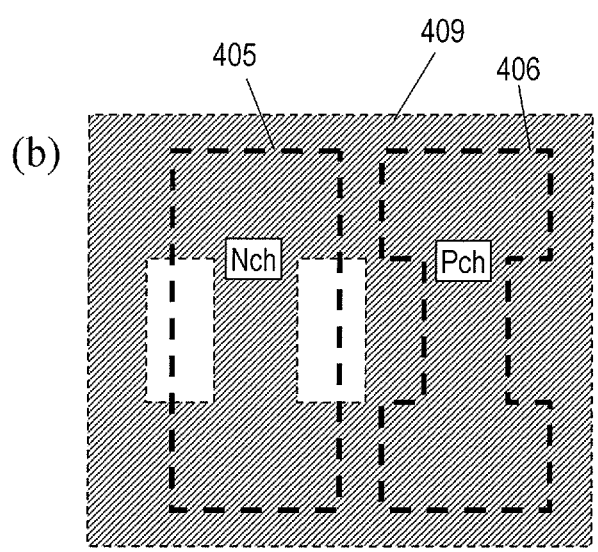
(c) 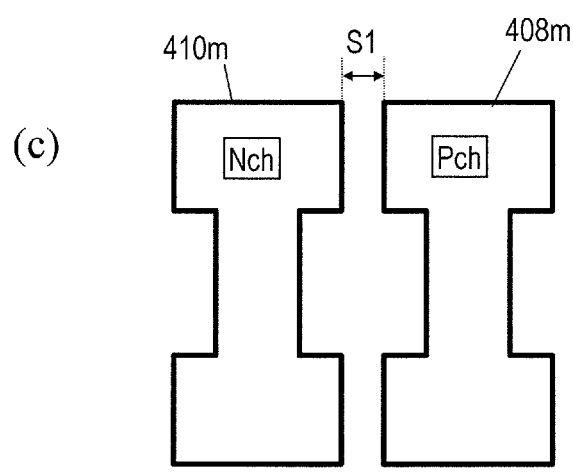

FIG. 42
(a)
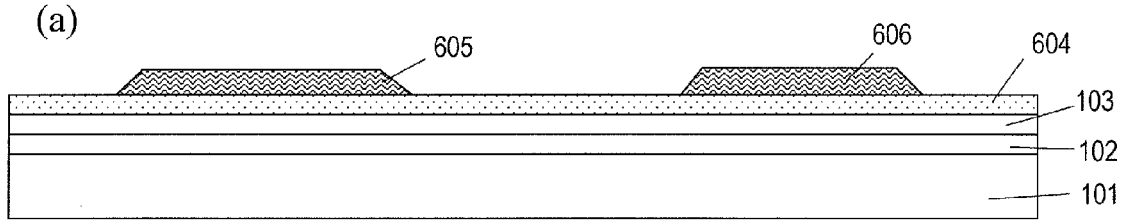
(b)
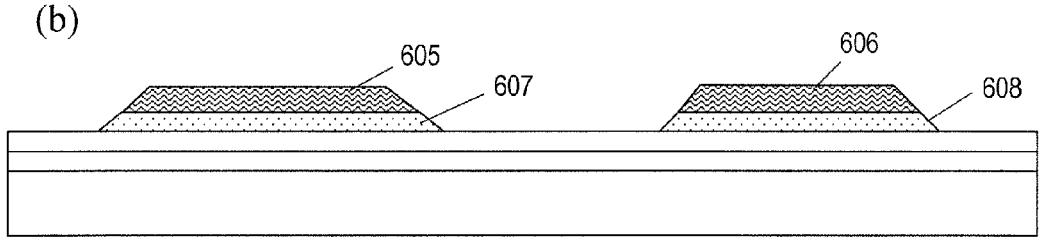
(c)
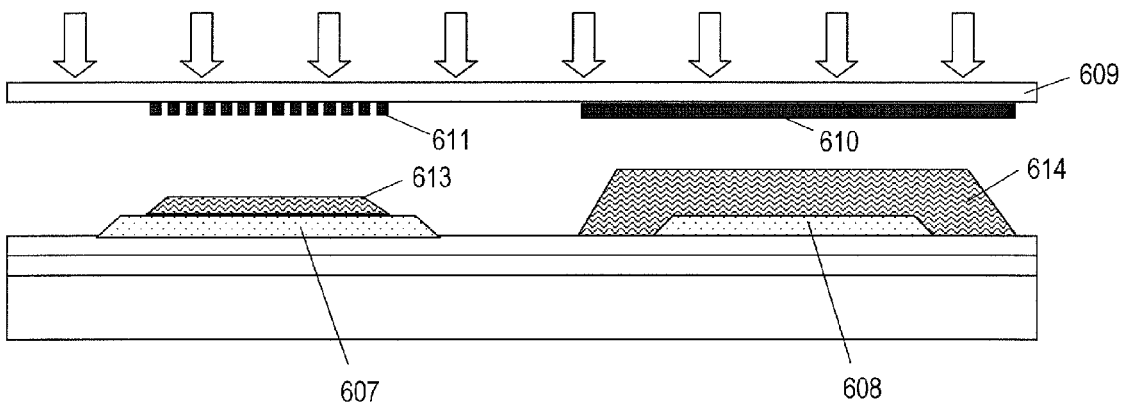
(d)
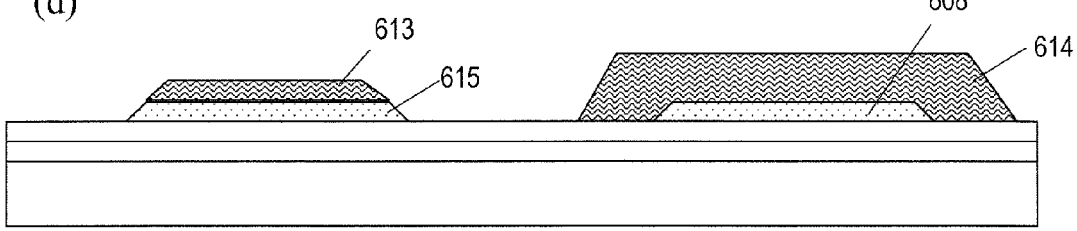

FIG.43
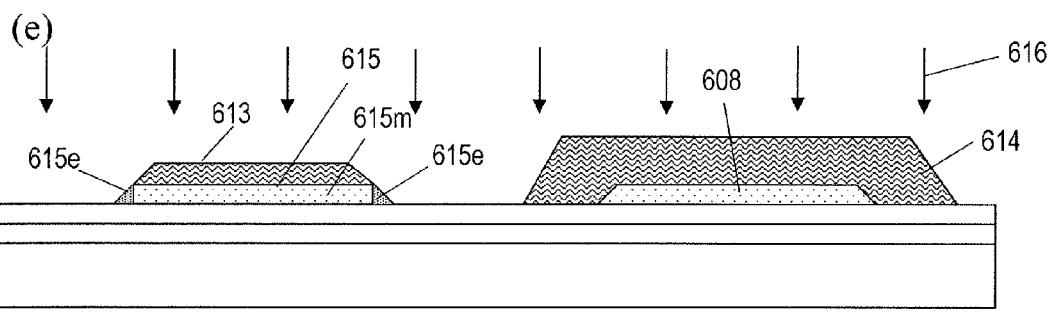
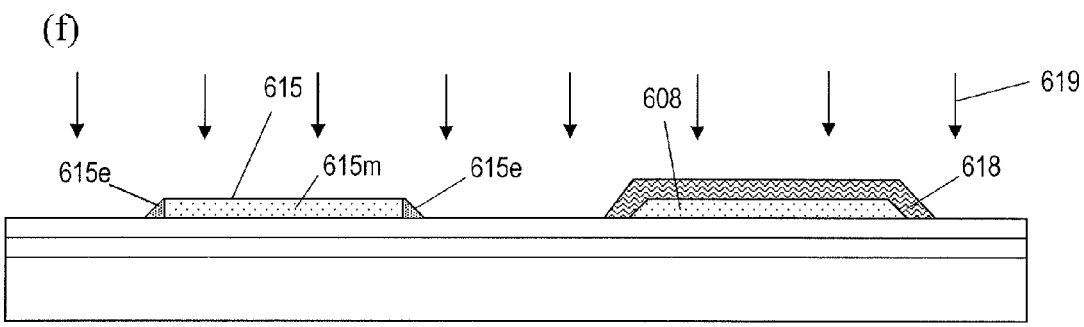
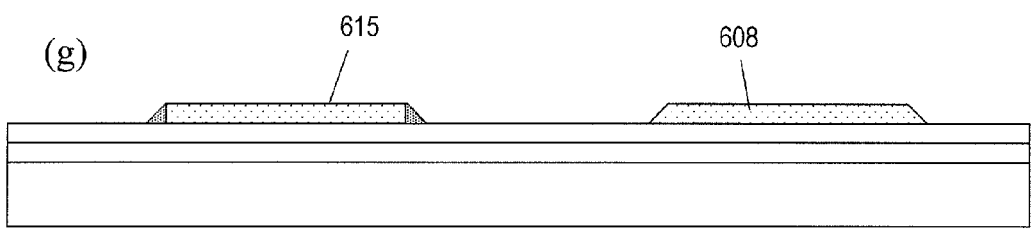
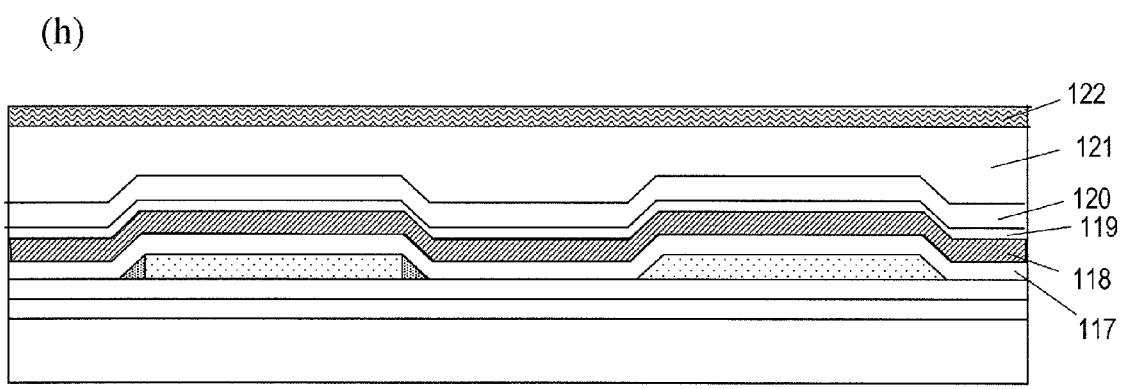

FIG. 44
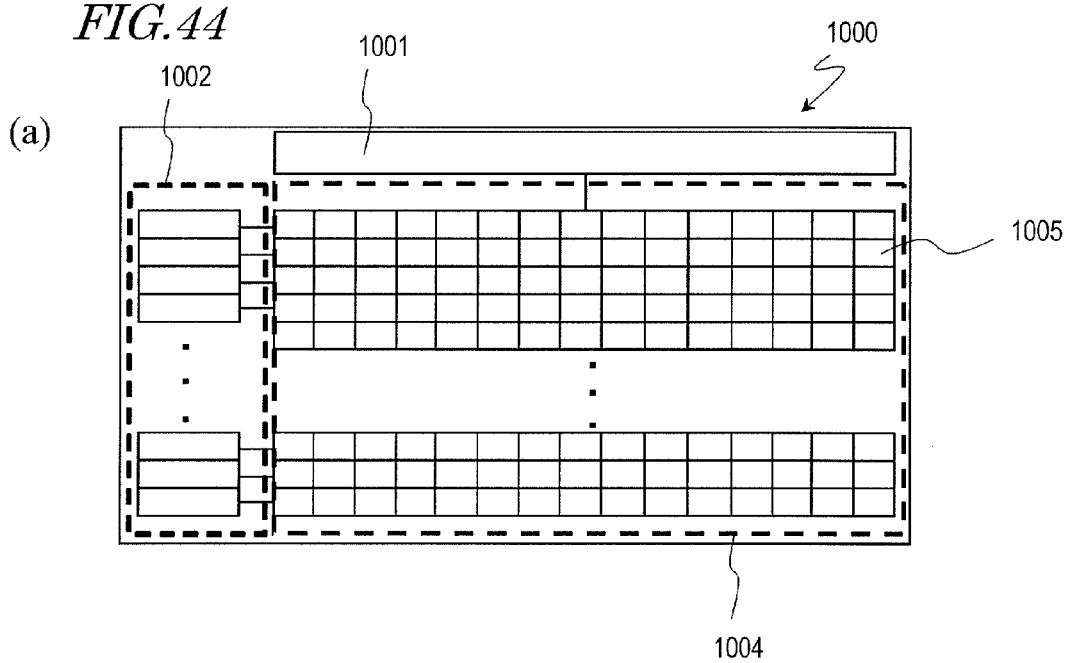
(a)
(b)
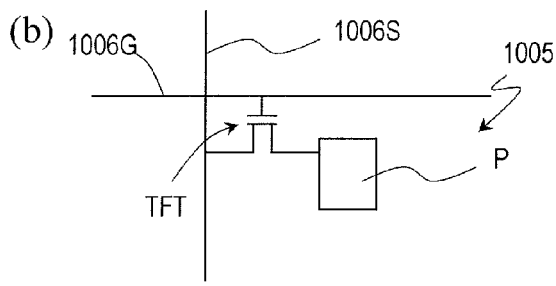
FIG. 45
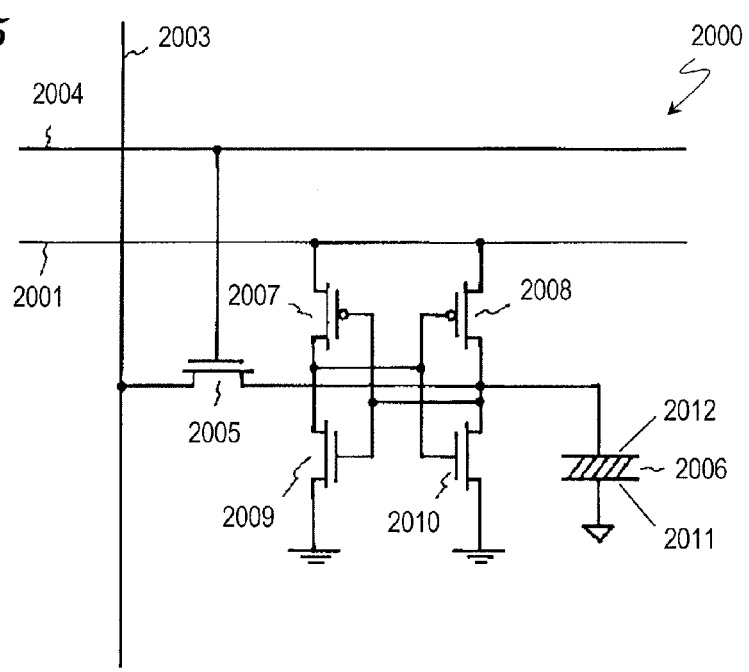

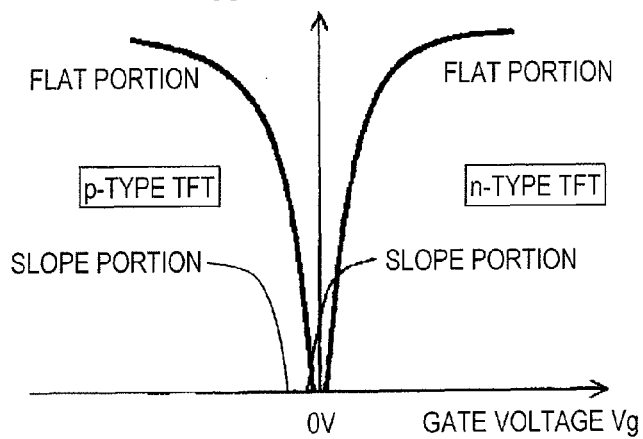
FIG.46 PRIOR ART
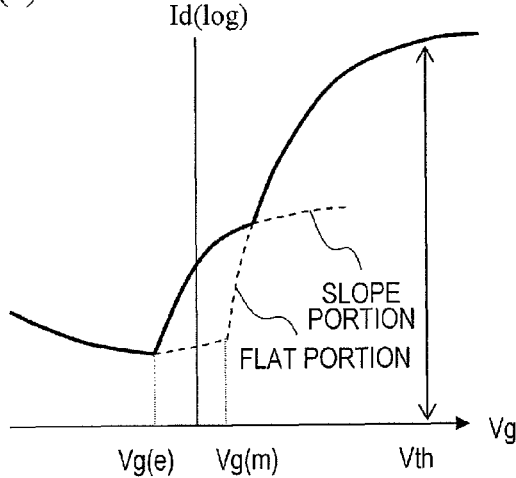
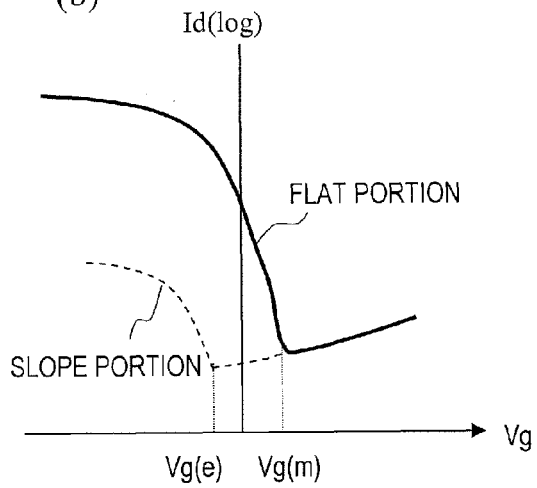
FIG.47 PRIOR ART

FIG.50
PRIOR ART
(a)
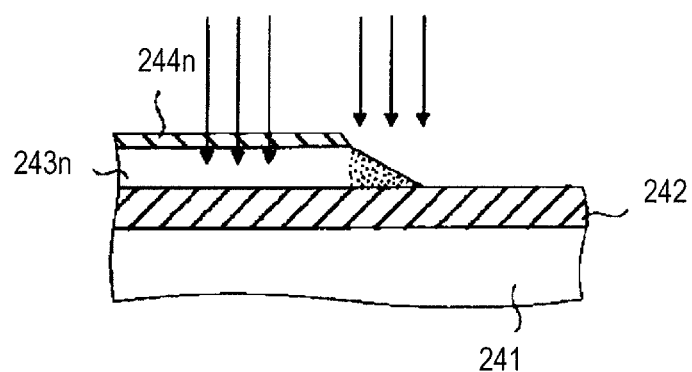
(b)
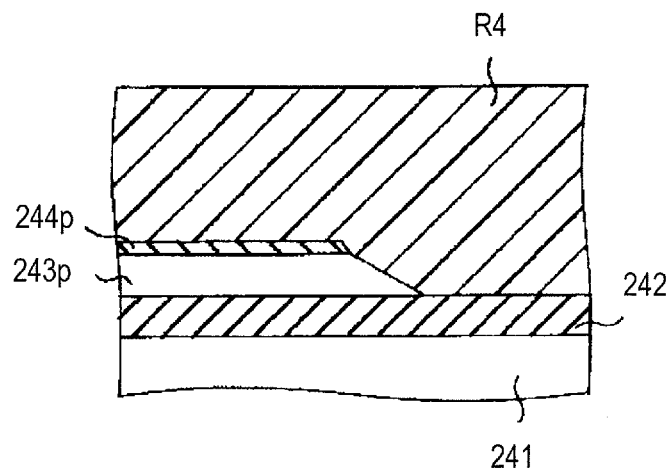

FIG.51
PRIOR ART
(a)
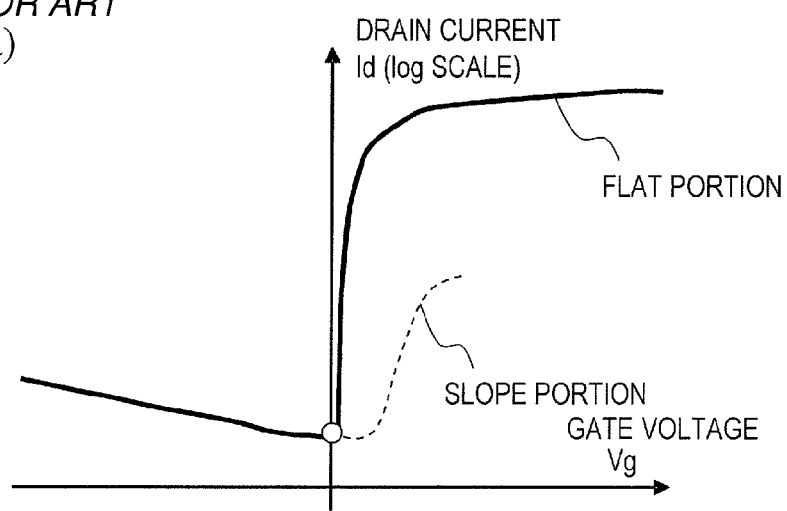
(b)
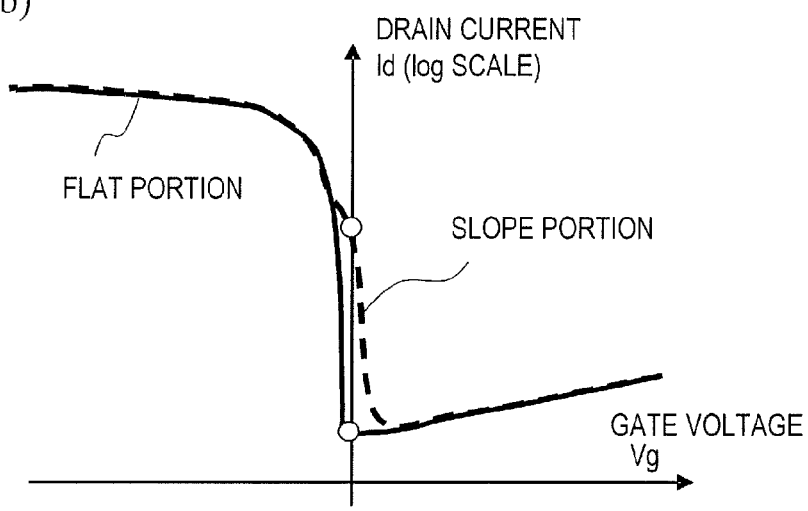
FIG.52
PRIOR ART
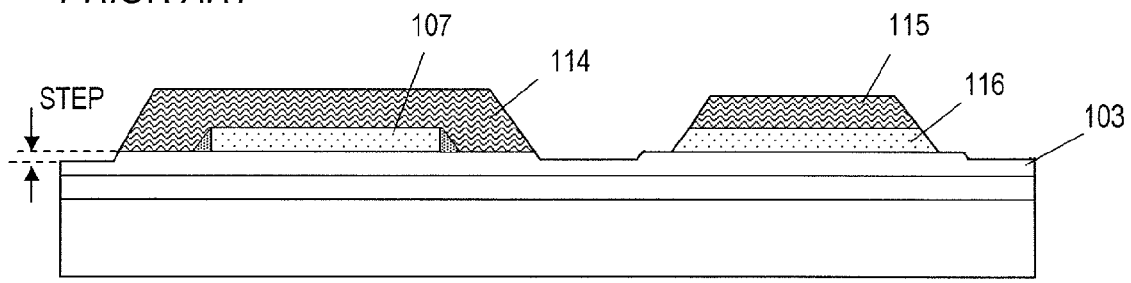

SEMICONDUCTOR DEVICE, AND MANUFACTURING METHOD FOR SAME

TECHNICAL FIELD

The present invention relates to a semiconductor device provided with a thin film transistor (Thin Film Transistor: TFT), and a production method thereof.

BACKGROUND ART

The development of a semiconductor device in which p-channel and n-channel thin film transistors (TFTs) are formed on one and the same substrate and electronic equipment including such a semiconductor device is promoted.

For example, in an active matrix liquid crystal display device or an organic EL display device, a technique in which a driving circuit is integrally formed on an active matrix substrate is suggested. For the driving circuit, a CMOS (Complementary Metal Oxide Semiconductor) including a p-channel TFT (hereinafter abbreviated as "a p-type TFT") and an n-channel TFT (hereinafter abbreviated as "an n-type TFT" is employed. In the case where the CMOS is employed, in order to prevent leakage current from occurring, it is necessary to adjust the driving voltage for each TFT in such a manner that two types of TFTs which constitute the CMOS are both in the OFF state when a gate voltage is not applied. From the point of view of the reduction in electric power consumption, it is desired that the driving voltage of TFT be lowered.

On the other hand, in an active matrix liquid crystal display device or an organic EL display device, a technique in which a memory circuit is provided for each pixel on the active matrix substrate is suggested (Patent Document No. 1 or the like). With such a configuration, image data of each pixel can be stored in the memory circuit provided in the pixel (hereinafter, referred to as "an image memory"), so that a still image can be displayed with low power consumption without continuously supplying image data from the external.

As for the image memory, it is suggested to employ a DRAM (Dynamic Random Access Memory) or an SRAM (Static Random Access Memory). The SRAM can operate at higher speed than the DRAM, and does not require refresh operation unlike the DRAM, so that it is possible to further suppress the power consumption. The SRAM has a flip-flop circuit utilizing a plurality of TFTs including p-type and n-type TFTs. For a display device provided with such an image memory, it is requested to lower the driving voltage depending on the application of the display device.

In the above-described display device, since both of the p-type and n-type TFTs are provided, it is necessary to make lower the threshold voltages Vth of the p-type TFT and the n-type TFT, respectively, in order to further reduce the driving voltage.

However, the voltage-current characteristics (the Vg-Id characteristics) are different between the p-type TFT and the n-type TFT. Accordingly, it is difficult to adjust the threshold voltage Vth in such a manner that both of the TFTs are in the OFF state (normally OFF) when the gate voltage is zero (Vg=0 V). The reason will be described below in detail.

A semiconductor layer of a TFT is generally patterned so as to have a slope portion (a tapered portion) in the periphery. Accordingly, the threshold voltages Vth are different between the slope portion of the semiconductor layer and a flat portion with a flat surface. Specifically, as exemplarily shown in FIG. 46, in the TFTs of either type, i.e. in the n-type TFT and in the p-type TFT, the current-voltage curve in the slope portion is shifted (n-type conversion) to the side of the lower voltage than the current-voltage curve in the flat portion. The reason why the slope portion tends to be converted into n-type as compared with the flat portion is not known. From the experimental results executed by the inventors of the present invention, it is presumed that the slope portion of the semiconductor layer is damaged in the etching process or the asking process of the semiconductor layer (a silicon layer).

In FIG. 47, (a) and (b) are graphs exemplarily showing the voltage-current characteristics of the n-type TFT and the p-type TFT, respectively. The voltage-current characteristics of the respective TFTs are depicted by solid lines, and the current-voltage curves in the flat portion and the slope portion are depicted by dotted lines. As shown in the figure, the voltage-current characteristics of the respective TFT are curves obtained by overlaying the current-voltage curve of the flat portion and the current-voltage curve of the slope portion.

In the n-type TFT, as shown in FIG. 47($a$), first, a drain current Id starts to flow at a lower voltage value Vg(e) in the slope portion. Then, at the voltage value Vg(m), the drain current Id starts to flow in the flat portion. The threshold voltage Vth is determined depending on the characteristics of the flat portion.

FIG. 48 is a plan view of the n-type TFT. As descried above, in the n-type TFT, first, the drain current Id(e) flows from a source region to a drain region in the slope portion positioned in the periphery of a semiconductor layer 1. Next, the drain current Id(e) starts to flow in the flat portion.

As described above, the drain current Id tends to rise in two stages (so-called occurrence of hump). That is, the slope portion functions as a parasitic transistor, which is actualized.

As shown in FIG. 49, in the n-type TFT, if a p-type impurity is doped (channel-doped) to the semiconductor layer, for example, the current-voltage curve can be shifted to the higher voltage side. Accordingly, it is possible to perform the adjustment in such a manner that the drain current Id has the minimum value (the OFF state) when the gate voltage Vg=0. However, if such adjustment is performed, the threshold voltage Vth is also shifted to the higher voltage side, so that the threshold voltage Vth cannot be lowered.

On the other hand, in the p-type TFT, as shown in FIG. 47($b$), first, a drain current Id starts to flow in the flat portion at the voltage value Vg(m), and then flows in the slope portion at the voltage value Vg(e). The current flowing in the slope portion is extremely smaller than the current flowing in the flat portion. Accordingly, the characteristics of the parasitic transistor generated in the slope portion are hidden behind the characteristics of the flat portion, so as not to be actualized. Accordingly, in the p-type TFT, the threshold voltage Vth can be lowered when the gate voltage Vg is zero.

As described above, due to the characteristics of the parasitic transistor of the n-type TFT, it is difficult, when the gate voltage Vg is zero, to set both of the p-type TFT and the n-type TFT into the OFF state, and to lower the threshold voltage Vth.

In order to solve the problem, in Patent Document No. 1, it is suggested that the current-voltage curve of the parasitic transistor in the slope portion is shifted so as to be hidden behind the current-voltage curve in the flat portion by introducing the p-type impurity into the slope portion in the semiconductor layer of the n-type TFT with higher density than in the flat portion.

In FIG. 50, (a) and (b) are cross-sectional views for explaining the production method of the n-type TFT and the p-type TFT disclosed in Patent Document No. 1, respectively.

Hereinafter, with reference to FIG. 50, the method disclosed in Patent Document No. 1 will be described.

First, a base insulating film 242 is formed on a substrate 241, and then a semiconductor film into which a p-type impurity (boron) is introduced is formed. Next, on the semiconductor film, a mask film of a silicon oxide film, for example, is formed.

Next, in a region in which an n-type TFT is to be formed and in a region in which a p-type TFT is to be formed on the substrate 241, resist films which cover a part of the mask film are formed, respectively.

Thereafter, by using the resist film as a mask, the semiconductor film and the mask film are etched in an island-like manner. As the result of the etching, an island-like semiconductor layer 243n and an island-like mask layer 244n are obtained in the region in which the n-type TFT is to be formed, and an island-like semiconductor layer 243p and an island-like mask layer 244p are obtained in the region in which the p-type TFT is to be formed. In the etching process, in the regions in which the respective TFTs are to be formed, edge portions of the resist films gradually move back. In accordance with this, portions of the semiconductor layer which are not covered with the resist films and the mask layers 244n and 244p are etched so as to be thinner as the distance from the edge portions of the mask layers 244n and 244p increases. Accordingly, in the periphery of the semiconductor layers 243n and 243p, slope portions are formed.

After the resist films are removed, as shown in (a) and (b) of FIG. 50, a resist film R4 is formed so as to cover the semiconductor layer 243p of the region in which the p-type TFT is to be formed and so as not to cover the semiconductor layer 243n of the region in which the n-type TFT is to be formed.

Next, a p-type impurity is introduced into the entire of the semiconductor layer 243n under the condition that the impurity is transmitted through the mask layer 244n. Then, the p-type impurity is selectively introduced into only a portion of the semiconductor layer 243n which is not covered with the mask layer 244n (a slope portion) under the condition that the impurity is not transmitted through the mask layer 244n. As a result, to the slope portion of the semiconductor layer 243n, the p-type impurity with volume density which is twice to five times as much as that of the flat portion is introduced. Accordingly, in the n-type TFT, it is possible to prevent the parasitic transistor in the slope portion of the semiconductor layer 243n from being actualized.

Thereafter, the resist film R4 is removed, and then, on the mask layers 244n and 244p, an insulating film and a gate electrode (not shown) are formed. The mask layer 244n and 244p and the insulating film are used as a gate insulating film.

CITATION LIST

Patent Literature

Patent Document No. 1: Japanese Laid-Open Patent Publication No. 2003-258262

SUMMARY OF THE INVENTION

Technical Problem

According to the conventional method shown in FIG. 50, on portions of the semiconductor layers 243n and 243p excluding the slope portions (on the flat portions), a gate insulating film constituted by two layers, i.e., the mask layers 244n and 244p and the insulating film formed thereon is formed. On the other hand, since the mask layers are not formed on the slope portions of the semiconductor layers 243n and 243p, the gate insulating film includes one layer. Accordingly, in the slope portions of the semiconductor layers 243n and 243p, withstand pressure is lowered as compared with the flat portions.

In order to lower the threshold voltage Vth of the TFT, it is necessary to suppress the influence of the parasitic transistor and to reduce the thickness of the gate insulating film. However, according to the above-described method, the gate insulating film is constituted by two layers, which is not thin enough. It is noted that if the mask layers 244n and 244p are removed without being used as the gate insulating film, the gate insulating film can be thinner. However, in such a case, another step of removing the mask layers 244n and 244p is required in addition to the forming process thereof. Thus, the number of steps is increased. In addition, when the mask layers 244n and 244p are removed, the base insulating film 242 of the silicon oxide film which is the same as the mask layers 244n and 244p is also etched. As a result, a step is caused in the base insulating film 242 in end portions of the semiconductor layers 243n and 243p, so that failures such as breaking of gate wiring due to the step may easily occur.

The present invention has been conducted in view of the above-described problems, and the objective thereof is to provide a semiconductor device provided with an n-type TFT and a p-type TFT in which the threshold voltages of the TFTs are lowered without degrading the reliability of the TFTs and without complicating the production process.

Solution to Problem

The semiconductor device of the present invention is a semiconductor device including an n-channel first thin film transistor and a p-channel second thin film transistor on one and the same substrate, wherein the first thin film transistor includes: a first semiconductor layer having a channel region, a source region, and a drain region; a gate electrode disposed to overlap the channel region; and a gate insulating film disposed between the semiconductor layer and the gate electrode, the second thin film transistor includes: a second semiconductor layer having a channel region, a source region, and a drain region; a gate electrode disposed to overlap the channel region; and a gate insulating film disposed between the semiconductor layer and the gate electrode, the first and the second semiconductor layers are formed from one and the same film, each of the first and the second semiconductor layers has a slope portion positioned in the periphery and a main portion which is a portion excluding the slope portion, and a p-type impurity is introduced into only a part of the slope portion of the first semiconductor layer with higher density than the main portion of the first semiconductor layer, the main portion of the second semiconductor layer, and the slope portion of the second semiconductor layer.

In one preferred embodiment, the densities of p-type impurity in the main portion and the slope portion of the second semiconductor layer are lower than the density of p-type impurity in the main portion of the first semiconductor layer.

In one preferred embodiment, when viewed from the normal direction of a surface of the one and the same substrate, the slope portion of the first semiconductor layer has a portion extending in a channel direction, and the p-type impurity is introduced into at least a portion of the portion extending in the channel direction which overlaps the gate electrode with higher density than the main portion of the first semiconductor layer.

In one preferred embodiment, when viewed from a normal direction of a surface of the one and the same substrate, the first semiconductor layer has a narrow portion positioned between the source region and the drain region, and the p-type impurity is introduced into a portion positioned in the periphery of the narrow portion in the slope portion of the first semiconductor layer with higher density than the main portion of the first semiconductor layer.

Another semiconductor device of the present invention is a semiconductor device including an n-channel first thin film transistor and a p-channel second thin film transistor on one and the same substrate, wherein the first thin film transistor includes: a first semiconductor layer having a channel region, a source region, and a drain region; a gate electrode disposed to overlap the channel region; and a gate insulating film disposed between the semiconductor layer and the gate electrode, the second thin film transistor includes: a second semiconductor layer having a channel region, a source region, and a drain region; a gate electrode disposed to overlap the channel region; and a gate insulating film disposed between the semiconductor layer and the gate electrode, the first and the second semiconductor layers are formed from one and the same film, each of the first and the second semiconductor layers has a slope portion positioned in the periphery and a main portion which is a portion excluding the slope portion, and a p-type impurity is introduced into the entire of the slope portion of the first semiconductor layer and only a part of the slope portion of the second semiconductor layer with higher density than the main portion of the first semiconductor layer and the main portion of the second semiconductor layer.

In one preferred embodiment, the density of p-type impurity in the main portion of the second semiconductor layer is lower than the density of p-type impurity in the main portion of the first semiconductor layer.

In one preferred embodiment, when viewed from the normal direction of a surface of the one and the same substrate, the slope portion of the second semiconductor layer has a portion extending in a channel direction, and the density of p-type impurity in at least a portion of the portion extending in the channel direction which overlaps the gate electrode is lower than the density of p-type impurity in the slope portion of the first semiconductor layer.

In one preferred embodiment, when viewed from a normal direction of a surface of the one and the same substrate, the second semiconductor layer has a narrow portion positioned between the source region and the drain region, and the density of p-type impurity in a portion positioned in the periphery of the narrow portion in the slope portion of the second semiconductor layer is lower than the density of p-type impurity in the slope portion of the first semiconductor layer.

Still another semiconductor device of the present invention is a semiconductor device including an n-channel first thin film transistor and a p-channel second thin film transistor on one and the same substrate, wherein the first thin film transistor includes: a first semiconductor layer having a channel region, a source region, and a drain region; a gate electrode disposed to overlap the channel region; and a gate insulating film disposed between the semiconductor layer and the gate electrode, the second thin film transistor includes: a second semiconductor layer having a channel region, a source region, and a drain region; a gate electrode disposed to overlap the channel region; and a gate insulating film disposed between the semiconductor layer and the gate electrode, the first and the second semiconductor layers are formed from one and the same film, each of the first and the second semiconductor layers has a slope portion positioned in the periphery and a main portion which is a portion excluding the slope portion, a p-type impurity is introduced into the slope portion of the first semiconductor layer with higher density than the main portion of the first semiconductor layer, the density of p-type impurity in a part of the slope portion of the second semiconductor layer is substantially equal to the density of p-type impurity in the main portion of the first semiconductor layer, and the density of p-type impurity in the main portion of the second semiconductor layer is lower than the density of p-type impurity in the main portion of the first semiconductor layer.

In one preferred embodiment, the thickness of the gate insulating film is equal to or less than the thickness of the first and the second semiconductor layers.

The thickness of the gate insulating film may be equal to or less than 50 nm.

In one preferred embodiment, the first and the second semiconductor layers contain a catalyst element having a function of promoting the crystallization of an amorphous semiconductor film.

The catalyst element may include one or a plurality of elements selected from Ni, Co, Sn, Pb, Pd, Fe, and Cu.

At least the channel region in the first and the second semiconductor layer may be mainly constituted by a region in which the <111> crystal zone of crystal planes is oriented.

The production method of a semiconductor device of the present invention is a production method of a semiconductor device including an n-channel first thin film transistor and a p-channel second thin film transistor on one and the same substrate, the production method including: (a) a step of forming a semiconductor film on the substrate; (b) a step of forming a first mask film and a second mask film on the semiconductor film; (c) a step of etching the semiconductor film by using the first and the second mask films as a mask, thereby forming a first semiconductor layer which will act as an active region of the first thin film transistor and a second semiconductor layer which will act as an active region of the second thin film transistor, the first semiconductor layer including a main portion covered with the first mask film and a slope portion positioned in the periphery of the first semiconductor layer and not covered with the first mask film, and the second semiconductor layer including a main portion covered with the second mask film and a slope portion positioned in the periphery of the second semiconductor layer and not covered with the second mask film; (d) a step of introducing a p-type impurity into the slope portion of the first semiconductor layer and the slope portion of the second semiconductor layer by using the first and the second mask films as a mask; (e) a step of removing the first and the second mask films; (f) a step of forming a third mask film which covers the entire of the first semiconductor layer and a fourth mask film which covers only a part of the main portion of the second semiconductor layer; (g) a step of etching at least a part of the slope portion of the second semiconductor layer into which the p-type impurity is introduced by using the third and the fourth mask films as a mask; (h) a step of introducing an n-type impurity into a part of the first semiconductor layer, thereby forming source and drain regions; and (i) a step of introducing a p-type impurity into a part of the second semiconductor layer, thereby forming source and drain regions.

In one preferred embodiment, the step (g) is a step of etching only a part of the slope portion of the second semiconductor layer into which the p-type impurity is introduced.

In one preferred embodiment, in the step (f), the fourth mask film is thicker than the third mask film, and the production method further includes: (j) a step of removing the third mask film and making the fourth mask film thinner, after the step (g), and (k) a step of introducing a p-type impurity into the entire of the first semiconductor layer and a portion of the second semiconductor layer which is not covered with the fourth mask film which is made thinner.

Another production method of a semiconductor device of the present invention is a production method of a semiconductor device including an n-channel first thin film transistor and a p-channel second thin film transistor on one and the same substrate, the production method including: (A) a step of forming a semiconductor film on the substrate; (B) a step of forming a first mask film and a second mask film on the semiconductor film; (C) a step of etching the semiconductor film by using the first and the second mask films as a mask, thereby forming a first semiconductor layer which will act as an active region of the first thin film transistor and a second semiconductor layer which will act as an active region of the second thin film transistor; (D) a step of removing the first and the second mask films; (E) a step of forming a third mask film which covers only a part of a main portion of the first semiconductor layer and a fourth mask film which covers the entire of the second semiconductor layer; (F) a step of etching a portion of the slope portion of the first semiconductor layer which is not covered with the third mask film, whereby the first semiconductor layer includes a main portion covered with the third mask film and a slope portion positioned in the periphery of the first semiconductor layer and not covered with the third mask film; (G) a step of introducing a p-type impurity into the slope portion of the first semiconductor layer by using the third and the fourth mask films as a mask; (H) a step of introducing an n-type impurity into a part of the first semiconductor layer, thereby forming source and drain regions; and (I) a step of introducing a p-type impurity into a part of the second semiconductor layer, thereby forming source and drain regions.

In one preferred embodiment, the step (F) is a step of etching only a part of the periphery of the first semiconductor layer.

In one preferred embodiment, in the step (E), the fourth mask film is thicker than the third mask film, and the production method further includes: (J) a step of removing the third mask film and making the fourth mask film thinner, after the step (G), and (K) a step of introducing a p-type impurity into the entire of the first semiconductor layer by using the fourth mask film which is made thinner as a mask.

In one preferred embodiment, the density Cn-e of p-type impurity in a portion of the slope portion of the first semiconductor layer which overlaps the gate electrode, the density Cn-m of p-type impurity in the main portion of the first semiconductor, and the density Cp-m of p-type impurity in the second semiconductor layer satisfy the relational expression of Cn-e>Cn-m>Cp-m.

In one preferred embodiment, the production method further includes a step of forming a gate insulating film on the first and second semiconductor layers, and the thickness of the gate insulating film is equal to or less than the thickness of the first and the second semiconductor layers.

In one preferred embodiment, the thickness of the gate insulating film is equal to or less than 50 nm.

In one preferred embodiment, the production method further includes, before the step (a) or the step (A), a step of preparing an amorphous semiconductor film to which a catalyst element for promoting crystallization is at least partially added, and a step of performing heat treatment for the amorphous semiconductor film and crystallizing at least a part of the amorphous semiconductor film, thereby obtaining the semiconductor film.

The semiconductor device may further includes an SRAM circuit, and the SRAM circuit includes the first thin film transistor and the second thin film transistor.

The display device of the present invention is a display device including a plurality of pixels, wherein each of the pixels includes: a pixel electrode; a memory circuit, connected to the pixel electrode, for storing an image signal; and a display cell which performs the display based on the image signal, and the memory circuit includes the above-mentioned SRAM circuit.

Advantageous Effects of Invention

According to the present invention, in the semiconductor device provided with an n-type TFT and a p-type TFT, the influence of a parasitic transistor generated in the n-type TFT on the TFT characteristics can be suppressed without actualizing the influence of a parasitic transistor generated in the p-type TFT on the TFT characteristics. Thus, the threshold voltages of the respective TFTs are adjusted in such a manner that both of the n-type and p-type TFTs are in the OFF state when the gate voltage is zero, and the threshold voltages can be further lowered. Accordingly, the driving voltage of the semiconductor device can be low.

In addition, the above-described semiconductor device can be produced simply and easily without greatly increasing the number of process steps.

BRIEF DESCRIPTION OF DRAWINGS

In FIG. 4, (a) and (b) are a plan view and a cross-sectional view, respectively, for generally illustrating the production method of the semiconductor device in the first embodiment of the present invention.

In FIG. 5, (a) and (b) are a plan view and a cross-sectional view, respectively, for generally illustrating the production method of the semiconductor device in the first embodiment of the present invention.

In FIG. 15, (a) and (b) are a plan view and a cross-sectional view, respectively, for generally illustrating the production method of the semiconductor device in the third embodiment of the present invention.

In FIG. 16, (a) and (b) are a plan view and a cross-sectional view, respectively, for generally illustrating the production method of the semiconductor device in the third embodiment of the present invention.

In FIG. 21, (a) to (c) are plan views, respectively, for illustrating a space between a mask film and a semiconductor layer in the production process of the semiconductor device in the first embodiment.

In FIG. 30, (a) to (c) are plan views, respectively, for illustrating a space between a mask film and a semiconductor layer in the production process of the semiconductor device in the fourth embodiment.

In FIG. 42, (a) to (d) are process cross-sectional views for illustrating an example of the production method of the semiconductor device in the sixth embodiment of the present invention, respectively.

In FIG. 43, (e) to (h) are process cross-sectional views for illustrating an example of the production method of the semiconductor device in the sixth embodiment of the present invention, respectively.

In FIG. 44, (a) is a plan view schematically showing an active matrix substrate 1000 in which a driving circuit is integrally formed, and (b) is a view showing a schematic structure of one pixel.

FIG. 45 is a diagram showing an example of a circuit of each pixel 2000 in a display device in which a memory circuit is provided for each pixel.

FIG. 46 is a graph showing exemplary current-voltage curves of an n-type TFT and a p-type TFT.

In FIG. 47, (a) and (b) are graphs exemplarily showing the voltage-current characteristics of the conventional n-type TFT and p-type TFT, respectively.

In FIG. 50, (a) and (b) are cross-sectional views for illustrating the production method of the n-type TFT and the p-type TFT disclosed in Patent Document No. 1, respectively.

In FIG. 51, (a) and (b) are graphs exemplarily showing the voltage-current characteristics of the n-type TFT and the p-type TFT in the case where the p-type impurity is introduced to the slope portion of the semiconductor layer with a higher density than the flat portion, respectively.

FIG. 52 is a cross-sectional view exemplarily showing the configuration in the case where a surface portion of a base film is shaved in the process shown in FIG. 7(e).

DESCRIPTION OF EMBODIMENTS

Figure 1:
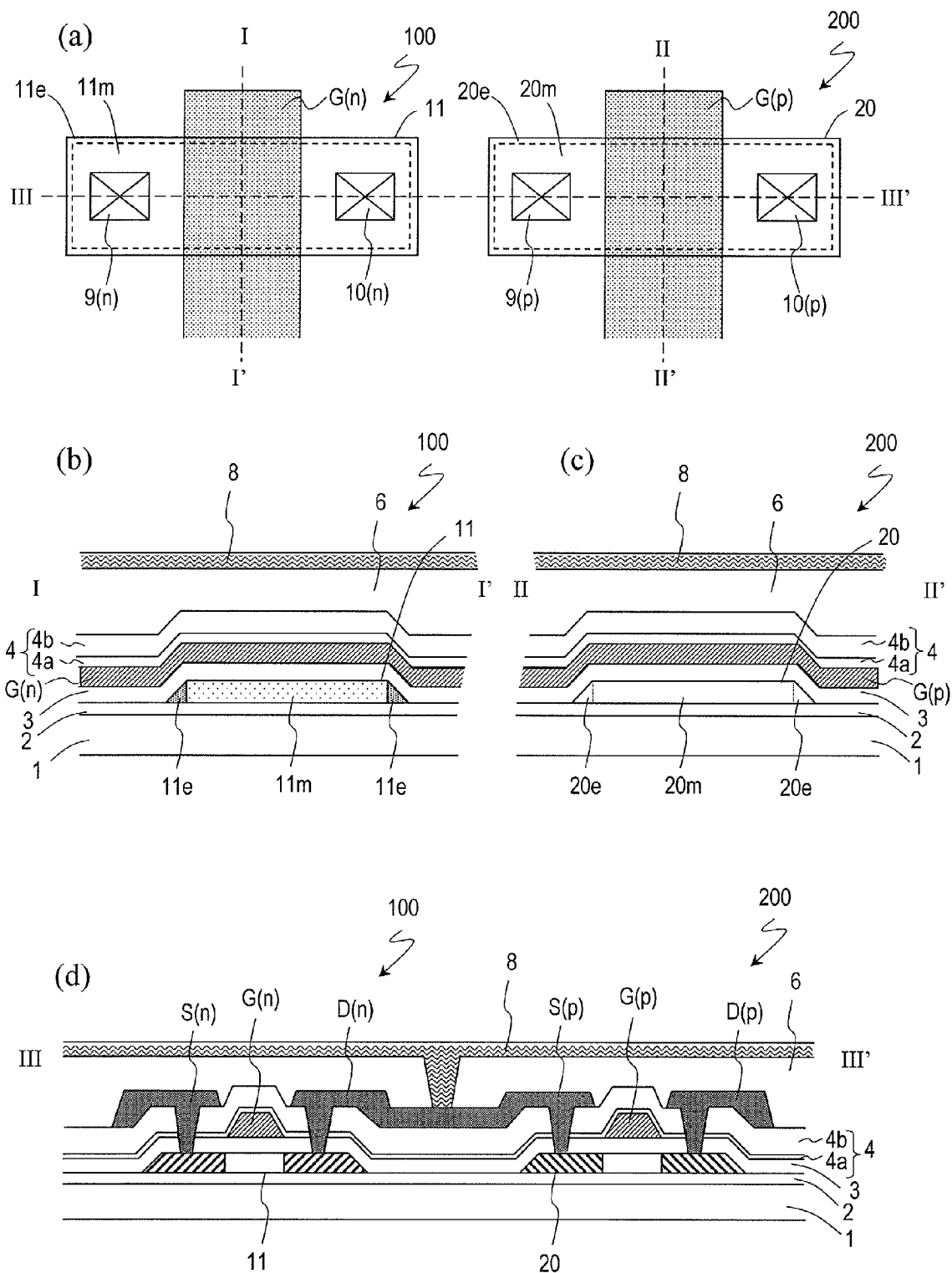
FIG. 1, (a) is a plan view schematically showing an n-type TFT and a p-type TFT in a semiconductor device in a first embodiment of the present invention, (b) and (c) are cross-sectional views taken along line I-I' and II-II' shown in the plan view of (a), and (d) is a cross-sectional view taken along line III-III' shown in the plan view of (a).
Figure 2:
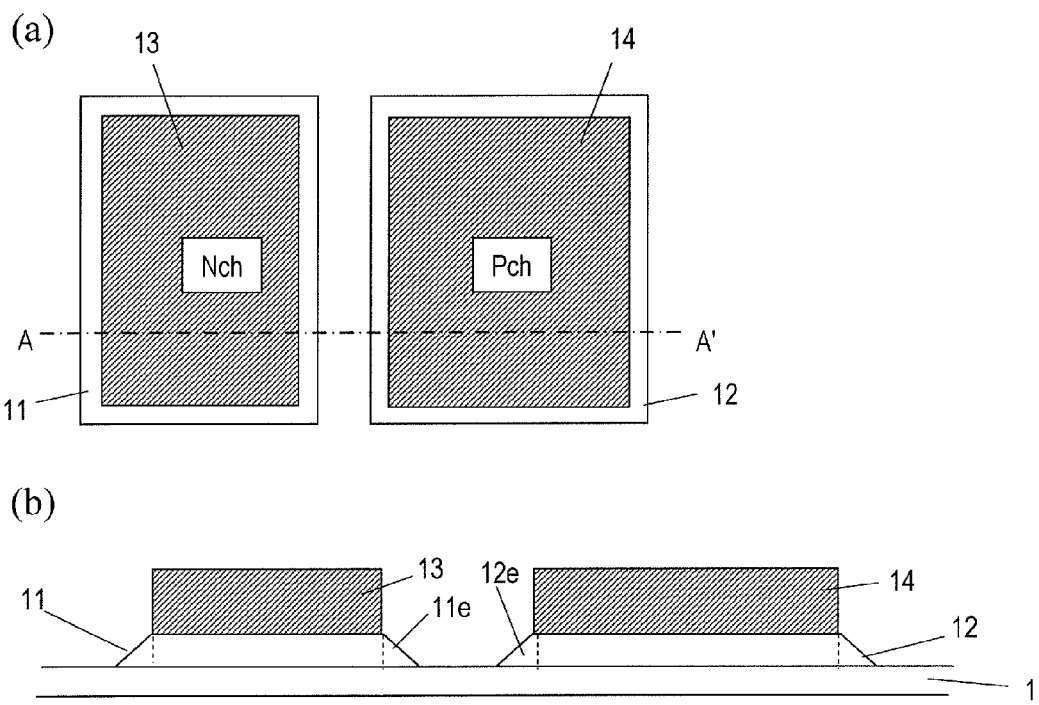
In FIG. 2, (a) and (b) are a plan view and a cross-sectional view, respectively, for generally illustrating the production method of the semiconductor device in the first embodiment of the present invention.

According to the study by the inventors of the present invention, in an n-type TFT, when a p-type impurity is introduced into a slope portion with higher density than the flat portion in order to reduce the influence of a parasitic transistor of the slope portion in a semiconductor layer on the TFT characteristics, the voltage-current characteristics of the slope portion can be hidden behind the voltage-current characteristics of the flat portion, as shown in FIG. 51(a). However, at the same time, if the p-type impurity is introduced similarly to a slope portion in the p-type TFT with higher density than the flat portion, the characteristics of the slope portion hidden behind the characteristics of the flat portion up to that time becomes apparent conversely, so that the p-type TFT is liable to have two-stage rising characteristics. Accordingly, it is necessary to adopt the method in which the p-type impurity is not introduced to the slope portion of the p-type TFT, and the p-type impurity is selectively introduced to the slope portion of the n-type TFT.

As the result of the keen examination based on the above-described observation, the inventors of the present invention found a method of selectively introducing the p-type impurity to the slope portion of the n-type TFT without complicating the production process, and resulted in the present invention.

First Embodiment

Hereinafter a semiconductor device in a first embodiment of the present invention will be described with reference to the drawings. The semiconductor device in this embodiment is applied to a substrate provided with a CMOS, e.g., an active matrix substrate provided with a driving circuit including a CMOS. Alternatively, the semiconductor device in this embodiment may be applied to an active matrix substrate in a display device in which a memory circuit including an n-type TFT and a p-type TFT is provided for each pixel.

FIG. 1(a) is a plan view schematically showing an n-type TFT and a p-type TFT in the semiconductor device of this embodiment. FIG. 1(b) and FIG. 1(c) are cross-sectional views taken along line I-I' and line II-II' shown in the plan view of FIG. 1(a), respectively. FIG. 1(d) is a cross-sectional view taken along line III-III' shown in the plan view of FIG. 1(a). The line I-I' and the line II-II' are perpendicular to the channel direction, and the line III-III' is parallel to the channel direction.

The semiconductor device in this embodiment includes a substrate 1, and an n-type TFT 100 and a p-type TFT 200 formed on the substrate 1 via a base insulating film 2.

The n-type TFT 100 has an island-like semiconductor layer including a source region, a drain region, and a channel region positioned between them. On the semiconductor layer 1, a gate electrode G(n) is disposed so as to overlap the channel region via a gate insulating film 3.

The p-type TFT 200 also has an island-like semiconductor layer 20 including a source region, a drain region, and a channel region positioned between them. On the semiconductor layer 20, a gate electrode G(p) is disposed so as to overlap the channel region via the gate insulating film 3.

On the gate insulating film 3 and the gate electrodes G(n) and G(p), a first interlayer insulating film 4 is formed. Herein the first interlayer insulating film 4 has a two-layer structure including an insulating film 4a and an insulating film 4b. On the first interlayer insulating film 4, source electrodes S(n) and S(p) and drain electrodes D(n) and D(p) are provided. The source region and the drain region of the semiconductor layer 1 are connected to the source electrode S(n) and the drain electrode D(n) by contact portions 9(n) and 10(n) in contact holes formed through the first interlayer insulating film 4. Similarly, the source region and the drain region of the semiconductor layer 20 are connected to the source electrode S(p) and the drain electrode D(p) by means of contact portions 9(p) and 10(p) in contact holes formed through the first interlayer insulating film 4.

On the first interlayer insulating film 4, a second interlayer insulating film (also referred to as a protective film) 6 is formed. On the second interlayer insulating film 6, an electrode film 8 is formed. In this embodiment, the source electrode S(p) and the drain electrode D(p) are connected to an electrode film 28 in a contact hole formed in the second interlayer insulating film 6, so as to constitute a CMOS. The source electrodes and the drain electrodes are connected to wirings appropriately selected in accordance with the circuit configuration.

In the case where this embodiment is applied to a display device, the electrode film 8 is preferably formed by using the same conductive material as that of a pixel electrode. The pixel electrode may be a reflecting electrode of Al, an Al alloy, or the like, for example, or may be a transparent electrode such as an ITO (Indium Tin Oxide). Accordingly, the pixel electrode and the electrode film 8 can be simultaneously formed by using the same conductive film.

In this embodiment, the semiconductor layer 1 and the semiconductor layer 20 are formed from one and the same semiconductor film. The semiconductor layer 1 has a slope portion 11e positioned in the periphery and a main portion 11m constituted by a portion excluding the slope portion. The semiconductor layer 20 similarly has a slope portion 20e positioned in the periphery and a main portion 20m constituted by a portion excluding the slope portion.

In the present specification, in the semiconductor layer having a sloping side face with respect to the surface of the substrate 1, a portion sandwiched between the sloping side face and the lower surface of the semiconductor layer (a tapered portion) is referred to as "a slope portion". In addition, a portion sandwiched between the upper surface and the lower surface of the semiconductor layer is referred to as "a main portion". In the example shown in the figures, upper surfaces of the main portions 11m and 20m are substantially flat, but alternatively may have some surface roughness. For example, the surface roughness of the semiconductor film before the patterning may be maintained.

To the slope portion 11e positioned in the periphery of the semiconductor layer 11, the p-type impurity is introduced with higher density than the main portion 11m of the semiconductor layer 11 and the main portion 20m of the semiconductor layer 20. On the other hand, the density of the p-type impurity of a portion of the slope portion 20e in the semiconductor layer 20 which overlaps at least the gate electrode G(p) (i.e. a portion positioned in the periphery of the channel region) is lower than the density of the p-type impurity of the slope portion 11e in the semiconductor layer 11. To a portion of the slope portion 20e which does not overlap the gate electrode G(p), the p-type impurity may be introduced with substantially the same density as that of the slope portion 11e in the semiconductor layer 11.

In this embodiment, in the n-type TFT, the p-type impurity is introduced to the slope portion 11e with higher density than the main portion 11m, so that the voltage-current characteristics of the parasitic transistor caused in the slope portion 11e can be shifted so as to superpose the voltage-current characteristics of the main portion 11m. On the other hand, in the p-type TFT, the density of the p-type impurity of a portion of the slope portion 20e in the semiconductor layer 20 through which at least a drain current can flow (a portion which is positioned in the periphery of the channel region and is capable of operating as a parasitic transistor) is substantially the same as the density of the p-type impurity of the main portion 20m, for example. Accordingly, the voltage-current characteristics of the parasitic transistor caused in the slope portion are not shifted, so that they superpose the voltage-current characteristics of the main portion 20m.

Figure 8:
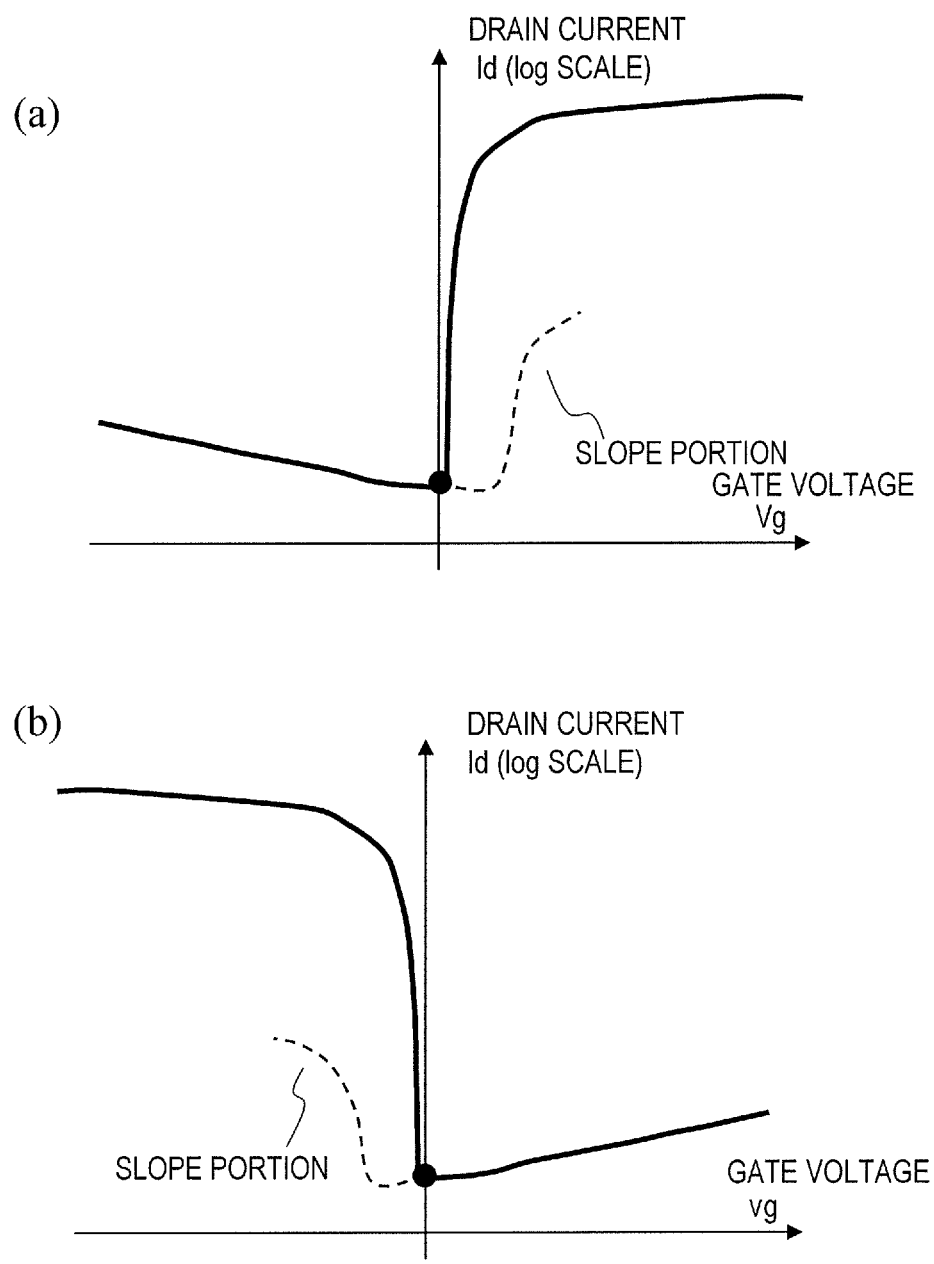
In FIG. 8, (a) and (b) are graphs exemplarily showing voltage-current characteristics of the n-type TFT and the p-type TFT in the semiconductor device in the first embodiment of the present invention, respectively.
Figure 9:
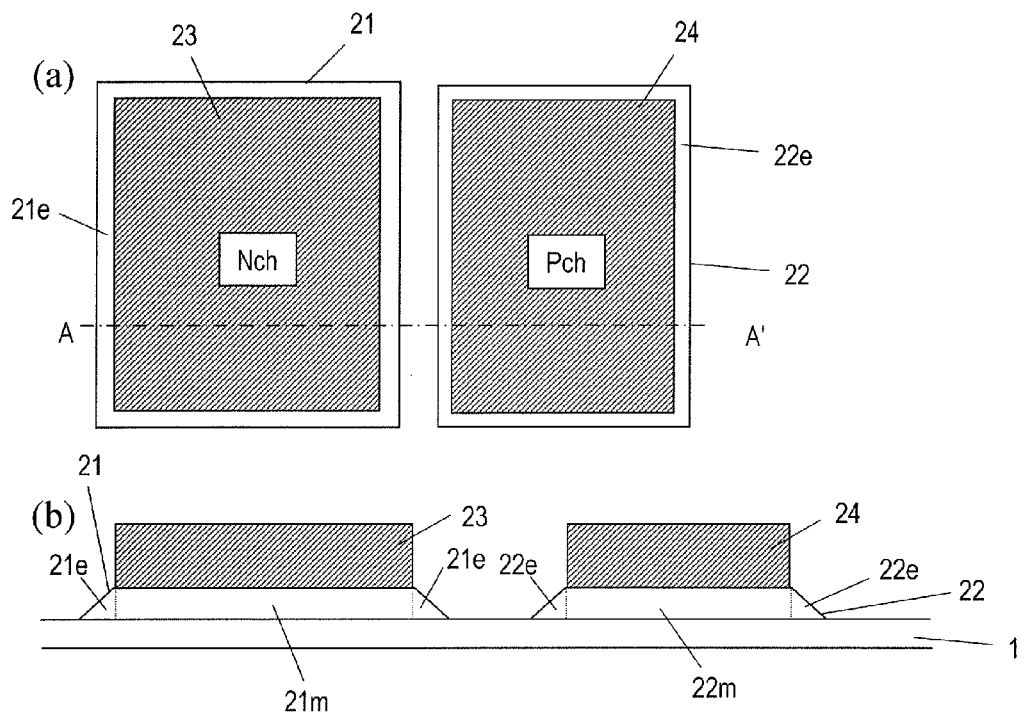
In FIG. 9, (a) and (b) are a plan view and a cross-sectional view, respectively, for generally illustrating the production method of a semiconductor device in a second embodiment of the present invention.

As a result, as shown in (a) and (b) of FIG. 8, in both of the n-type and p-type TFTs, the influence of the characteristics of the slope portions 11e and 20e (the characteristics of the parasitic transistors) on the TFT characteristics can be suppressed. Accordingly, when the gate voltage Vg is zero, both of the TFTs can be easily set in the OFF state. By adjusting the process conditions (such as the impurity density of the channel region or the thickness of the gate insulating film), the driving voltages of these TFTs can be low.

Next, the production method of the semiconductor device in this embodiment will be described generally.

FIG. 2 to FIG. 6 are schematic views for generally illustrating the production method of the semiconductor device in this embodiment. In the respective figures, (a) is a plan view, and (b) is a cross-sectional view taken along a line A-A' shown in the plan view of (a). The line A-A' is parallel to the channel width direction. Accordingly, in FIG. 2 to FIG. 6, unlike the configuration shown in FIG. 1, the n-type and p-type semiconductor layers are located adjacently in the channel width direction. It should be noted that the locating relationship of these TFTs are not specifically limited, but can be appropriately varied in accordance with the circuit configuration to be applied. In FIG. 2 to FIG. 6, a single n-type TFT and a single p-type TFT formed on one and the same substrate are only shown, but a plurality of TFTs of these types may be formed on one and the same substrate.

First, a semiconductor film is formed on the substrate 1, and mask films (e.g. resist films) 13 and 14 are formed on the semiconductor film. Next, by using the mask films 13 and 14 as a mask, the semiconductor film is patterned. As the result of the patterning, as shown in (a) and (b) in FIG. 2, a semiconductor layer 11 which will act as an active layer of the n-type TFT and a semiconductor layer 12 which will act as an active layer of the p-type TFT are obtained on the substrate 1. The semiconductor layers 11 have main portions 11m and 12m covered with the mask films 13 and 14, and slope portions 11e and 12e which are positioned in the periphery of the main portions 11m and 12m, and not covered with the mask films 13 and 14, respectively. In the example shown in the figure, upper surfaces of the main portions 11m and 12m are substantially flat, but alternatively may have surface roughness. For example, the surface roughness of the semiconductor film before the patterning may be maintained.

At this time, the semiconductor layer 11 is processed to be a pattern as the active layer of the n-type TFT (the final form), but the semiconductor layer 12 is processed to be larger than a pattern as the active layer of the p-type TFT (the final form) at least in a direction perpendicular to the channel (the direction indicated by W).

Figure 3:
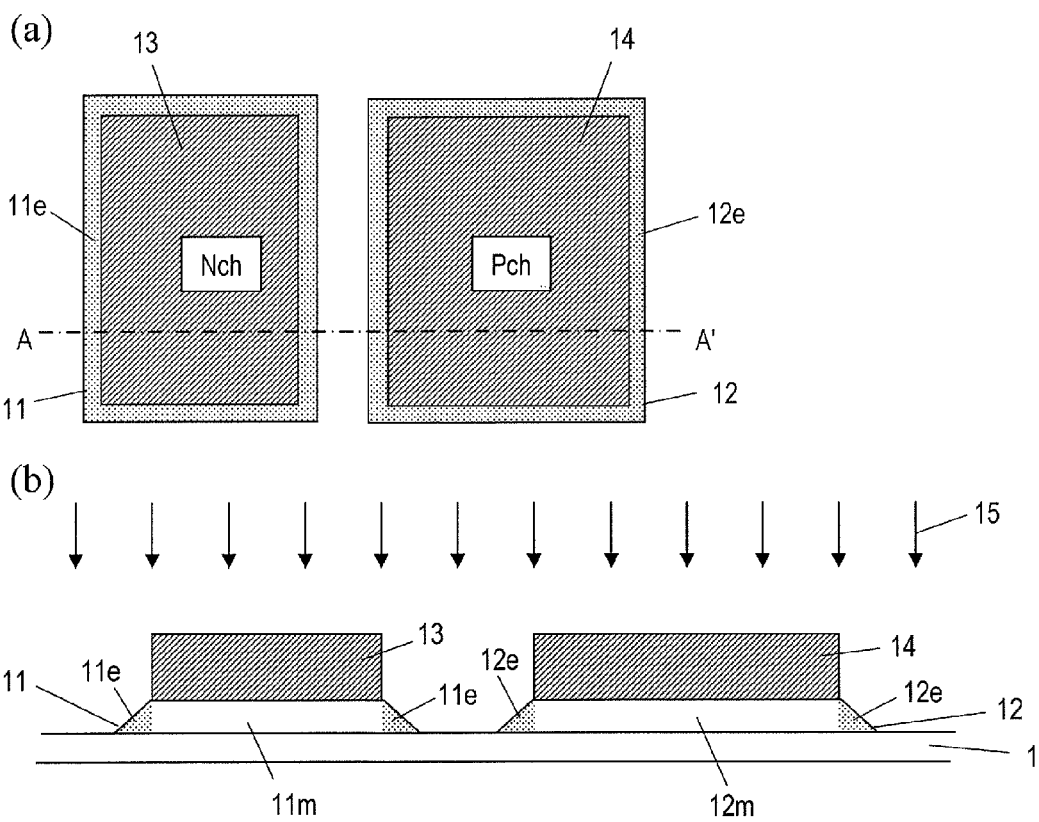
In FIG. 3, (a) and (b) are a plan view and a cross-sectional view, respectively, for generally illustrating the production method of the semiconductor device in the first embodiment of the present invention.

Next, as shown in (a) and (b) in FIG. 3, in the condition where the mask films 13 and 14 are left, a p-type impurity (e.g. boron) is implanted into the semiconductor layer 11 and 12 by using the mask films as the mask. The p-type impurity is not implanted into the main portions 11m and 12m which are covered with the mask films 13 and 14 of the semiconductor layers 11 and 12, but selectively implanted into only the slope portions 11e and 12e. Thereafter, the mask films 13 and 14 are removed.

Next, as shown in (a) and (b) of FIG. 4, a mask film 18 for covering the entire of the semiconductor layer 11 and a mask film 19 for covering a part of the semiconductor layer 12 are formed. In the example shown in the figure, the mask film 19 has a pattern which is longer in the channel direction and shorter in the channel width direction than the semiconductor layer 12. The mask film 19 is disposed so as to expose a portion extending in the channel direction of the slope portion 11e. It is sufficient that the mask film 19 may be disposed so as to expose at least a portion which is capable of operating as a parasitic transistor of the slope portion 11e, and the shape and the dimensions of the mask film 19 are not limited to those of the example shown in the figure.

Thereafter, as shown in (a) and (b) of FIG. 5, the etching of the semiconductor layer 12 is performed by using the mask films 18 and 19 as masks. As the result of the etching, a portion of the semiconductor layer 12 which is not covered with the mask film 19 is etched. At this time, a portion extending in the channel direction of the slope portion 12e into which the p-type impurity is implanted is etched, so as to form a new slope portion. In this way, it is possible to obtain a semiconductor layer 20 which is processed so as to have the final form. Then, the mask films 18 and 19 are removed.

Figure 6:
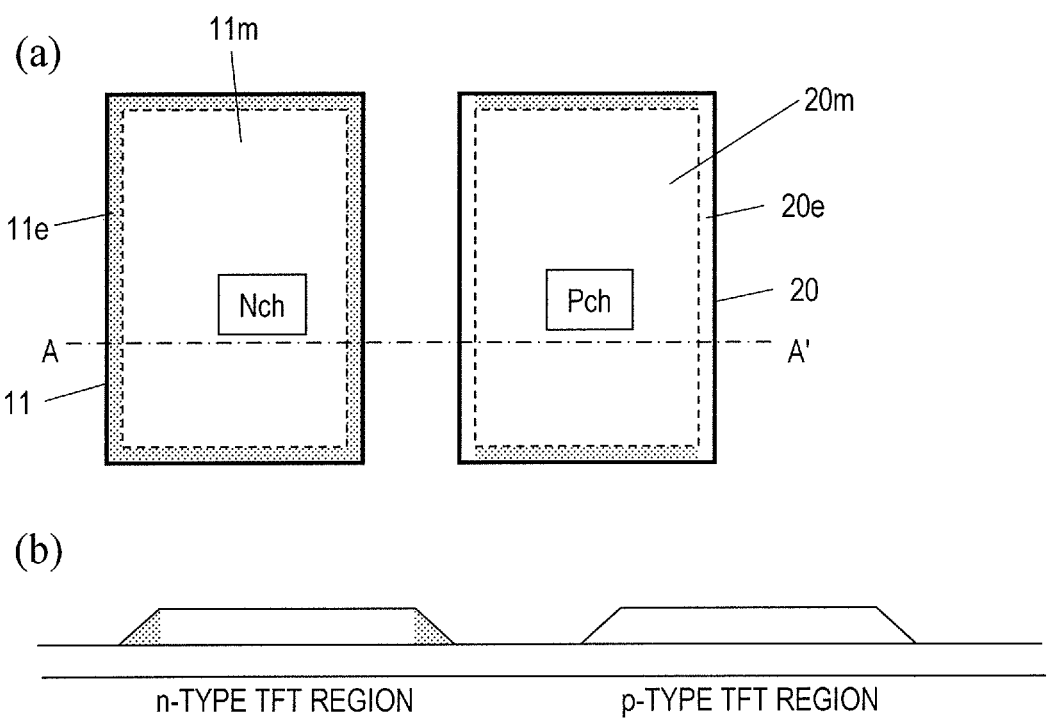
In FIG. 6, (a) and (b) are a plan view and a cross-sectional view, respectively, for generally illustrating the production method of the semiconductor device in the first embodiment of the present invention.

As shown in (a) and (b) of FIG. 6, in the obtained semiconductor layer 11, the p-type impurity is contained in the slope portion 11e positioned in the periphery of the semiconductor layer 11 with higher density than the main portion 11m. On the other hand, in the semiconductor layer 20, the p-type impurity is contained in only a portion extending in the channel width direction of the slope portion 20e with higher density than the main portion 20m. The density of p-type impurity of the portion extending in the channel region of the slope portion 20e is substantially the same as the density of p-type impurity of the main portion 20m.

As described above, the density of p-type impurity in the slope portion 11e of the semiconductor layer 11 can be higher than the densities of p-type impurity in the main portion 11m of the semiconductor layer 11, the main portion 20m of the semiconductor layer 20, and the portion of the slope portion 20e of the semiconductor layer 20 which is capable of operating as the parasitic transistor.

Although not shown in the figure, preferably, the p-type impurity is further introduced into the semiconductor layer 11, so as to make the density of p-type impurity in the main portion 11m of the semiconductor layer 11 higher than the density of p-type impurity in the main portion 20m of the semiconductor layer 20. Accordingly, the voltage-current characteristics of the n-type TFT utilizing the semiconductor layer 11 can be shifted in a direction in which the gate voltage Vg increases. As a result, it is possible to perform the adjustment in such a manner that the n-type TFT is in the OFF state when the gate voltage Vg is zero.

Thereafter, although not shown in the figure, a gate insulating film and a gate electrode is provided on the semiconductor layers 11 and 20. Then, an n-type impurity is introduced into a part of the semiconductor layer 11, thereby forming a source region and a drain region, and a p-type impurity is introduced into a part of the semiconductor layer 20, thereby forming a source region and a drain region. In addition, a source electrode and a drain electrode which are electrically connected to the source region and the drain region, respectively, are provided. As a result, an n-type TFT having the semiconductor layer 11 as the active layer and a p-type TFT having the semiconductor layer 20 as the active layer are obtained.

Hereinafter, with reference to the drawings, the production method of the semiconductor device in this embodiment will be described more specifically. In the following description, general process steps for fabricating a TFT such as activation annealing or hydrogenation are omitted.

Figure 7:
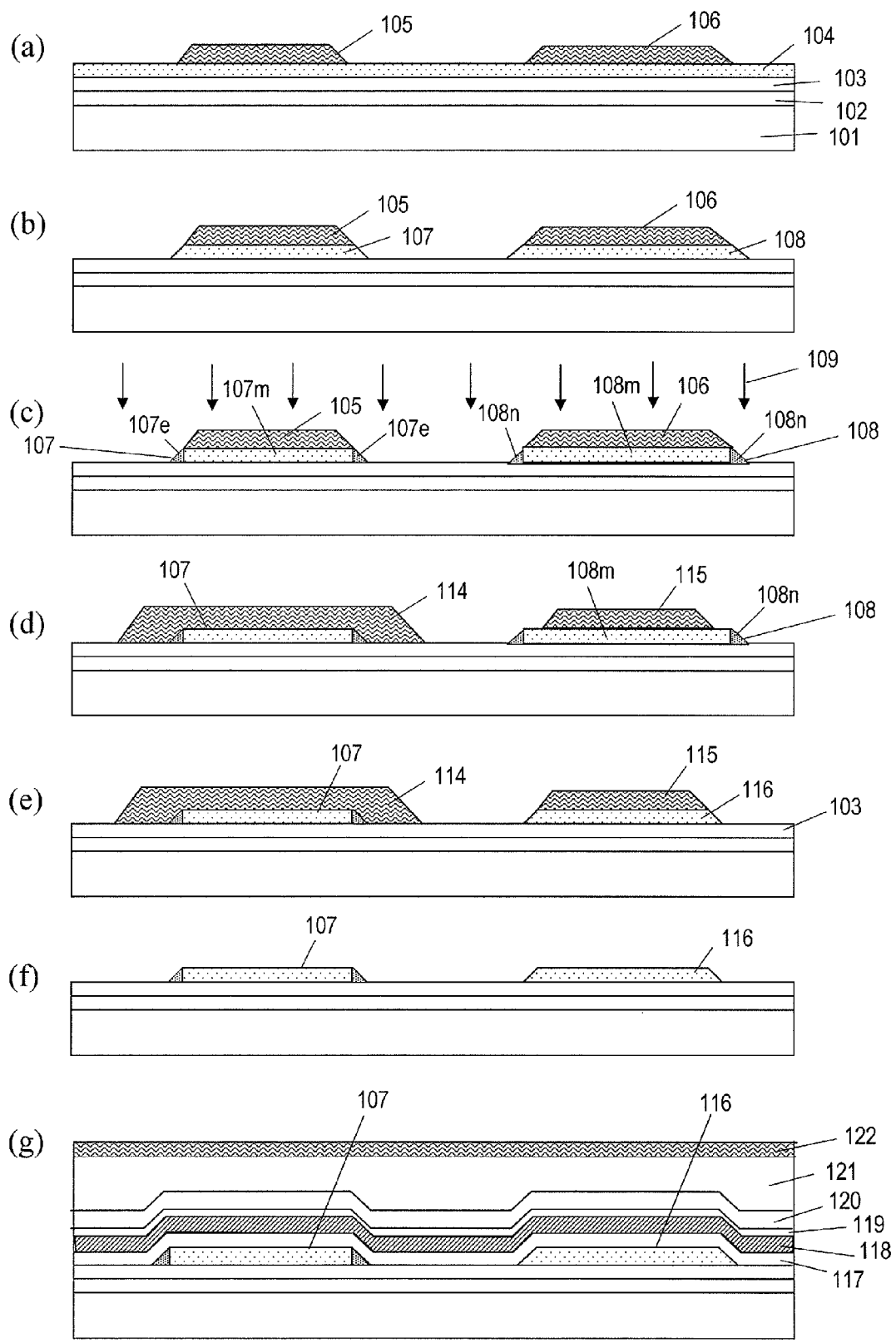
In FIG. 7, (a) to (g) are process cross-sectional views for illustrating an example of the production method of the semiconductor device in the first embodiment of the present invention, respectively.

In FIG. 7, (a) to (g) are process cross-sectional views for illustrating an example of the production method of the semiconductor device in this embodiment, respectively. These figures show the cross sections taken along the channel width direction.

First, as shown in FIG. 7(a), after base films 102 and 103 are formed on a substrate 101, a crystalline semiconductor film 104 is formed thereon. Then, on the crystalline semiconductor film 104, mask films (resist mask films) 105 and 106 are formed by photolithography.

As the substrate 101, a low alkali glass substrate or a quartz substrate can be employed. In this embodiment, a low alkali glass substrate is used. As the base films 102 and 103, it is possible to employ a silicon oxide film, a silicon nitride film, a silicon oxynitride film, or the like may be employed. In this embodiment, as the lower base film 102, a silicon nitride film is employed, and as the upper base film 103, a silicon oxide film is employed. These base films can be formed by plasma CVD, for example. In this embodiment, two base films are used, but alternatively the base film may be a single silicon oxide film.

In this embodiment, as the crystalline semiconductor film 104, a crystalline silicon film (thickness: e.g. 20 to 150 nm, and preferably 30 to 80 nm) is formed. The crystalline silicon film can be formed by first forming a amorphous silicon film (a-Si) film on the base film 103, adding nickel (Ni) to the a-Si film, and thereafter performing solid phase crystallization (SPC: Solid Phase Crystallization). Alternatively, the crystalline silicon film may be formed by crystallizing the a-Si film by directly irradiating the a-Si film with excimer laser.

Next, as shown in FIG. 7(b), the crystalline semiconductor film 104 is etched in an island-like manner, by using the mask films 105 and 106 as the mask. As a result, a semiconductor layer 107 which will subsequently be an active layer of the n-type TFT (source/drain regions and a channel region) and a semiconductor layer 108 which will subsequently be an active layer of the p-type TFT. It is noted that the semiconductor layer 108 has a pattern which is larger in the channel width direction than the final form of the semiconductor layer which will act as the active layer of the p-type TFT. Herein the thickness of the semiconductor layers 107 and 108 is 50 nm, for example.

In this condition, as shown in FIG. 7(c), a p-type impurity 109 is doped with low density from above of the mask films 105 and 106. Herein as the p-type impurity 109, boron is used. As the doping conditions of boron 109, for example, the accelerating voltage is 5 to 20 kV, and the dose is $5 \times 10^{11}$ to $1 \times 10^{13}$ cm$^{-2}$. Accordingly, the p-type impurity 109 is implanted into only portions (slope portions) 107e and 108e which are not covered with the mask films 105 and 106 of the semiconductor layers 107 and 108. The p-type impurity is not implanted into portions (main portions) 107m and 108m which are covered with the mask films 105 and 106 of the semiconductor layers 107 and 108.

Then, as shown in FIG. 7(d), after the mask films 105 and 106 are removed, a mask film 114 which covers the entire of the semiconductor layer 107, and a mask film 115 which covers a part of the main portion 108m of the semiconductor layer 108 are newly formed. The mask film 115 may be disposed so as to expose a portion which is capable of operating as a parasitic transistor of a slope portion 108n of the semiconductor layer 108. Accordingly, the mask film 115 may be disposed so as to expose the entire of the slope portion 108e in the periphery of the semiconductor layer 108, or may be disposed so as to expose only a portion extending in the channel direction of the slope portion 108e described above with reference to FIG. 4(b).

Thereafter, as shown in FIG. 7(e), the etching of the semiconductor layer 108 is performed by using the mask films 114 and 115 as a mask. As the result of the etching, a semiconductor layer 116 which will act as an active layer of a p-type TFT is obtained. In a slope portion of the semiconductor layer 116, at least a portion which is capable of operating as a parasitic transistor does not contain a p-type impurity.

In this embodiment, for example, the etching of the semiconductor layer 108 is performed by RIE (Reactive Ion Etching) utilizing $CF_4$ gas and oxygen as etching gases. In the etching step, etching selectivity can be ensured between the semiconductor layer (the Si layer) 108 and the silicon oxide layer of the base film 103, so that it is possible to prevent a portion of the base film 103 which is not covered with the semiconductor layer or the mask films 114 and 115 from being dug.

In the etching step, as shown in FIG. 52, the surface portion of the base film 103 may sometimes be dug thinly. For example, in the case where a silicon oxide film having the thickness of 100 nm is used as the base film 103, only the portion of the base film 103 which is not covered with the semiconductor layer 108 (having a pattern before it is etched to be the semiconductor layer 116) or the mask film 114 is made thinner. As a result, a step of about 10 to 20 nm or less may be caused in the base film 103. The step is sufficiently small, so that the influence on the coverage of a gate insulating film is small.

Especially in the case where the gate insulating film is thin, and there is a step in an end portion of the semiconductor layer, even a step small enough may affect the coverage. On the contrary, in this embodiment, as shown in the figure, the step caused by digging the base film 103 is formed in a position distant from the end portions of the semiconductor layers 107 and 116, and is not caused in the vicinity of the end portions of the semiconductor layers 107 and 116. Specifically, a portion of the base film 103 which is exposed from the semiconductor layer 108 is dug, so that the step is not caused in the end portion of the semiconductor layer 116, and is mainly caused in the end portion of the semiconductor layer 108 before etching. Similarly, a portion of the base film 103 which is exposed from the mask film 114 is dug, so that a step is not caused in the end portion of the semiconductor film 107. As described above, any step due to the digging of the base film 103 is not caused in either of the semiconductor layers 107 and 116 of the n-type and p-type semiconductor layer 107, so that the semiconductor layers 107 and 116 can be surely covered even in the case where the gate insulating film.

Next, the mask films 114 and 115 are removed. In this way, as shown in FIG. 7(f), the semiconductor layers 107 and 116 having slope portions in which doping conditions are different can be obtained.

Thereafter, as shown in FIG. 7(g), a gate insulating film 117 and a gate electrode film 118 are formed on the semiconductor layers 107 and 116. Although not shown in the cross-sectional view, an n-type impurity is doped into the semiconductor layer 107, so as to form source/drain regions. Similarly, a p-type impurity is doped into the semiconductor layer 116, so as to form source/drain regions. Then, interlayer insulating films 119 and 120 are formed on the gate electrode film 118. Herein the formed interlayer insulating film has a layered structure including a silicon nitride film as a lower layer 119 and a silicon oxide film as an upper layer 120.

In addition, although not shown in the cross-sectional view, a source electrode and a drain electrode of each of the TFTs are provided on the interlayer insulating film 120. The source electrode is connected to a source region of the corresponding TFT in a contact hole provided through the interlayer insulating films 119 and 120 and the gate insulating film 117. Similarly, the drain electrode is connected to a drain region of the corresponding TFT in a contact hole provided through the interlayer insulating film 119 and 120 and the gate insulating film 117. As a result, an n-type TFT and a p-type TFT can be obtained.

Thereafter, a resin layer 121 is formed so as to cover the n-type TFT and the p-type TFT. In this embodiment, a pixel electrode film 122 is formed on the resin layer 121. Although not shown in the figure, the pixel electrode film 122 is electrically connected to the drain electrode of the n-type TFT and the source electrode of the p-type TFT in contact holes provided in the resin layer 121.

In the process shown in FIG. 7, as necessary, in order to individually control the threshold voltages Vth of the n-type TFT and the p-type TFT, a p-type impurity may be doped (channel doped) into the semiconductor layers 107 and 116 in the respective TFTs. At this time, the channel doping may be selectively performed for either of the semiconductor layers 107 and 116, or the channel doping is separately performed, the main portions of these semiconductor layers 107 and 116 may have different densities of p-type impurity.

According to the present invention, as described above with reference to FIG. 8, in the voltage-current characteristics in both of the n-type and p-type TFTs, a bump at the rising of the ON-current can be eliminated. As a result, the OFF state of the TFT can be maintained when the gate voltage Vg is 0 V, and also the threshold voltage Vth can be low.

According to the production method of this embodiment, the patterning of the semiconductor film is performed in two separate steps, thereby making the doping conditions of the slope portions in the semiconductor layers different between the n-type TFT and the p-type TFT. Accordingly, without complicating the production process, it is possible to individually produce the semiconductor layers for the n-type TFT and the p-type TFT.

According to the method described in Patent Document No. 1, the occurrence of a "hump (bump)" due to the parasitic transistor of the n-type TFT can be suppressed, but thickness of the gate insulating film cannot be reduced, so that it is difficult to sufficiently lower the threshold voltage Vth of the n-type TFT. In Patent Document No. 1, the mask layers 244$n$ and 244$p$ shown in FIG. 50 are used as a lower layer of the gate insulating film. Accordingly, the gate insulating film has a two-layer structure, and it is necessary to cover the side face of the semiconductor layer only with the upper layer of the gate insulating film. Accordingly, it is difficult to reduce the total thickness of the gate insulating film. Alternatively, the mask layers 244$n$ and 244$p$ can be removed without being used as the gate insulating film. However, in such a case, in the etching step of the mask layers (silicon oxide layers) 244$n$ and 244$p$, the base film of the same material may be dug greatly. For example, the surface portion of the base film is dug up to a thickness substantially equal to the thickness of the mask layers 244$n$ and 244$p$, e.g. 40 nm or more. As a result, in the end portion of the semiconductor layer, a step between the semiconductor layer and the base film is enlarged. In order to surely cover such a large step with the gate insulating film, it is necessary to increase the thickness of the gate insulating film.

On the contrary, according to this embodiment, it is unnecessary to form such a gate insulating film of two-layer structure as in Patent Document No. 1, so that the thickness of the gate insulating film 117 can be reduced drastically as compared with the gate insulating film in Patent Document No. 1. In addition, in the etching step of the semiconductor layer 108, it is possible to ensure sufficient etching selectivity between the semiconductor layer (an Si layer) 108 and the base film (e.g. a silicon oxide layer) 103. Accordingly, it is possible to suppress the enlargement of the step between the pattern of the semiconductor layer 116 and the base film 103 around it caused by the simultaneous etching of the surface portion of the base film 103. As a result, the step can be more surely covered with the gate insulating film 117, so that it is unnecessary to increase the thickness of the gate insulating film 117.

As described above, since the gate insulating film 117 can be formed without being constrained by other process steps, the gate insulating film 117 can be thinner than the prior art. In addition, the thickness of the gate insulating film 117 can be set with high degrees of freedom, so that the thickness thereof can be set to the optimum thickness required for the device.

It is preferred that the thickness of the gate insulating film 117 be equal to or less than the thickness of the semiconductor layers 107 and 116. For example, the thickness of the gate insulating film 177 is preferably set to be not less than 25 nm and not more than 50 nm. With such setting, the threshold voltages Vth of the respective TFT can be effectively reduced, so that the driving voltage of a semiconductor device can be lowered.

Hereinafter, the magnitude relationship of densities of p-type impurity in the semiconductor layers of the p-type and n-type TFTs will be described. In the following description, in the semiconductor layer of the n-type TFT, the density of p-type impurity in a portion of the slope portion which is capable of operating a parasitic transistor is designated by Cn-e, and the density of p-type impurity in the main portion is designated by Cn-m. In the semiconductor layer of the p-type TFT, the density of p-type impurity in a portion of the slope portion which is capable of operating a parasitic transistor is designated by Cp-e, and the density of p-type impurity in the main portion is designated by Cp-m. Herein, the term "the density of p-type impurity in the main portion" means the density of p-type impurity in a portion of the main portion of the semiconductor layer which will act as a channel region (a region excluding the source/drain regions). The term "a portion of a slope portion which is capable of operating as a parasitic transistor" indicates a portion of the slope portion positioned in an edge portion of the channel region, i.e. a portion a portion overlapping a gate electrode.

As described above, in order to suppress the influence of the parasitic transistor of the n-type TFT on the TFT characteristics, it is necessary to satisfy the following inequality relationship:

$$Cn\text{-}e > Cn\text{-}m \quad (1)$$

In the n-type and p-type TFTs, in order to control the threshold voltages, the p-type impurity may be doped (channel doped) into the semiconductor layer. It should be noted that in order to adjust the threshold voltage in such a manner that both of the TFTs are in the OFF state when the gate voltage Vg is zero, the following inequality relationship may be preferably satisfied:

$$Cn\text{-}m > Cp\text{-}m \quad (2)$$

When Expressions (1) and (2) are combined, the following expression is obtained:

$$Cn\text{-}e > Cn\text{-}m > Cp\text{-}m \quad (3)$$

In addition, if the density of p-type impurity in the slope portion of the p-type TFT is too high, the influence of the parasitic transistor of the p-type TFT on the TFT characteristics increases. In order to suppress the influence, it is preferred that the following relationship is satisfied:

$$Cp\text{-}e < Cn\text{-}e \quad (4)$$

More preferably, the following relationship is satisfied:

$$Cp\text{-}e < Cp\text{-}m \quad (5)$$

By adopting this embodiment, the threshold voltage Vth of the n-type TFT can be drastically reduced than the prior art. In the prior-art n-type TFT, when the thickness of the gate insulating film was 70 nm, the lower limit of the threshold voltage of the n-type TFT was 1.3 V. On the contrary, in this embodiment, by introducing the p-type impurity into the slope portion of the n-type semiconductor layer, the lower limit of the threshold voltage Vth of the n-type TFT can be reduced down to 0.8 V, which is lower than the prior art by 0.5 V. When the thickness of the gate insulating film 117 was 40 nm, the lower limit of the threshold voltage of the prior-art n-type TFT was 0.9 V. In this embodiment, the lower limit of the threshold voltage Vth of the n-type TFT can be reduced down to 0.5 V.

In addition, according to this embodiment, even if the thickness of the gate insulating film is reduced to be 40 nm or less, the reliability can be ensured.

The semiconductor device in this embodiment can be suitably applied to a display device provided with a memory circuit for storing display data (an image memory) in each pixel. In the display device provided with such an image memory, data transfer is not required if the display data is not changed, so that the electric power consumption can be extremely lowered. If the semiconductor device in this embodiment (an SRAM circuit of a DRAM circuit) is used as the image memory in such a display device, the electric power consumption of the display device can be further reduced. Specifically, the panel driving voltage can be drastically lowered as compared with the prior art (e.g. less than 2V). As a result, for example, without providing a booster circuit, the driving can be realized by using a button battery or the like (3 V of driving voltage). Such a display device can be suitably used for an application in which the display is always performed, for example.

Second Embodiment

A semiconductor device in a second embodiment of the present invention will be described. The semiconductor device in this embodiment has the same configuration as that of the semiconductor device in the first embodiment described above with reference to FIG. 1. In addition, similarly to the first embodiment, to a portion of the slope portion of the n-type TFT which is capable of operating at least as a parasitic transistor, a p-type impurity is introduced with the density higher than the main portion of the n-type TFT.

The present invention and the first embodiment are different in the production methods thereof. Specifically, in the first embodiment, the patterning of the semiconductor layer of the p-type TFT is performed by two etching steps. In the present invention, the patterning of the semiconductor layer of the n-type TFT is performed by two etching steps. Accordingly, the doping condition of the p-type impurity in the slope portion of the respective TFT is different from the doping condition in the semiconductor device of the first embodiment.

Hereinafter the production method of the semiconductor device in this embodiment will be generally described.

FIG. 9 to FIG. 12 are schematic views for generally describing the production method of the semiconductor device in this embodiment. In each figure, (a) is a plan view, and (b) is a cross-sectional view taken along a line A-A' shown in the plan view of (a). The line A-A' is parallel to the channel width direction. In FIG. 9 to FIG. 12, only a single n-type TFT and a single p-type TFT formed on one and the same substrate are shown. Alternatively, a plurality of the respective types of TFTs may be formed on one and the same substrate.

First, a semiconductor film is formed on a substrate 1, and mask films (e.g. resist films) 23 and 24 are formed on the semiconductor film. Next, the patterning of the semiconductor film is performed by using the mask films 23 and 24 as a mask. As the result of the patterning, as shown in (a) and (b) of FIG. 9, on the substrate 1, a semiconductor layer 21 which will act as an active layer of an n-type TFT and a semiconductor layer 22 which will act as an active layer of a p-type TFT are obtained. The semiconductor layers 21 and 22 have main portions 21m and 22m covered with the mask films 23 and 24, and slope portions 21e and 22e which are positioned in the periphery of the main portions 21m and 22m and not covered with the mask films 23 and 24, respectively. In the example shown in the figure, the upper surfaces off the main portions 21m and 22m are substantially flat, but alternatively may have surface roughness. For example, the surface roughness of the semiconductor film before the patterning may be maintained.

At this time, the semiconductor layer 22 is processed so as to have a pattern which will act as the active layer of the p-type TFT, but the semiconductor layer 21 is processed so as to be larger than a pattern which will act as the active layer of the n-type TFT (the final form) at least in the direction perpendicular to the channel (the channel width direction).

Figure 10:
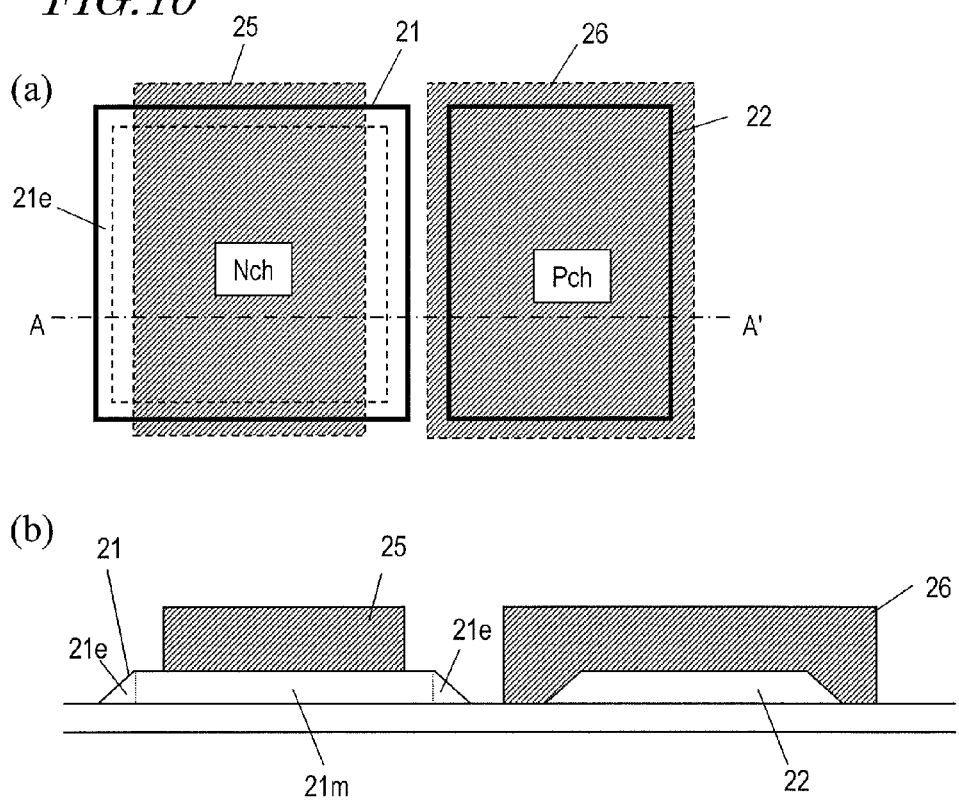
In FIG. 10, (a) and (b) are a plan view and a cross-sectional view, respectively, for generally illustrating the production method of a semiconductor device in a second embodiment of the present invention.

Next, as shown in (a) and (b) of FIG. 10, the mask films 23 and 24 are removed, a mask film 25 for covering a part of the main portion 21m of the semiconductor layer 21 and a mask film 26 for covering the entire of the semiconductor layer 22 are newly formed. In the example shown in the figure, the mask film 25 has a pattern which is longer than the semiconductor layer 21 in the channel direction but shorter in the channel width direction. The mask film 25 is disposed so as to expose a portion of the slope portion 21e extending in the channel direction. It is sufficient that the mask film 25 has an opening portion for exposing a portion of the slope portion 21e which is capable of operating a parasitic transistor. The shape and dimensions of the mask film 25 are not limited to those shown in the figure.

Figure 11:
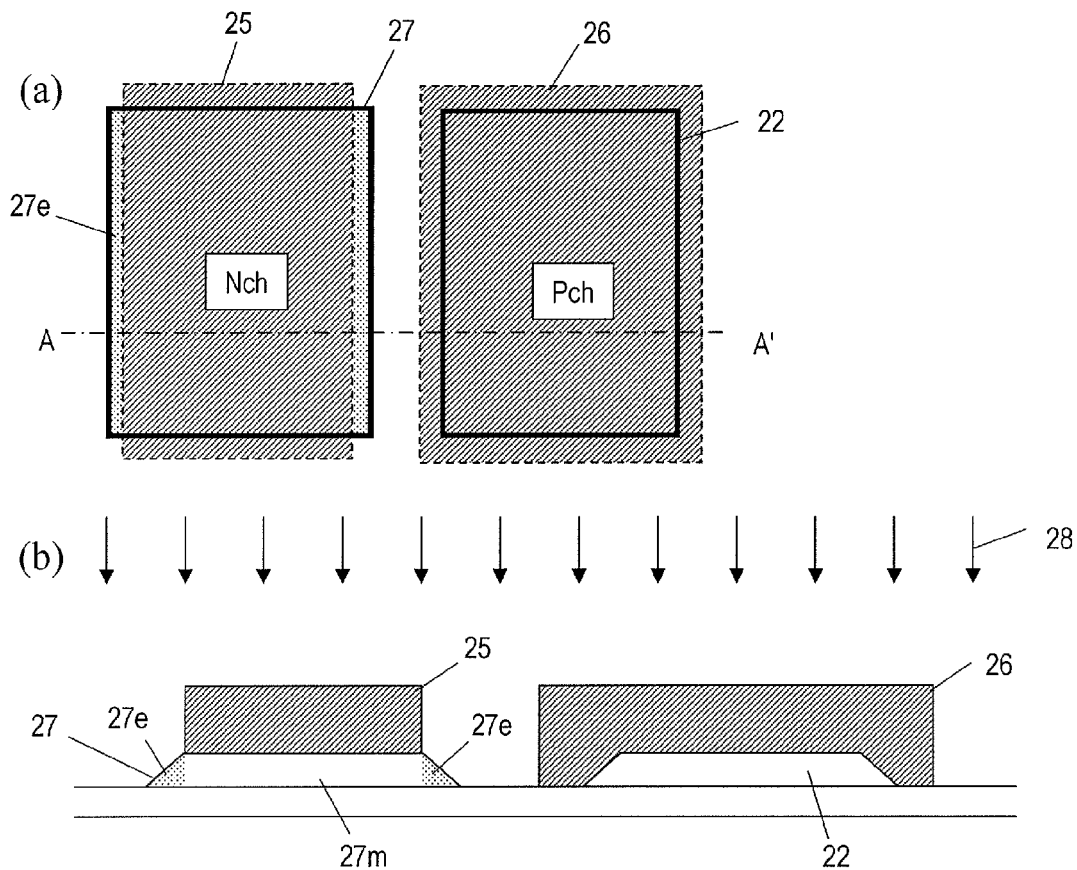
In FIG. 11, (a) and (b) are a plan view and a cross-sectional view, respectively, for generally illustrating the production method of a semiconductor device in a second embodiment of the present invention.

Then, as shown in (a) and (b) of FIG. 11, the etching of the semiconductor layer 21 is performed by using the mask films 25 and 26 as a mask. As the result of the etching, a portion of the semiconductor layer 21 which is not covered with the mask film 25 is etched. In this embodiment, by the etching step, a portion of the slope portion 21e extending in the channel direction is etched, thereby newly forming a slope 27e. In this way, a semiconductor layer 27 which is processed so as to have the final form is obtained.

Next, a p-type impurity (e.g. boron) is implanted into the semiconductor layer 27 by using the mask films 25 and 26 as a mask. The p-type impurity is selectively introduced into only a portion of the semiconductor layer 27 which is not covered with the mask film 25 (the slope portion 27e). The p-type impurity is not implanted into the main portion 27m of the semiconductor layer 27 which is covered with the mask film 25 and the semiconductor layer 22. Thereafter, the mask films 25 and 26 are removed.

Figure 12:
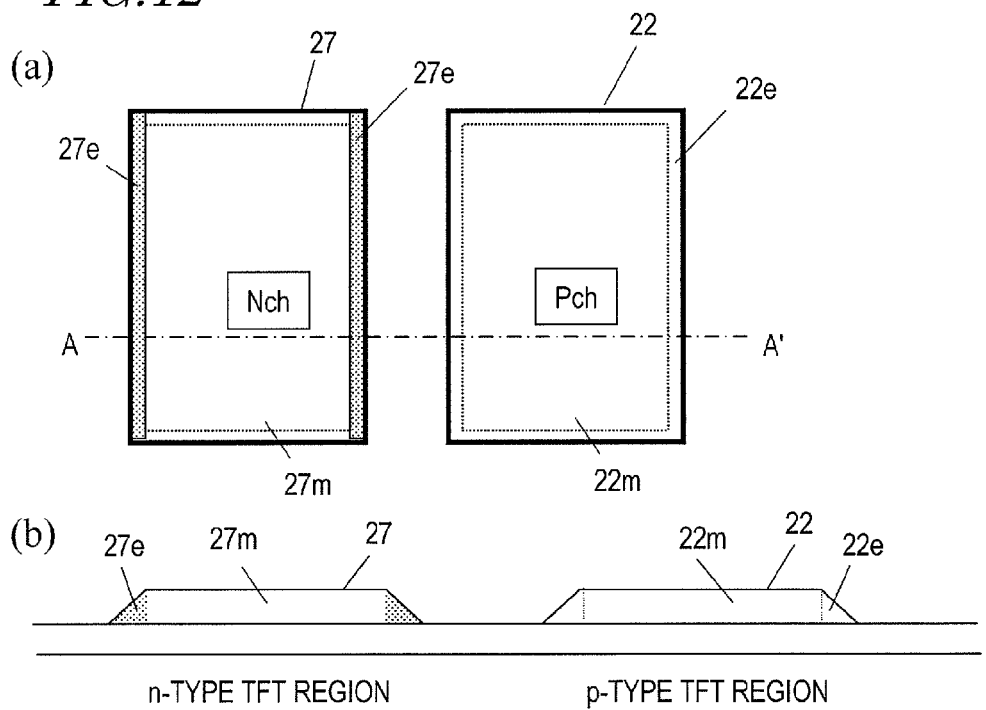
In FIG. 12, (a) and (b) are a plan view and a cross-sectional view, respectively, for generally illustrating the production method of a semiconductor device in a second embodiment of the present invention.

As a result, as shown in (a) and (b) of FIG. 12, in the obtained semiconductor layer 27, the p-type impurity is contained in a part of the slope portion 27e of the semiconductor layer 27 with higher density than the main portion 27m. In the example shown in the figure, the p-type impurity is contained in only a portion of the slope portion 27e extending in the channel direction with higher density than the main portion 27m. The density of p-type impurity in a portion of the slope portion 27e extending in the channel width direction of the semiconductor layer 27 is substantially the same as the density of p-type impurity of the main portion 27m. On the other hand, in the semiconductor layer 22, the densities of p-type impurity of the main portion 22m and the slope portion 22e are substantially equal.

In this way, the p-type impurity can be introduced into the portion of the slope portion 27e of the semiconductor layer 27 which is capable of operating at least a parasitic transistor with higher density than in the main portion 27m of the semiconductor layer 27, the main portion 22m of the semiconductor layer 22, and the slope portion 22e of the semiconductor layer 22.

Although not shown in the figure, it is preferred that the p-type impurity is further introduced into the semiconductor layer 27, so that the density of p-type impurity in the main portion 27m of the semiconductor layer 27 is made higher than the density of p-type impurity in the main portion 22m of the semiconductor layer 22. Accordingly, the voltage-current characteristics of the n-type TFT using the semiconductor layer 27 can be shifted to a direction in which the gate voltage Vg increases. Therefore it is possible to perform the adjustment in such a manner that the n-type TFT is in the OFF state when the gate voltage Vg is zero.

Thereafter, although not shown in the figure, a gate insulating film and a gate electrode are provided on the semiconductor layers 27 and 22. An n-type impurity is introduced into a part of the semiconductor layer 27, thereby forming source and drain regions. The p-type impurity is introduced into a part of the semiconductor layer 22, thereby forming source and drain regions. In addition, a source electrode and a drain electrode which are electrically connected to the source and drain region, respectively, are provided. As a result, an n-type TFT having the semiconductor layer 27 as the active layer and a p-type TFT having the semiconductor layer 22 as the active layer are obtained.

Hereinafter, with reference to the drawings, the production method of the semiconductor device in this embodiment will be specifically described. In the following description, general process steps for fabricating a TFT such as activation annealing and hydrogenation are omitted.

Figure 13:
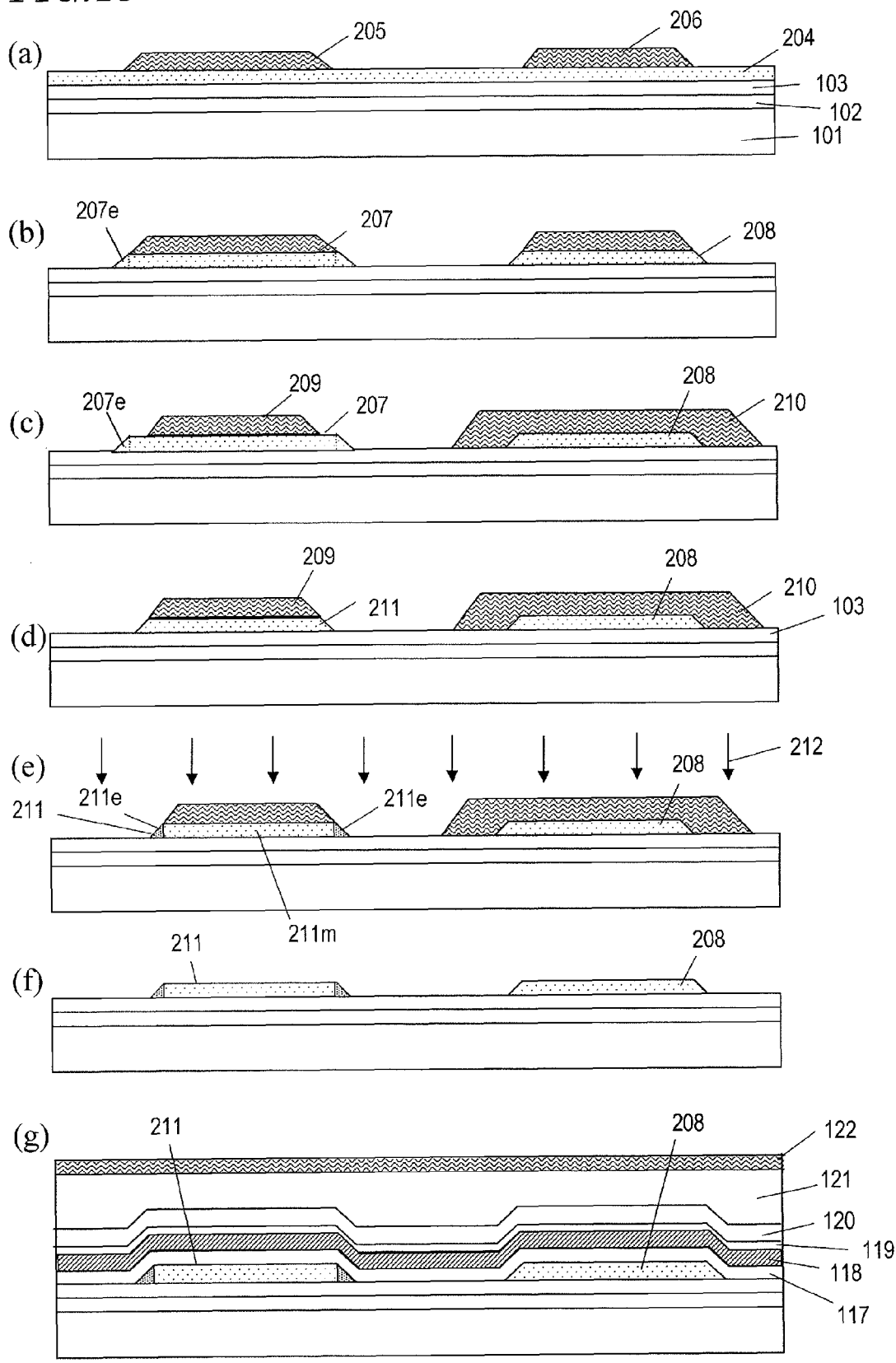
In FIG. 13, (a) to (g) are process cross-sectional views for illustrating an example of the production method of the semiconductor device in the second embodiment of the present invention, respectively.

In FIG. 13, (a) to (g) are process cross-sectional view for illustrating an example of the production method of the semiconductor device in this embodiment. These figures show the cross sections taken along the channel width direction. For simplicity, the components which are the same as those in FIG. 7 are designated by the same reference numerals, and the descriptions thereof are omitted.

First, as shown in FIG. 13(a), on a substrate 101, base films 102 and 103 are formed, and then a crystalline semiconductor film 204 is formed thereon. Then, on the crystalline semiconductor film 204, mask films (resist mask films) 205 and 206 are formed by photolithography. The materials and the methods for forming these films may be the same as the materials and the forming methods as described above with reference to FIG. 7(a).

Next, as shown in FIG. 13(b), the crystalline semiconductor film 204 is etched in an island-like manner by using the mask films 205 and 206 as a mask. As the result of the etching, a semiconductor layer 207 which will act as an active layer of an n-type TFT and a semiconductor layer 208 which will act as an active layer of a p-type TFT are obtained. The semiconductor layer 207 has a pattern which is larger in the channel width direction than the final form of the semiconductor layer which will act as the active layer of the n-type TFT. Herein the thickness of the semiconductor layers 207 and 208 is 50 nm, for example.

Thereafter, as shown in FIG. 13(c), the mask films 205 and 206 are removed, and a mask film 209 for covering a part of the semiconductor layer 207 and a mask film 210 for covering the entire of the semiconductor layer 208 are newly formed. It is sufficient that the mask film 209 may be disposed so as to expose a portion of the slope portion 207e of the semiconductor layer 207 which is capable of operating as a parasitic transistor. Accordingly, the mask film 209 may be disposed so as to expose the entire of the slope portion 207e of the semiconductor layer 207, or alternatively may be disposed so as to expose a portion of the slope portion 207 extending along the channel direction as described above with reference to FIG. 10(b).

Then, as shown in FIG. 13(d), the etching of the semiconductor layer 207 is performed by using the mask films 209 and 210 as a mask. As the result of the etching, a semiconductor layer 211 which will act as an active layer of the p-type TFT.

In this embodiment, for example, the etching of the semiconductor layer 207 is performed by RIE (Reactive Ion Etching) by using $CF_4$ gas and oxygen as etching gases. In the etching step, etching selectivity can be ensured between the semiconductor layer (the Si layer) 207 and a silicon oxide layer of the base film 103, so that it is possible to prevent a portion of the base film 103 which is not covered with the semiconductor layer 207 or the mask films 209 and 210 from being dug.

In this condition, as shown in FIG. 13(e), a p-type impurity 212 is doped with low density from above the mask films 209 and 210. Herein, boron is used as the p-type impurity 212. As the doping conditions of the boron 212, for example, the acceleration voltage is 5 to 20 kV, and the dose is $5\times10^{11}$ to $1\times10^{13}$ $cm^{-2}$.

Accordingly, the p-type impurity 212 is selectively implanted into only a portion (a slope portion) 211e of the semiconductor layer 211 which is not covered with the mask film 209. The p-type impurity 212 is not implanted into a portion (a main portion) 211m of the semiconductor layer 211 which is covered with the mask film 209 and the semiconductor layer 208.

Next, the mask films 209 and 210 are removed. In this way, as shown in FIG. 13(f), the semiconductor layers 211 and 208 in which the doping conditions in the slope portions are different can be obtained.

Thereafter, as shown in FIG. 13(g), a gate insulating film 117, a gate electrode film 118, source and drain regions, interlayer insulating films 119 and 120, source and drain electrodes, a resin layer 121, and a pixel electrode film 122 are formed. These films and regions can be formed by using the same method as that described above with reference to FIG. 7(g), and may have the same configuration.

In the process shown in FIG. 13, as necessary, in order to individually control the threshold voltages Vth of the n-type TFT and the p-type TFT, a p-type impurity may be doped (channel doped) into the main portions of the semiconductor layers 211 and 208 in the respective TFTs. At this time, the channel doping may be selectively performed for either of the semiconductor layers 211 and 208, or the channel doping is separately performed, the main portions of these semiconductor layers 211 and 208 may have different densities of p-type impurity.

According to this embodiment, the same effects as those in the first embodiment can be attained. Specifically, as described above with reference to FIG. 8, in the voltage-current characteristics in both of the n-type and p-type TFTs, a bump at the rising of the ON-current can be eliminated. As a result, the OFF state of the TFT can be maintained when the gate voltage Vg is 0 V, and also the threshold voltage Vth can be low.

According to the production method of this embodiment, the patterning of the semiconductor film is performed in two separate steps, thereby making the doping conditions of the slope portions in the semiconductor layers different between the n-type TFT and the p-type TFT. Accordingly, without complicating the production process, it is possible to individually produce the semiconductor layers for the n-type TFT and the p-type TFT.

In addition, similarly to the first embodiment, the gate insulating film 117 can be thin as compared with the method described in Patent Document No. 1, for example, so that the threshold voltage Vth can be effectively reduced. The preferred thickness range of the gate insulating film 117 is the same as the range described in the first embodiment.

By adopting this embodiment, the threshold voltage Vth of the n-type TFT can be drastically reduced than the prior art. In the prior-art n-type TFT, when the thickness of the gate insulating film was 70 nm, the lower limit of the threshold voltage of the n-type TFT was 1.3 V. On the contrary, in this embodiment, by introducing the p-type impurity into the slope portion of the n-type semiconductor layer, the lower limit of the threshold voltage Vth of the n-type TFT can be reduced down to 0.8 V, which is lower than the prior art by 0.5 V. When the thickness of the gate insulating film 117 was 40 nm, the lower limit of the threshold voltage of the prior-art n-type TFT was 0.9 V. In this embodiment, the lower limit of the threshold voltage Vth of the n-type TFT can be reduced down to 0.5 V. In addition, according to this embodiment, even if the thickness of the gate insulating film is reduced to be 40 nm or less, the reliability can be ensured.

Similarly to the semiconductor device in the first embodiment, the semiconductor device in this embodiment can be suitably applied to a display device provided with a memory circuit for storing display data (an image memory) in each pixel, and the electric power consumption of the display device can be further reduced. For example, if the semiconductor device in this embodiment is applied to a memory circuit, the panel driving voltage can be drastically lowered as compared with the prior art (e.g. less than 2V). As a result, for example, without providing a booster circuit, the driving can be realized by using a button battery or the like (3 V of driving voltage).

Third Embodiment

A semiconductor device in a third embodiment of the present invention will be described. This embodiment is different from the above-described embodiments in that the semiconductor layers of the n-type and p-type TFTs have patterns in which the channel width is smaller than the width of the source and drain regions (so-called "dog-bone pattern").

In the above-described embodiments, the island-like semiconductor layers which will act as the active layers of the n-type and p-type TFT have rectangular patterns. However, in the actual circuit, especially in a memory circuit such as an SRAM circuit or a DRAM circuit included in the pixel, an island-like semiconductor layer having a pattern with a small channel width is often used. In such a case, in the island-like semiconductor layer, the width of a channel region (the channel width W) is smaller than the width of a region for forming a contact hole in the channel width direction. That is, the pattern of the semiconductor layer has a narrow portion between the source region and the drain region. The "narrow portion" indicates a portion of which the width is narrower than the width of the other portion. In this specification, the pattern having such a narrow portion is referred to as a "dog-bone pattern".

Figure 14:
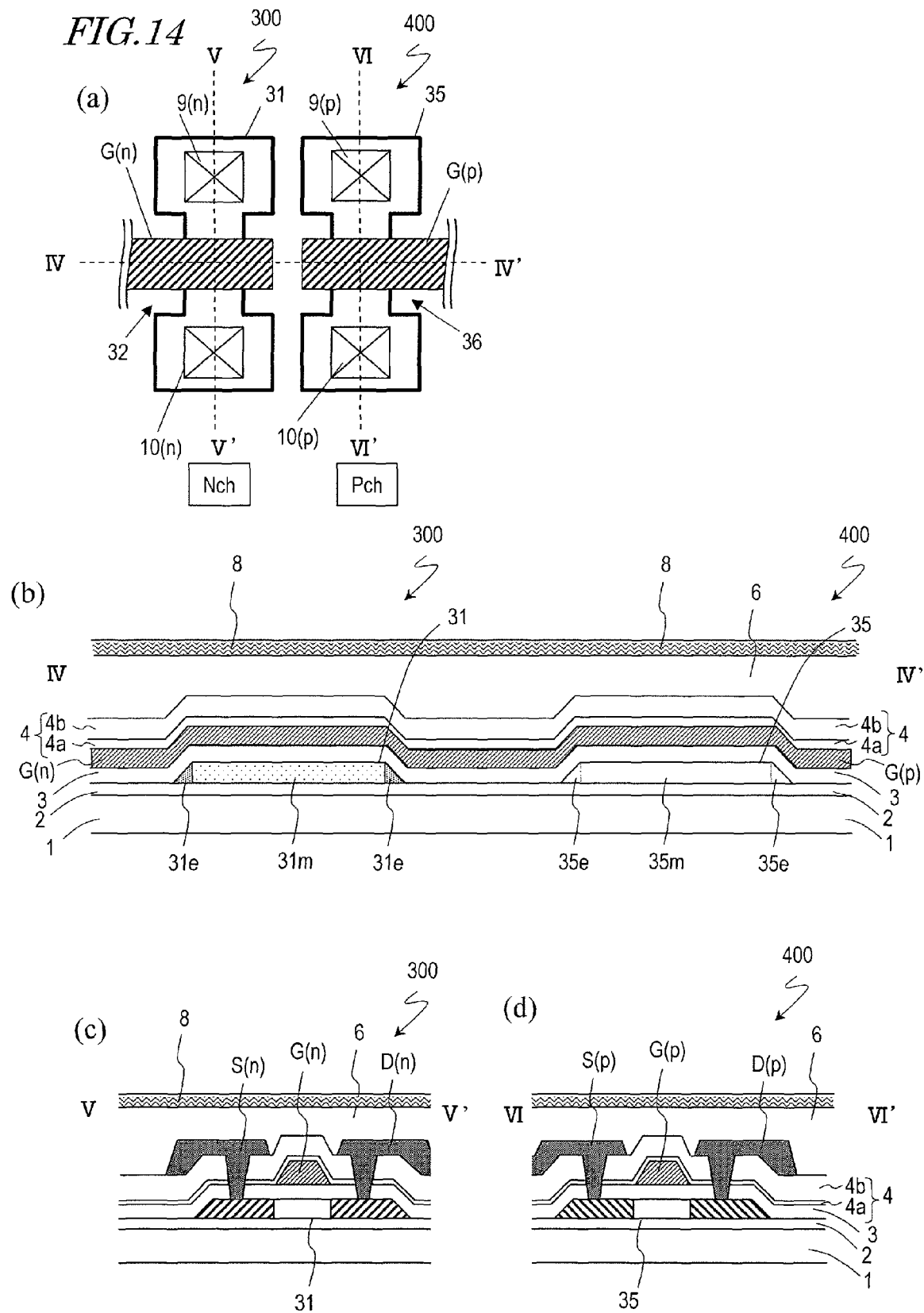
In FIG. 14, (a) is a plan view schematically showing an n-type TFT and a p-type TFT in a semiconductor device in a third embodiment of the present invention, (b) is a cross-sectional view taken along line IV-IV' shown in the plan view of (a), and (c) and (d) are cross-sectional views taken along line V-V' and VI-VI' shown in the plan view of (a).

FIG. 14(a) is a schematic plan view of the n-type TFT and the p-type TFT in the semiconductor device of this embodiment. FIG. 14(b) is a cross-sectional view taken along a line IV-IV' shown in the plan view of FIG. 14(a). FIG. 14(c) and FIG. 14(d) are cross-sectional views taken along a line V-V' and a line VI-VI' shown in the plan view of FIG. 14(a), respectively. The line V-V' and the line VI-VI' are parallel to the channel direction, and the line IV-IV' is perpendicular to the channel direction. For simplicity, the components which are the same as those in (a) to (d) of FIG. 1 are designated by the same reference numerals, and the descriptions thereof are omitted.

The semiconductor device in this embodiment is provided with an n-type TFT 300 and a p-type TFT 400. The n-type TFT 300 has a semiconductor layer 31 including source and drain regions and a channel region positioned therebetween. The source and drain regions are connected via contact portions 9(n) and 10(n) to a source electrode and a drain electrode disposed above the semiconductor layer 31, respectively. On the semiconductor layer 31, a gate electrode G(n) is provided so as to overlap the channel region. In addition, when viewed from above the substrate 1, the pattern of the semiconductor layer 31 has a narrow portion 32 between the source region and the drain region (FIG. 14(a)). The width of the narrow portion 31 in the channel width direction is smaller than the maximum width of the source and drain regions in the channel width direction. The channel region is formed in the narrow portion 32.

Similarly to the n-type TFT 300, the p-type TFT 400 also has a semiconductor layer 35 including source and drain regions and a channel region positioned therebetween. The source and drain regions are connected via contact portions 9(p) and 10(p) to a source electrode and a drain electrode disposed above the semiconductor layer 35, respectively. On the semiconductor layer 35, a gate electrode G(p) is provided so as to overlap the channel region. When viewed from above the substrate 1, the pattern of the semiconductor layer 35 has a narrow portion 36 between the source region and the drain region. The channel region is formed in the narrow portion 36.

In the semiconductor layers 31 and 35 of the n-type TFT 300 and the p-type TFT 400, the width of the narrow portions 32 and 36 is regarded as the channel width W. For example, in the case where the semiconductor device in this embodiment is used in a memory circuit included in a pixel, it is preferred that the channel width W is kept small in order to suppress the leakage current in the OFF state operation to the minimum with respect to the suppression of current consumption. The channel width is about 3 to 4 μm, for example. On the other hand, the width of a region of the source and drain regions in which the contact portion is disposed is larger than the width of the contact hole (e.g. 4 μm), and is 8 μm, for example.

Also in this embodiment, the semiconductor layers 31 and 35 have slope portions 31e and 35e and main portions 31m and 35m, respectively. In the n-type TFT 300, the p-type impurity is introduced into at least a portion of the slope portion 31e which overlaps the gate electrode G(n) with higher density than the main portion 31m of the semiconductor layer 31 and the main portion 35m of the semiconductor layer 35. In the example shown in the figure, the p-type impurity is introduced into the entire of the slope portion 31e with such higher density. On the other hand, the density of p-type impurity in a portion of the slope portion 35e of the semiconductor layer 35 which overlaps the gate electrode G(p) is lower than the density of p-type impurity in the slope portion 31e. In the example shown in the figure, the density of p-type impurity in a portion positioned in the narrow portion of the slope portion 35e of the semiconductor layer 35 is lower than the density of p-type impurity in the slope portion 31e. Alternatively, the density of p-type impurity in a portion positioned in the narrow portion of the slope portion 35e may be substantially the same as the density of p-type impurity in the main portion 35m, for example.

The p-type impurity may be introduced into a portion of the slope portion 35e in the semiconductor layer 35 which does not overlap the gate electrode G(p) with substantially the same density as that in the slope portion 31e of the semiconductor layer 31. For example, even if the p-type impurity is introduced into a portion of the semiconductor layer which is not positioned in the periphery of the narrow portion 36 with high density, the portion does not operate as the parasitic transistor, so that the TFT characteristics are not affected.

The doping conditions of the semiconductor layers 31 and 35 in this embodiment are not limited to those described above. In this embodiment, it is sufficient that, in the n-type TFT 300, the density of p-type impurity Cn-e at least in the portion of the slope portion 31e of the semiconductor layer 31 which overlaps the gate electrode G(n), i.e. the portion which is capable of operating as the parasitic transistor is higher than the densities of p-type impurity Cn-m and Cp-m of the main portions 31m and 35m. In the p-type TFT 400, it is sufficient that the density of p-type impurity Cp-e at least in a portion of the slope portion 35e of the semiconductor layer 35 which overlaps the gate electrode G(p), i.e. the portion which is capable of operating as the parasitic transistor is lower than the density Cn-e.

Also in this embodiment, similarly to the above-described embodiments, in both of the n-type TFT 300 and the p-type TFT 400, the influence of the characteristics of the slope portions 31e and 35e (the characteristics of the parasitic transistors) on the TFT characteristics can be suppressed. Accordingly, when the gate voltage Vg is zero, both of the TFTs can be easily set in the OFF state. By adjusting the process conditions, the driving voltages of these TFTs can be low.

Next, an example of the production process of the semiconductor device in this embodiment will be described. Similarly to the production method in the first embodiment described above with reference to FIG. 2 to FIG. 7, in the production method in this embodiment, the patterning of the semiconductor layer of the p-type TFT is performed by two etching steps. In the first embodiment, both end portions of the semiconductor layer of the p-type TFT are removed in the second etching step. However, in this embodiment, a narrow portion is formed in the semiconductor layer having a rectangular pattern in the second etching step.

FIG. 15 to FIG. 20 are schematic views for generally illustrating the production method of the semiconductor device in this embodiment. In each figure, (a) is a plan view, and (b) is a cross-sectional view taken along a line A-A' in the plan view of (a). The line A-A' is parallel to the channel width direction. FIG. 15 to FIG. 20 show only a single n-type TFT and a single p-type TFT formed on one and the same substrate. Alternatively, a plurality of these types of TFTs may be formed on one and the same substrate.

First, as shown in (a) and (b) of FIG. 15, on a substrate 101, base films 102 and 103 are formed, and then a crystalline semiconductor film 304 is formed thereon. Next, on the crystalline semiconductor film 304, mask films (resist mask films) 305 and 306 are formed by photolithography. The materials and the forming method of these films may be the same as the materials and the forming method described above with reference to FIG. 7(a). In this embodiment, the mask film 305 has a dog-bone pattern, and the mask film 306 has a rectangular pattern.

Next, as shown in (a) and (b) of FIG. 16, the crystalline semiconductor film 304 is etched in an island-like manner by using the mask films 305 and 306 as a mask. As the result of the etching, a semiconductor layer 307 which will act as an active layer of the n-type TFT and a semiconductor layer 308 which will act as an active layer of the p-type TFT are obtained. The semiconductor layer 307 has a dog-bone pattern, and the semiconductor layer 308 has a rectangular pattern. The width of the region which will act as a channel region in the semiconductor layer 308 is larger than the channel width in the final form of the semiconductor layer of the p-type TFT. Herein the thickness of the semiconductor layers 307 and 308 is 50 nm, for example.

Figure 17:
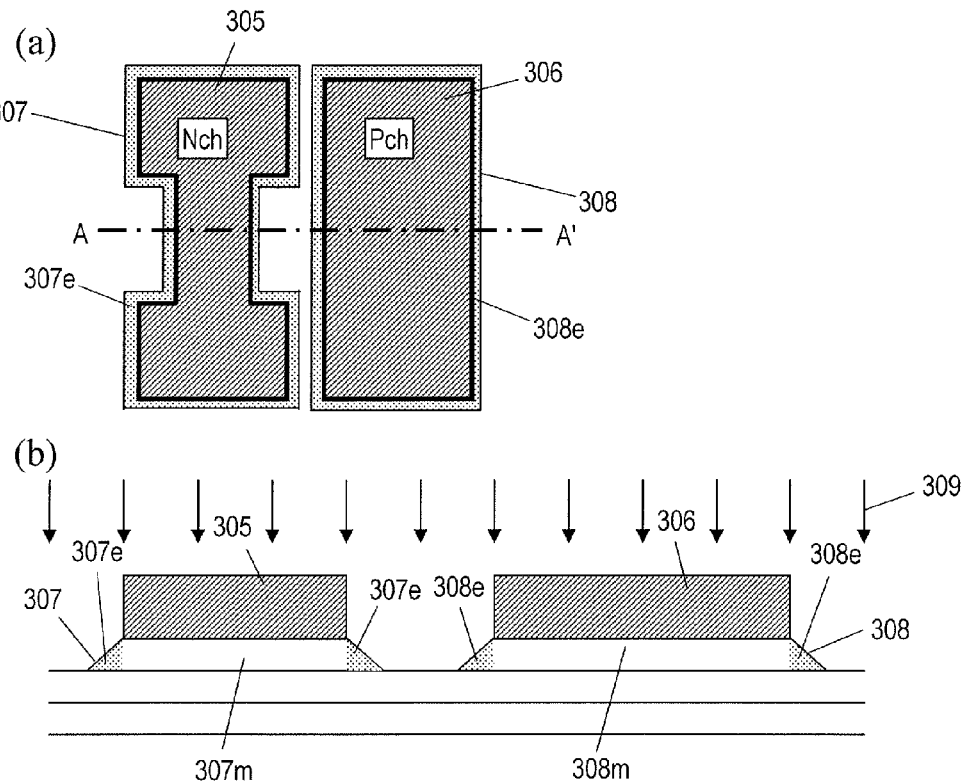
In FIG. 17, (a) and (b) are a plan view and a cross-sectional view, respectively, for generally illustrating the production method of the semiconductor device in the third embodiment of the present invention.

In this condition, as shown in (a) and (b) of FIG. 17, a p-type impurity 309 is doped from above the mask films 305 and 306 with low density. Herein boron is used as the p-type impurity 309. The implanting conditions of boron may be the same as those described above with reference to FIG. 7(*c*), for example. Accordingly, the p-type impurity 309 is implanted into only portions (slope portions) 307*e* and 308*e* of the semiconductor layers 307 and 308 which are not covered with the mask films 305 and 306. The p-type impurity 309 is not implanted into portions (main portions) 307*m* and 308*m* of the semiconductor layers 307 and 308 which are covered with the mask films 305 and 306.

Figure 18:
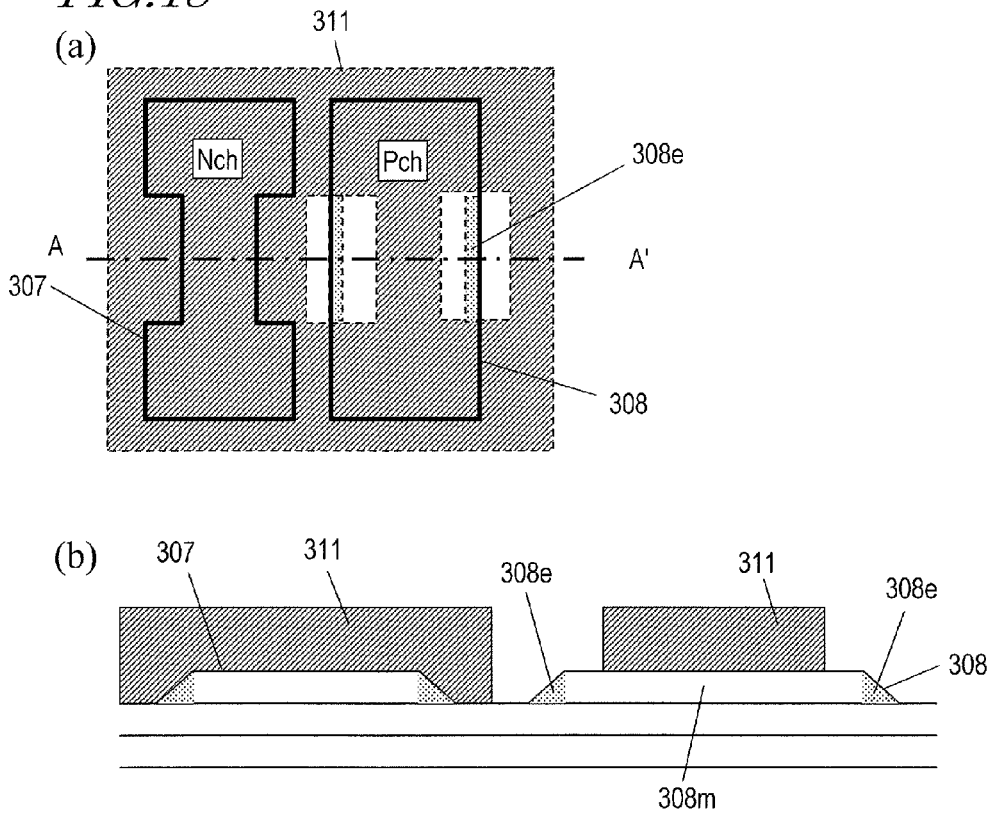
In FIG. 18, (a) and (b) are a plan view and a cross-sectional view, respectively, for generally illustrating the production method of the semiconductor device in the third embodiment of the present invention.

Next, as shown in (a) and (b) of FIG. 18, after the mask films 305 and 306 are removed, a mask film 311 is newly formed on the semiconductor layers 307 and 308. The entire of the semiconductor layer 307 is covered with the mask film 311. Only a portion of the semiconductor layer 308 positioned in the periphery of a region which will act as a channel region is exposed from the mask film 311. It is noted that the pattern of the mask film 311 is not specifically limited. It is sufficient that the mask film 311 is disposed so as to expose a portion of a slope portion 308*e* of the semiconductor layer 308 which is capable of operating as a parasitic transistor and a portion of a main portion 308*m* positioned in the vicinity of the portion which is capable of operating as a parasitic transistor.

Figure 19:
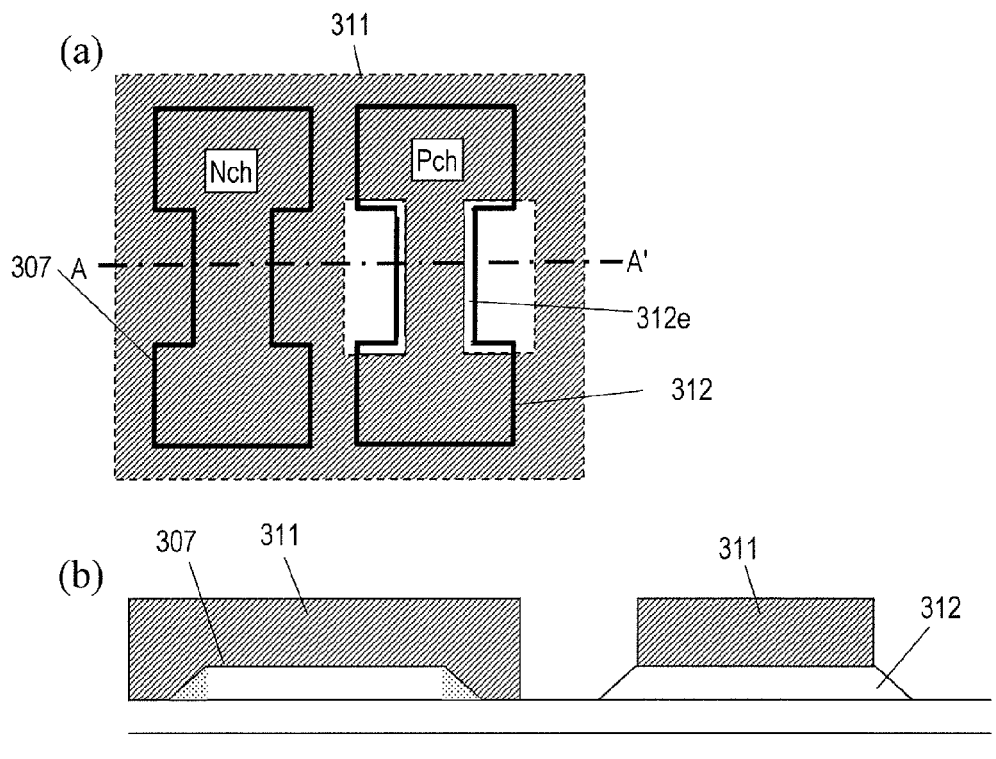
In FIG. 19, (a) and (b) are a plan view and a cross-sectional view, respectively, for generally illustrating the production method of the semiconductor device in the third embodiment of the present invention.
Figure 20:
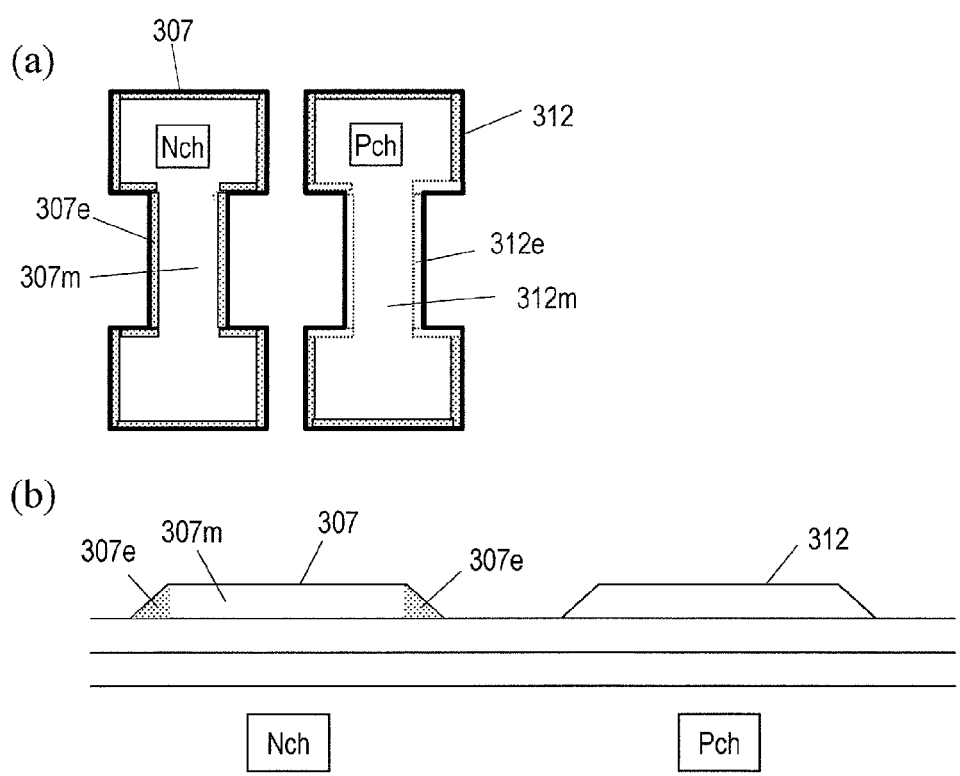
In FIG. 20, (a) and (b) are a plan view and a cross-sectional view, respectively, for generally illustrating the production method of the semiconductor device in the third embodiment of the present invention.

Thereafter, as shown in (a) and (b) of FIG. 19, the etching of the semiconductor layer 308 is performed by using the mask film 311 as a mask. As the result of the etching, a semiconductor layer 312 which will act as an active layer of the p-type TFT. By the etching, in the semiconductor layer 308, a part of the slope portion 308*e* into which the p-type impurity is implanted (at least a portion which is capable of operating as a parasitic transistor) is removed, thereby forming a narrow portion. Accordingly, the obtained semiconductor layer 312 has a dog-bone pattern.

Also in this embodiment, the etching of the semiconductor layer 308 is performed by RIE (Reactive Ion Etching) by using $CF_4$ gas and oxygen as etching gases, for example. In the etching step, etching selectivity can be ensured between the semiconductor layer (the Si layer) 308 and a silicon oxide layer of the base film 103, so that it is possible to prevent a portion of the base film 103 which is not covered with the semiconductor layer 308 or the mask film 311 from being dug.

Next, the mask film 311 is removed. In this way, as shown in (a) and (b) of FIG. 20, the semiconductor layers 307 and 312 in which the doping conditions in the slope portions are different can be obtained. In the semiconductor layer 307, a p-type impurity is introduced into the entire of the slope portion 307*e* with higher density than the main portion 307*m* and the semiconductor layer 312. In the semiconductor layer 312, the density of p-type impurity in a portion positioned in the narrow portion of the slope portion 312*e* is substantially equal to the density of p-type impurity of the main portion 312*m*. In addition, the p-type impurity is introduced into a portion of the slope portion 312*e* other than the narrow portion with higher density than the main portion 307*m* and the semiconductor layer 312. In the condition shown in the figure, the density of p-type impurity in the portion of the slope portion 312*e* other than the narrow portion is substantially equal to the density of p-type impurity in the slope portion 307*e* of the semiconductor layer 307. Alternatively, after the process step, the p-type impurity may be further introduced into the entire of the semiconductor layer 307, so as to adjust the threshold voltage.

Thereafter, although not shown in the figure, the n-type and p-type TFTs are completed by the same method as that described above with reference to FIG. 7(*g*).

According to this embodiment, the same effects as those in the above-described embodiments can be attained. That is, as described above with reference to FIG. 8, in the voltage-current characteristics in both of the n-type TFT and the p-type TFT, a bump at the rising of the ON-current can be eliminated. As a result, the OFF state of the TFT can be maintained when the gate voltage Vg is 0 V, and also the threshold voltage Vth can be low.

According to the production method of this embodiment, the patterning of the semiconductor film is performed in two separate steps, thereby making the doping conditions of the slope portions in the semiconductor layers different between the n-type TFT and the p-type TFT. Accordingly, without complicating the production process, it is possible to individually produce the semiconductor layers for the n-type TFT and the p-type TFT.

In addition, similarly to the first embodiment, as compared with the method described in Patent Document No. 1, for example, the gate insulating film 117 can be made thinner, so that the threshold voltage Vth can be effectively reduced. The preferred range of the thickness of the gate insulating film 117 is the same as the range described in the first embodiment.

When this embodiment is applied, the driving voltage can be lowered, while the reliability of the semiconductor device is ensured.

In addition, this embodiment has a merit that the devices can be efficiently integrated as compared with the first embodiment. Accordingly, it is possible to reduce the circuit area. The reason will be described with reference to the drawings.

Figure 22:
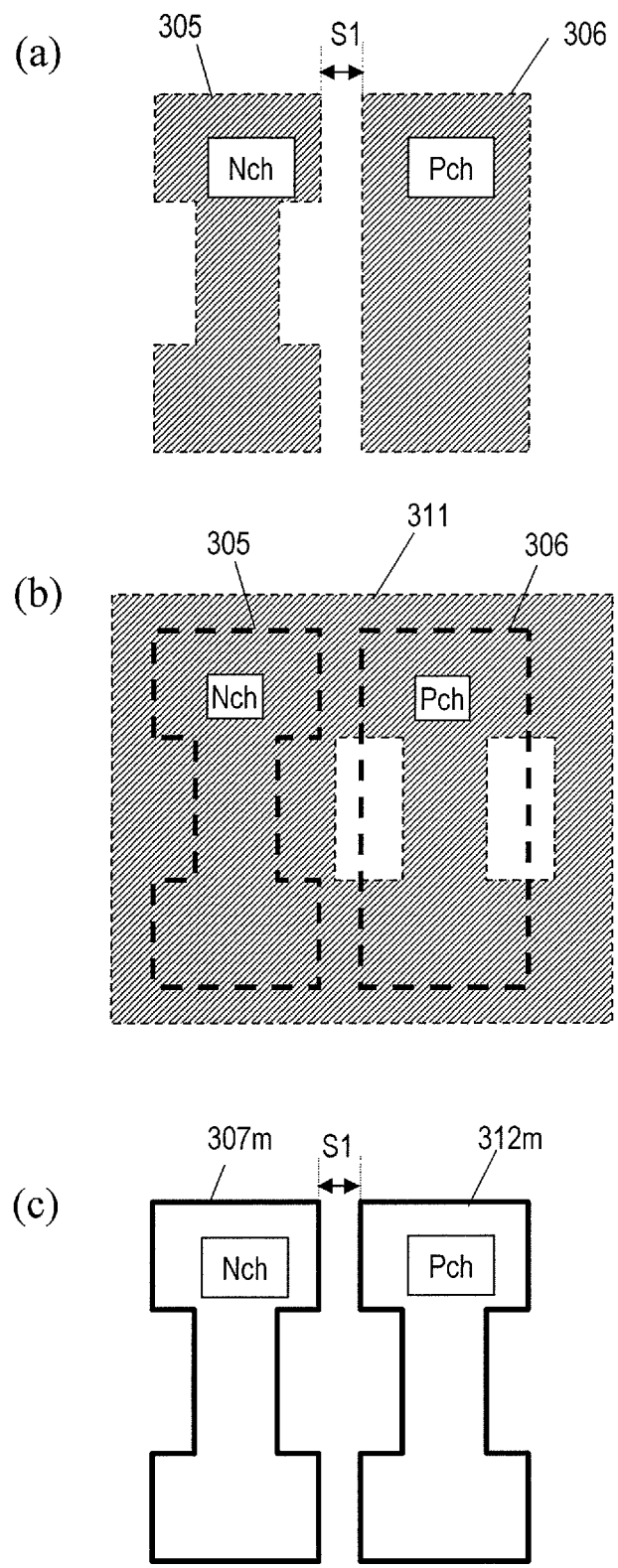
In FIG. 22, (a) to (c) are plan views, respectively, for illustrating a space between a mask film and a semiconductor layer in the production process of the semiconductor device in the third embodiment.

In FIG. 21, (*a*) to (*c*) are plan views showing the production process of the semiconductor device in the first embodiment, respectively. In FIG. 22, (*a*) to (*c*) are plan views showing the production process of the semiconductor device in this embodiment, respectively.

In the first embodiment, as shown in FIG. 21(*a*), the mask film 13 and the mask film 14 are disposed adjacently. At this time, the space between the mask film 13 and the mask film 14 (the minimum space width between resists) S1 is determined by the performance of exposure equipment. The space S1 is designed in such a manner that it is equal to or larger than the minimum line width of the exposure equipment. In order to reduce the circuit area, the space S1 is desirably equal to the minimum line width. In the case where a general stepper of 3 μm is employed, the space S1 is 3 μm.

Thereafter, as shown in FIG. 21(*b*), the mask films 13 and 14 are removed, and new mask films 18 and 19 are formed. At this time, a space S2 between the mask film 18 and the mask film 19 is designed to be equal to or larger than the minimum line width of the exposure equipment (e.g. 3 μm).

As a result, as shown in FIG. 21(*c*), a space S3 between the main portion 11*m* of the semiconductor layer in the n-type TFT and the main portion 20*m* of the semiconductor layer in the p-type TFT is equal to or larger than 4.5 μm, for example.

On the other hand, in the present embodiment, as shown in FIG. 22(*a*), the mask film 305 having the dog-bone pattern and the mask film 306 having the rectangular pattern are disposed adjacently. The space S1 between the mask film 305 and the mask film 306 is designed to be equal to or larger than the minimum line width of exposure equipment (3 μm).

Thereafter, as shown in FIG. 22(*b*), the mask films 305 and 306 are removed, and a new mask film 311 is formed. In this embodiment, only an opening portion is provided in the mask film 311. Thus, the mask film 311 can be designed without being restricted by the minimum line width of exposure equipment.

As a result, as shown in FIG. 22(c), the space between the main portion 307m of the n-type TFT and the main portion 312m of the p-type TFT is maintained to be S1 (e.g. 3 μm). Accordingly, the space between elements can be reduced, so that the reduction of space between elements, the reduction of circuit area, and high integration can be achieved.

The semiconductor device in this embodiment is suitably applied to a display device provided with a memory circuit (image memory) for storing display data in each pixel, and the power consumption of the display device can be further reduced, similarly to the semiconductor device in the first embodiment. In addition, for the purpose of high definition of the image, it is required to further reduce the area of a memory circuit in one pixel. Therefore, if this embodiment is applied, the space between semiconductor layers in adjacent TFTs can be narrower, so that the area of the memory circuit can be effectively reduced.

Fourth Embodiment

A semiconductor device in a fourth embodiment of the present invention will be described. The semiconductor device in this embodiment has the same configuration as that of the semiconductor device in the third embodiment described above with reference to FIG. 14. Also in this embodiment, the p-type impurity is introduced into at least the portion of the slope portion of the semiconductor layer of the n-type TFT which is capable of operating as the parasitic transistor with higher density than the main portion of the n-type TFT and the main portion of the p-type TFT.

However, this embodiment and the third embodiment are different in the production method. Specifically, in the third embodiment, the patterning of the semiconductor layer of the p-type TFT is performed by two etching steps. In this embodiment, the patterning of the semiconductor layer of the n-type TFT is performed by two etching steps. Accordingly, the doping conditions of the p-type impurity in the slope portions of the respective TFTs are different from those in the semiconductor device of the third embodiment.

Hereinafter, an example of the production method of the semiconductor device in this embodiment will be described. Similarly to the production method in the second embodiment described above with reference to FIG. 9 to FIG. 13, in the production method of this embodiment, the patterning of the semiconductor layer in the n-type TFT is performed by two etching steps. However, in the second embodiment, both end portions of the semiconductor layer of the n-type TFT are removed in the second etching step. However, in this embodiment, a narrow portion is formed in the semiconductor layer having the rectangular pattern in the second etching step.

FIG. 23 to FIG. 28 are schematic views for generally illustrating the production method of the semiconductor device in this embodiment. In the respective figures, (a) is a plan view, and (b) is a cross-sectional view taken along a line A-A' shown in the plan view of (a). The line A-A' is parallel to the channel width direction. In FIG. 23 to FIG. 28, only a single n-type TFT and a single p-type TFT formed on one and the same substrate are shown, but alternatively a plurality of these types of TFTs may be formed on one and the same substrate.

Figure 23:
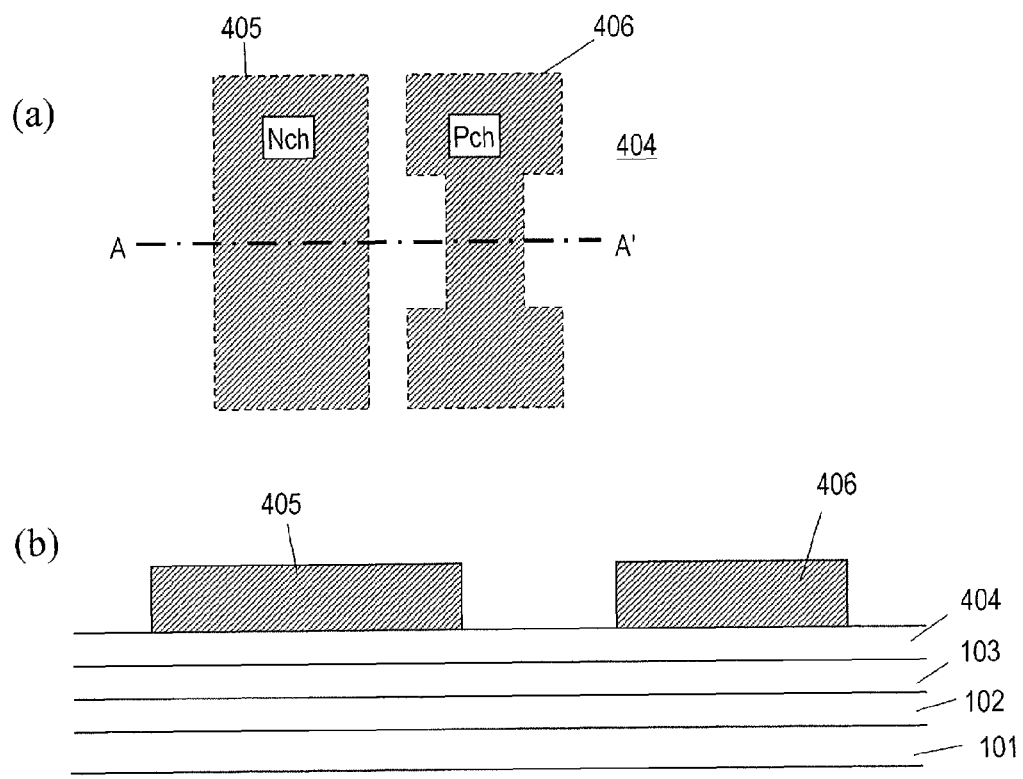
FIG. 23 is a schematic diagram for generally illustrating the production method of a semiconductor device in a fourth embodiment of the present invention, in which (a) is a plan view and (b) is a cross-sectional view taken along line A-A' shown in the plan view of (a).

First, as shown in (a) and (b) in FIG. 23, base films 102 and 103 are formed on the substrate 101, and then a crystalline semiconductor film 404 is formed thereon. Next, on the crystalline semiconductor film 404, mask films (resist mask films) 405 and 406 are formed by photolithography. The materials and the forming methods of these films may be similar to the materials and the forming methods described above with reference to FIG. 7(a). In this embodiment, the mask film 406 has a dog-bone pattern, and the mask film 405 has a rectangular pattern.

Figure 24:
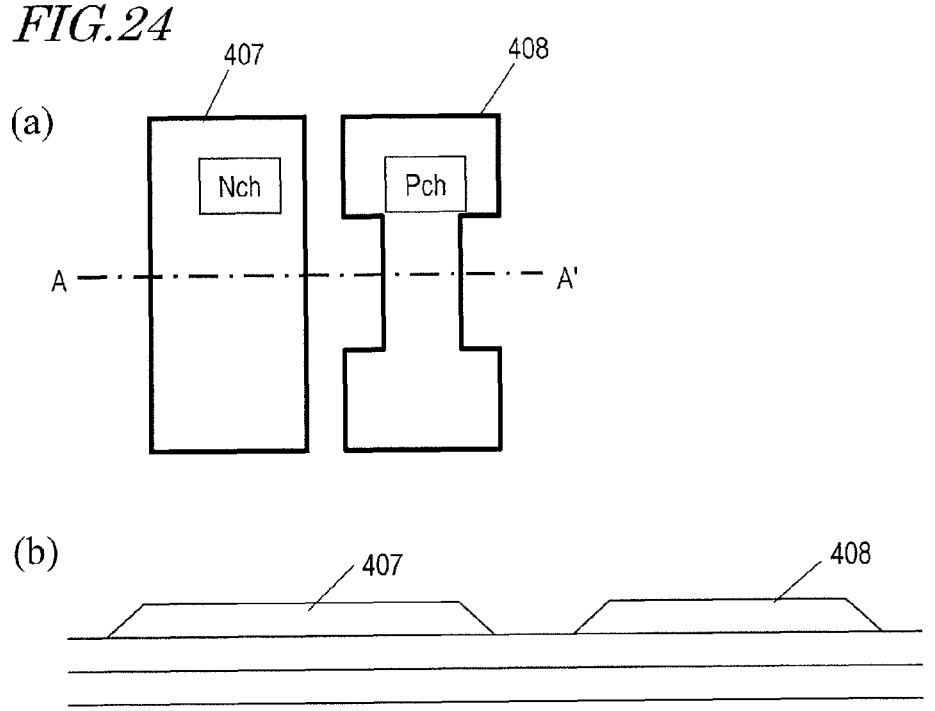
In FIG. 24, (a) and (b) are a plan view and a cross-sectional view, respectively, for generally illustrating the production method of the semiconductor device in the fourth embodiment of the present invention.

Then, as shown in (a) and (b) of FIG. 24, the crystalline semiconductor film 404 is etched in an island-like manner by using the mask films 405 and 406 as a mask. As the result of the etching, a semiconductor layer 407 which will act as an active layer of the n-type TFT, and a semiconductor layer 408 which will act as an active layer of the p-type TFT are obtained. Thereafter, the mask films 405 and 406 are removed. The semiconductor layer 408 has a dog-bone pattern, and the semiconductor layer 407 has a rectangular pattern. The width of a region of the semiconductor layer 407 which will act as a channel region is larger than the channel width of the final form of the semiconductor layer of the p-type TFT. Herein the thickness of the semiconductor layers 407 and 408 is 40 nm, for example.

Figure 25:
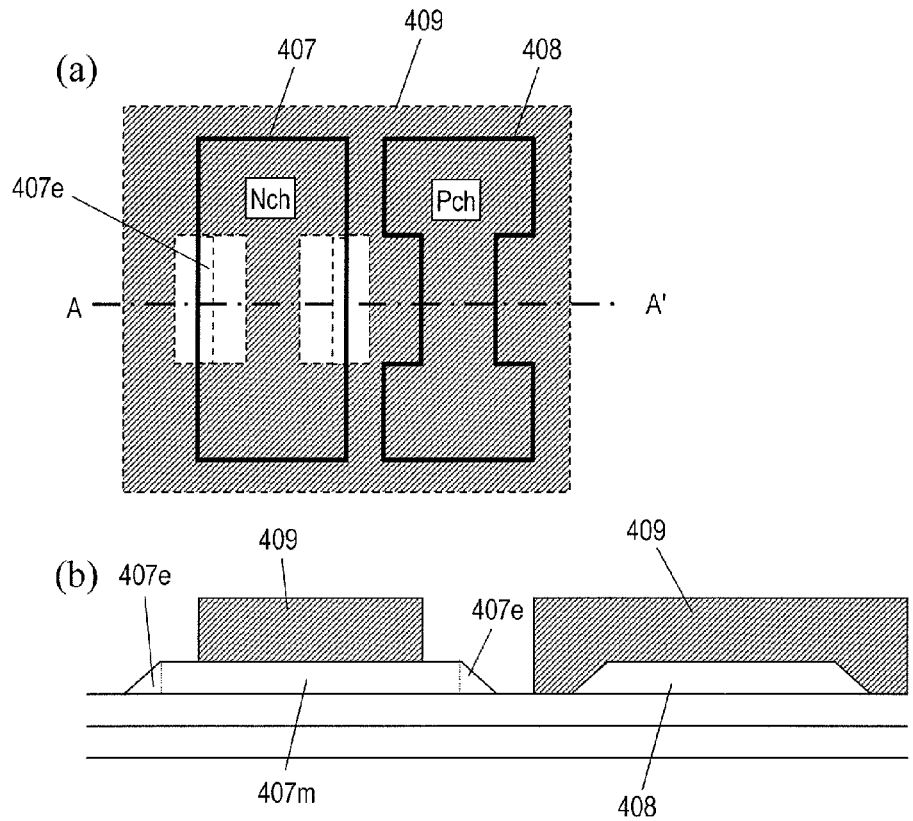
In FIG. 25, (a) and (b) are a plan view and a cross-sectional view, respectively, for generally illustrating the production method of the semiconductor device in the fourth embodiment of the present invention.

Next, as shown in (a) and (b) of FIG. 25, a mask film 409 is newly formed on the semiconductor layers 407 and 408. The entire of the semiconductor layer 408 is covered with the mask film 409. Only a portion of the semiconductor layer 407 positioned in the periphery of the region which will act as the channel region is exposed from the mask film 409. The patter of the mask film 409 is not specifically limited. It is sufficient that the mask film 409 is disposed in such a manner that only the portion of a slope portion 407e of the semiconductor layer 407 which is capable of operating as a parasitic transistor, and a portion of a main portion 407m positioned in the vicinity of the above-mentioned portion are exposed.

Figure 26:
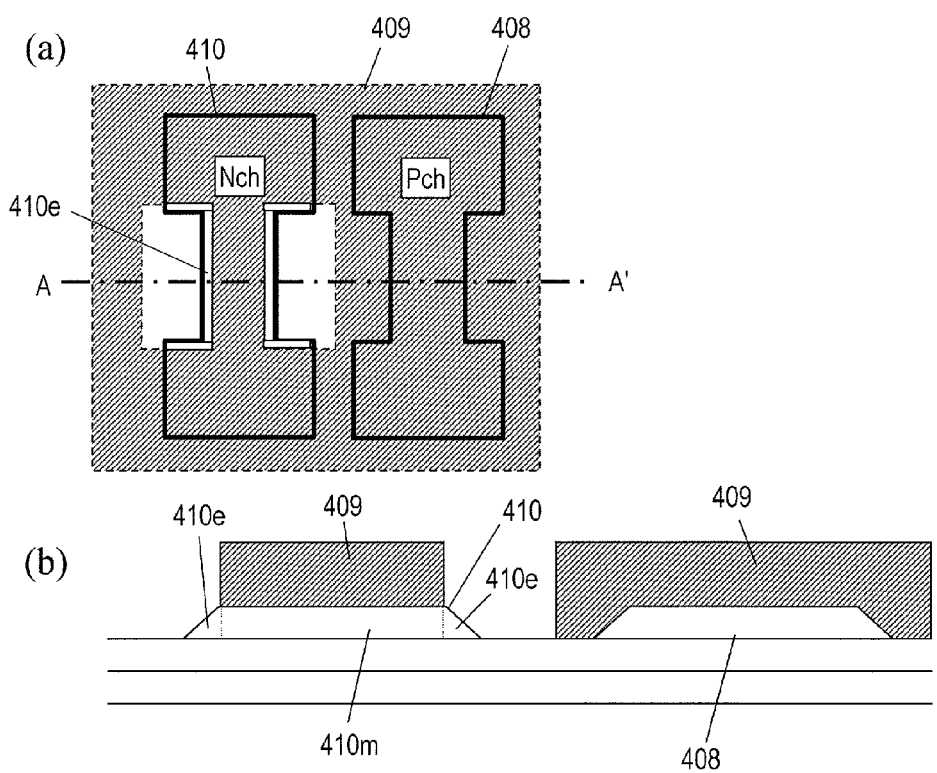
In FIG. 26, (a) and (b) are a plan view and a cross-sectional view, respectively, for generally illustrating the production method of the semiconductor device in the fourth embodiment of the present invention.

Thereafter, as shown in (a) and (b) of FIG. 26, the etching of the semiconductor layer 407 is performed by using the mask film 409 as a mask. As the result of the etching, a semiconductor layer 410 which will act as an active layer of the n-type TFT is obtained. By the etching, a part of the slope portion 407e of the semiconductor layer 407 is removed, thereby forming a narrow portion. The obtained semiconductor layer 410 has a dog-bone pattern.

Also in this embodiment, for example, the etching of the semiconductor layer 407 is performed by RIE (Reactive Ion Etching) utilizing $CF_4$ gas and oxygen as etching gases. In the etching step, etching selectivity can be ensured between the semiconductor layer (the Si layer) 407 and the silicon oxide layer of the base film 103, so that it is possible to prevent a portion of the base film 103 which is not covered with the semiconductor layer 407 or the mask film 409 from being dug.

Figure 27:
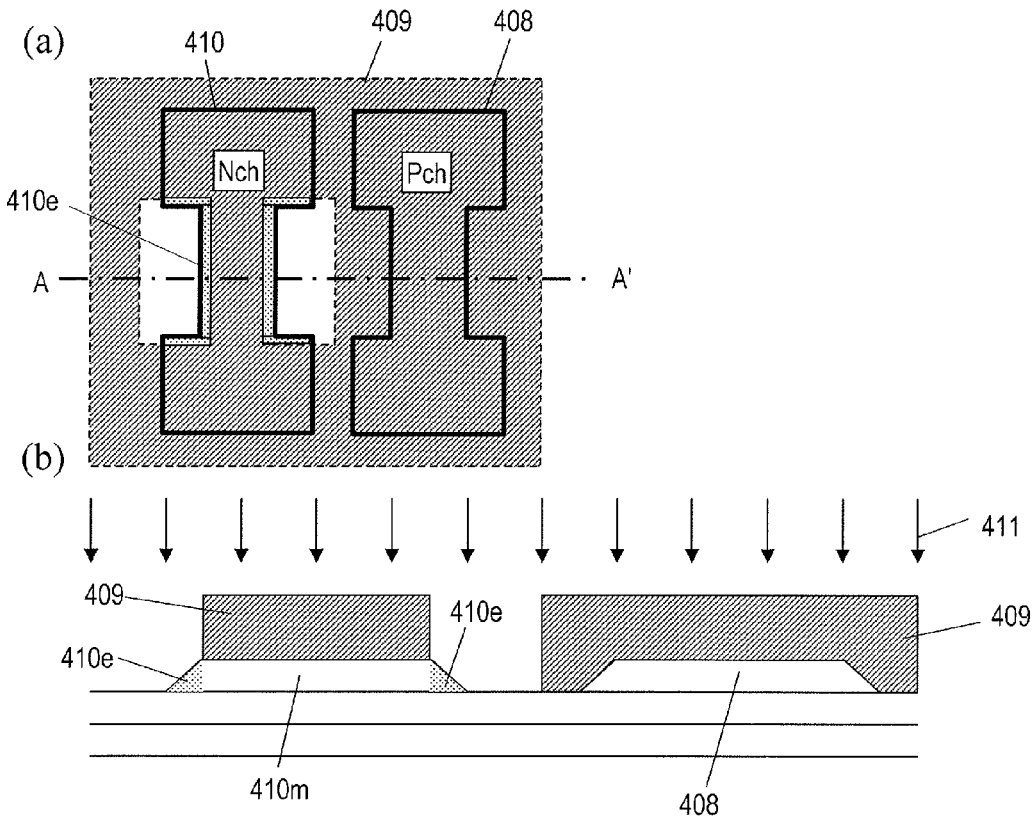
In FIG. 27, (a) and (b) are a plan view and a cross-sectional view, respectively, for generally illustrating the production method of the semiconductor device in the fourth embodiment of the present invention.
Figure 28:
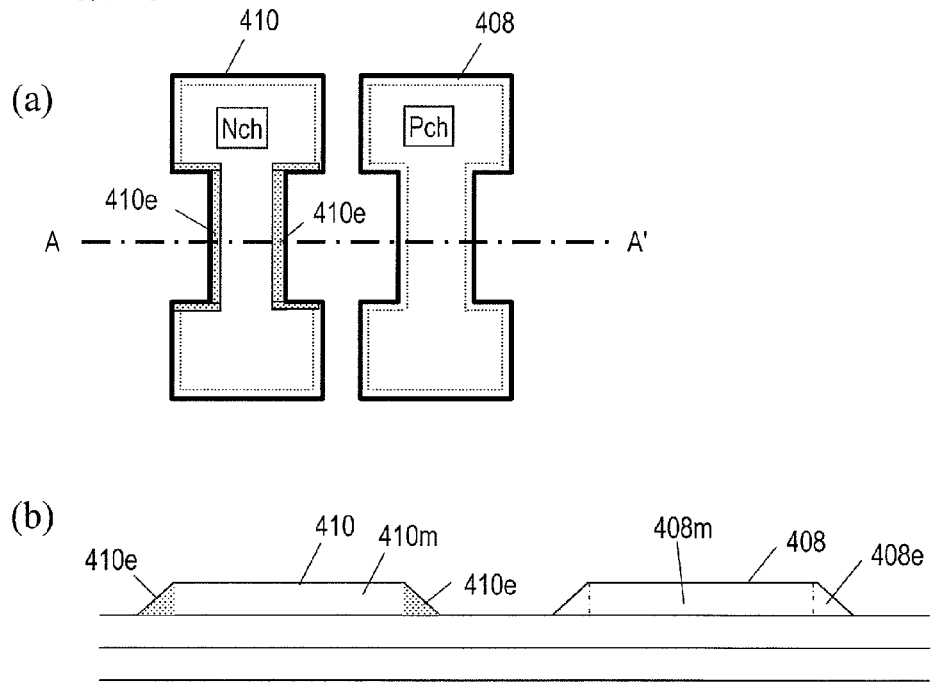
In FIG. 28, (a) and (b) are a plan view and a cross-sectional view, respectively, for generally illustrating the production method of the semiconductor device in the fourth embodiment of the present invention.

In this condition, as shown in (a) and (b) of FIG. 27, a p-type impurity 411 is doped with low density from above the mask film 409. Herein boron is used as the p-type impurity 411. The implanting conditions of boron may be the same as the conditions described above with reference to FIG. 7(c), for example. Accordingly, the p-type impurity 411 is implanted into only the portion of the semiconductor layer 410 exposed from the mask film 409, i.e. the portion of the slope portion 410e of the semiconductor layer 410 positioned in the periphery of the narrow portion. The p-type impurity 411 is not implanted into the portion (the main portion) 410m of the semiconductor layer 410 covered with the mask film 409 or into the entire of the semiconductor layer 408.

Then, the mask film 409 is removed. In this way, as shown in (a) and (b) of FIG. 28, the semiconductor layers 410 and 408 in which the doping conditions in the slope portions are different can be obtained. In this embodiment, in the semiconductor layer 410, the p-type impurity is introduced into the portion of the slope portion 410e positioned in the narrow portion with higher density than the main portion 410m and the main portion 408m. The density of p-type impurity in the portion of the slope portion 410e in the position other than the narrow portion is substantially equal to the density of p-type impurity in the main portion 410m of the semiconductor layer 410. On the other hand, in the semiconductor layer 408, the density of p-type impurity of the slope portion 408e and the density of p-type impurity of the main portion 408m are substantially equal. In this embodiment, after the process step, the p-type impurity may be further introduced into only the semiconductor layer 410, so as to control the threshold voltage.

Thereafter, although not shown in the figure, the n-type TFT and the p-type TFT are completed by the same method as that described above with reference to FIG. 7(g).

According to this embodiment, the same effects as those in the above-described embodiments can be attained. That is, as described above with reference to FIG. 8, in the voltage-current characteristics in both of the n-type and p-type TFTs, a bump at the rising of the ON-current can be eliminated. As a result, the OFF state of the TFT can be maintained when the gate voltage Vg is 0 V, and also the threshold voltage Vth can be low.

According to the production method of this embodiment, the patterning of the semiconductor film is performed in two separate steps, thereby making the doping conditions of the slope portions in the semiconductor layers different between the n-type TFT and the p-type TFT. Accordingly, without complicating the production process, it is possible to individually produce the semiconductor layers for the n-type TFT and the p-type TFT.

In addition, similarly to the first embodiment, as compared with the method described in Patent Document No. 1, for example, the gate insulating film 117 can be made thinner, so that the threshold voltage Vth can be effectively reduced. The preferred range of the thickness of the gate insulating film 117 is the same as the range described in the first embodiment.

When this embodiment is applied, the driving voltage can be lowered, while the reliability of the semiconductor device is ensured.

In addition, this embodiment has a merit that the devices can be efficiently integrated as compared with the second embodiment. Accordingly, it is possible to reduce the circuit area. The reason will be described with reference to the drawings.

Figure 29:
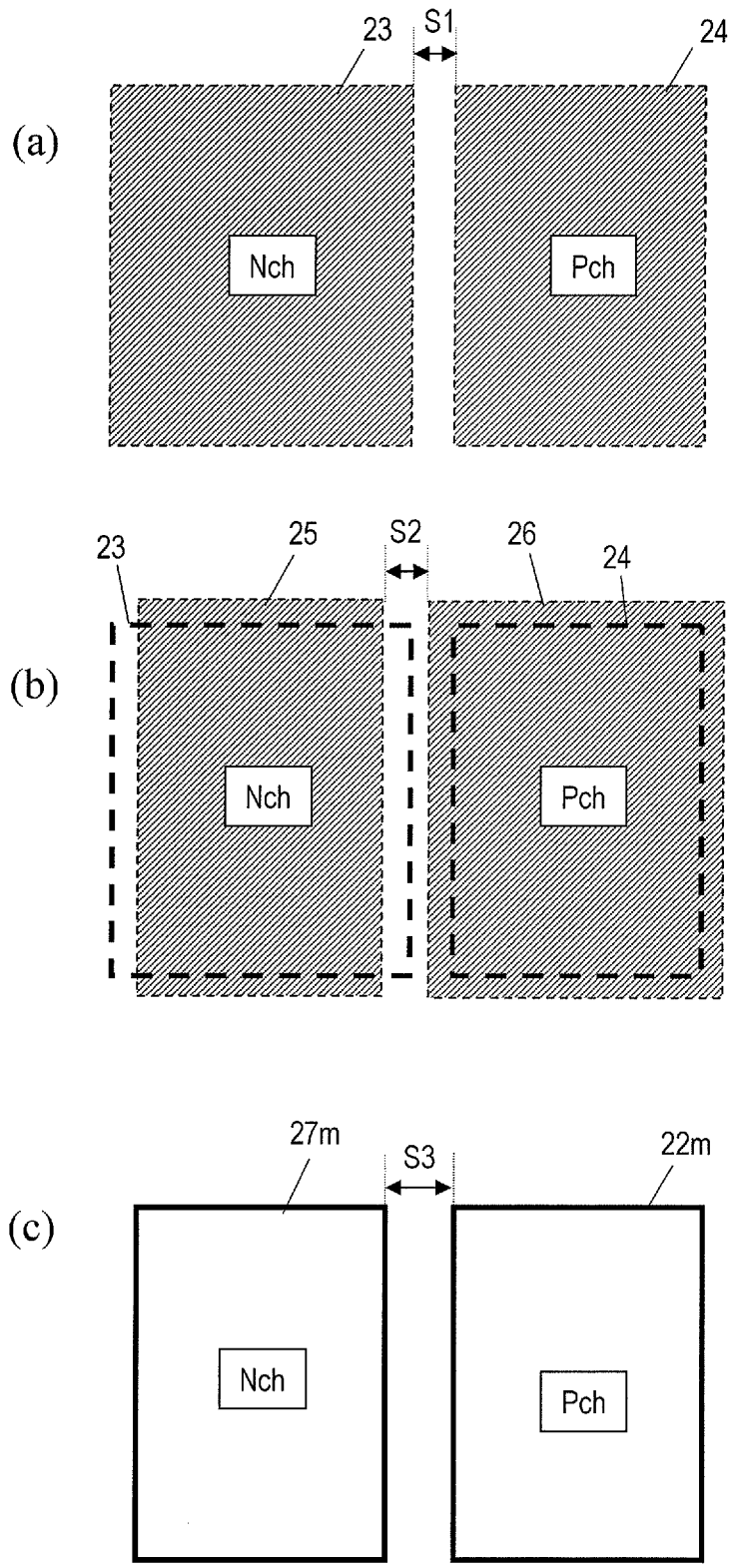
In FIG. 29, (a) to (c) are plan views, respectively, for illustrating a space between a mask film and a semiconductor layer in the production process of the semiconductor device in the second embodiment.

In FIG. 29, (a) to (c) are plan views showing the production process of the semiconductor device in the second embodiment, respectively. In FIG. 30, (a) to (c) are plan views showing the production process of the semiconductor device in this embodiment, respectively.

In the second embodiment, as shown in FIG. 29(a), the mask film 23 and the mask film 24 are disposed adjacently. At this time, the space between the mask film 23 and the mask film 24 (the minimum space width between resists) S1 is determined by the performance of exposure equipment. The space S1 is designed in such a manner that it is equal to or larger than the minimum line width of the exposure equipment. In order to reduce the circuit area, the space S1 is desirably equal to the minimum line width. In the case where a general stepper of 3 μm is employed, the space S1 is 3 μm.

Thereafter, as shown in FIG. 29(b), the mask films 23 and 24 are removed, and new mask films 25 and 26 are formed. At this time, a space S2 between the mask film 25 and the mask film 26 is designed to be equal to or larger than the minimum line width of the exposure equipment (e.g. 3 μm).

As a result, as shown in FIG. 29(c), a space S3 between the main portion 27m of the semiconductor layer in the n-type TFT and the main portion 22m of the semiconductor layer in the p-type TFT is equal to or larger than 4.5 μm, for example.

On the other hand, in this embodiment, as shown in FIG. 30(a), the mask film 405 having the dog-bone pattern and the mask film 406 having the rectangular pattern are disposed adjacently. The space S1 between the mask film 405 and the mask film 406 is designed to be equal to or larger than the minimum line width of exposure equipment (3 μm).

Thereafter, as shown in FIG. 30(b), the mask films 405 and 406 are removed, and a new mask film 409 is formed. In this embodiment, only an opening portion is provided in the mask film 409. Thus, the mask film 409 can be designed without being restricted by the minimum line width of exposure equipment.

As a result, as shown in FIG. 30(c), the space between the main portion 410m of the semiconductor layer of the n-type TFT and the main portion 408m of the semiconductor layer of the p-type TFT is maintained to be S1 (e.g. 3 μm). Accordingly, the space between elements can be reduced, so that the reduction of space between elements, the reduction of circuit area, and high integration can be achieved.

The semiconductor device in this embodiment is suitably applied to a display device provided with a memory circuit (image memory) for storing display data in each pixel, and the power consumption of the display device can be further reduced, similarly to the semiconductor device in the second embodiment. In addition, for the purpose of high definition of the image, it is required to further reduce the area of a memory circuit in one pixel. Therefore, if this embodiment is applied, the space between semiconductor layers in adjacent TFTs can be narrower, so that the area of the memory circuit can be effectively reduced.

Fifth Embodiment

A semiconductor device in a fifth embodiment of the present invention will be described. The semiconductor device in this embodiment has the same configuration as that of the semiconductor device in the first embodiment described above with reference to FIG. 1. Also in the first embodiment, the p-type impurity is introduced into at least the portion of the slope portion of the n-type TFT which is capable of operating as the parasitic transistor with higher density than the main portion of the p-type TFT.

This embodiment and the first embodiment are different in the production method. Also in this embodiment, the patterning of the semiconductor layer is performed by two etching steps, but the mask used in the second etching step of the semiconductor layer is formed by half exposure by using a gray-tone mask. Accordingly, without greatly increasing the number of production process steps, the p-type impurity can be selectively doped (channel doped) into the channel region of the n-type TFT. As a result, the threshold voltages Vth of the p-type TFT and the n-type TFT are individually controlled, so that the circuit characteristics can be further stabilized.

Hereinafter the production method of the semiconductor device in this embodiment will be generally described.

FIG. 31 to FIG. 34A are schematic views for generally illustrating the production method of the semiconductor device in this embodiment. In the respective figures, (a) is a plan view, and (b) is a cross-sectional view taken along a line A-A' shown in the plan view of (a). The line A-A' is parallel to the channel width direction.

Figure 31:
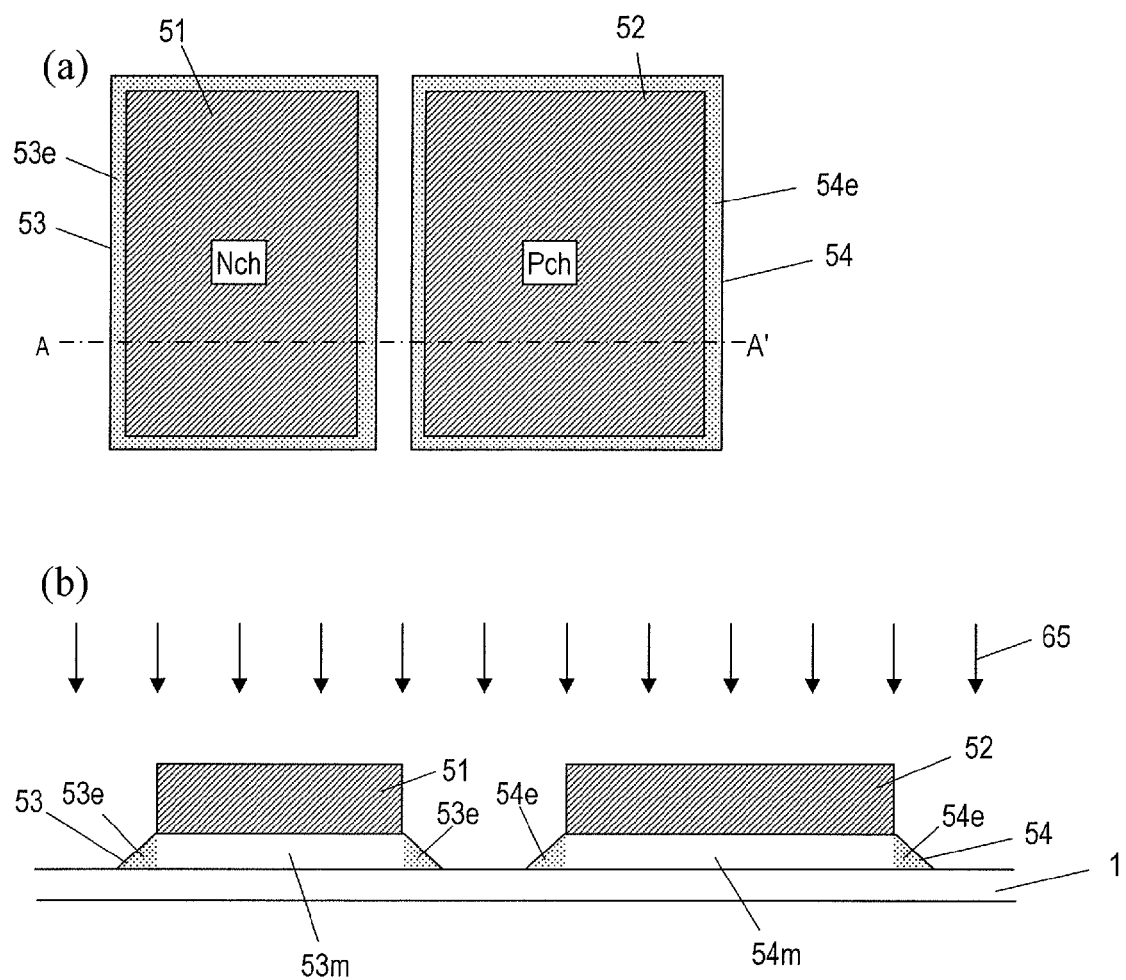
In FIG. 31, (a) and (b) are a plan view and a cross-sectional view, respectively, for generally illustrating the production method of a semiconductor device in a fifth embodiment of the present invention.

First, a semiconductor film is formed on a substrate 1, and mask films (e.g. resist films) 51 and 52 are formed on the semiconductor film. Next, by using the mask films 51 and 52 as a mask, the patterning of the semiconductor film is performed. As the result of the patterning, as shown in (a) and (b)

in FIG. 31, a semiconductor layer 53 which will act as an active layer of the n-type TFT and a semiconductor layer 54 which will act as an active layer of the p-type TFT are obtained on the substrate 1. The semiconductor layers 53 and 54 have main portions 53m and 54m covered with the mask film 51 and the mask film 52, and slope portions 53e and 54e which are positioned in the periphery of the main portions 53m and 54m, and not covered with the mask films 51 and 52, respectively.

At this time, the semiconductor layer 53 is processed to be a pattern as the active layer of the n-type TFT (the final form), but the semiconductor layer 54 is processed to be a pattern which is larger than a pattern as the active layer of the p-type TFT (the final form) at least in a direction perpendicular to the channel (in the channel width direction).

In this condition, from above the mask films 51 and 52, a p-type impurity (e.g. boron) 65 is implanted into the semiconductor layers 53 and 54. Accordingly, the p-type impurity is introduced into only portions (slope portions) 53e and 54e of the semiconductor layers 53 and 54 which are not covered with the mask films 51 and 52. Thereafter, the mask films 51 and 52 are removed.

Figure 32:
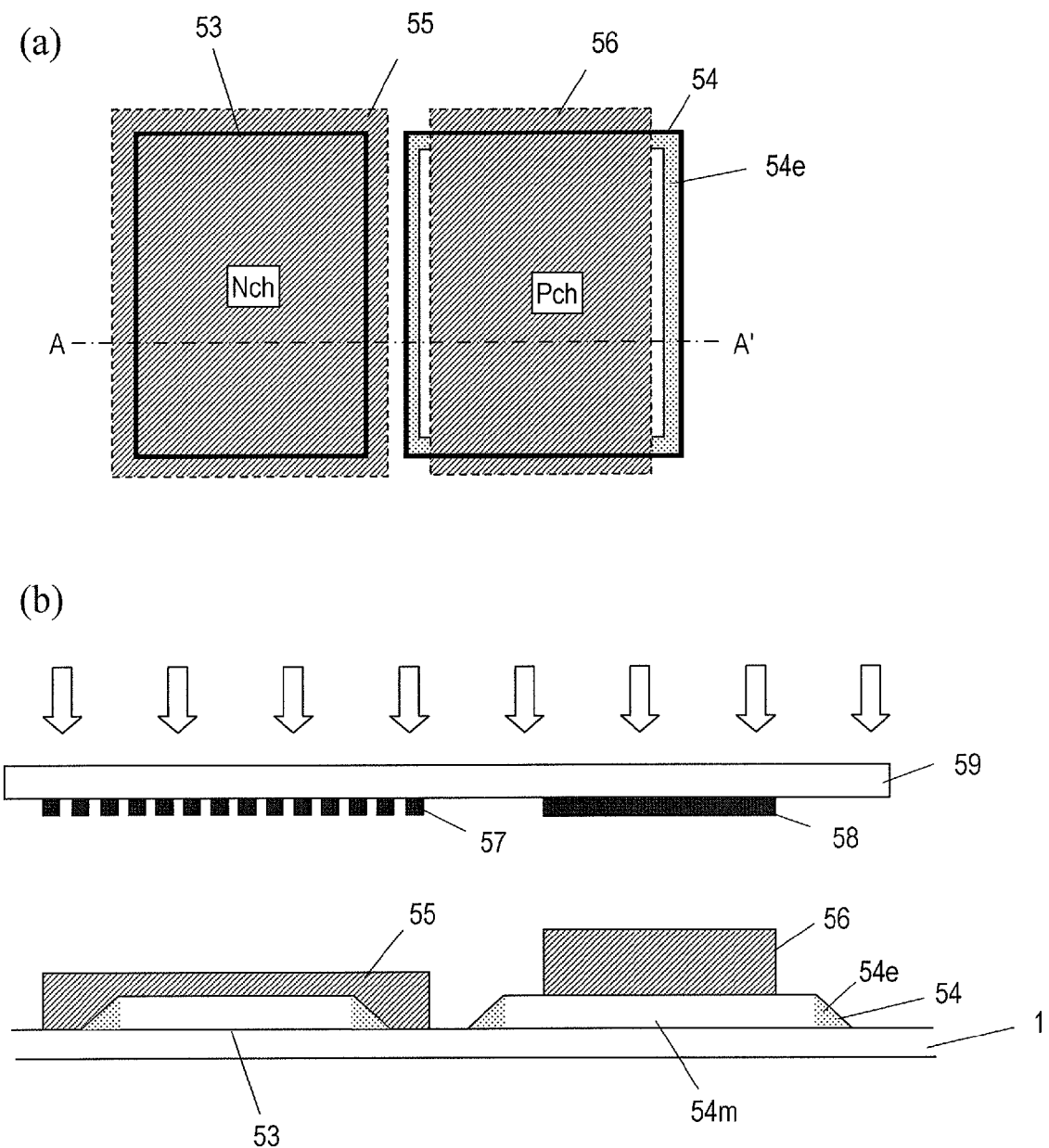
In FIG. 32, (a) and (b) are a plan view and a cross-sectional view, respectively, for generally illustrating the production method of the semiconductor device in the fifth embodiment of the present invention.

Then, a resist film (not shown) is applied on the substrate 1, and as shown in (a) and (b) of FIG. 32, a gray-tone mask 59 having a semi-translucent portion (a gray-tone portion) and a light shielding portion 58 is disposed above the substrate 1. The gray-tone mask 59 is disposed in such a manner that the semi-translucent portion 57 is positioned above the semiconductor layer 53, and the light shielding portion 58 is positioned above the semiconductor layer 54.

Then, the resist film is exposed to light by using the gray-tone mask 59, thereby forming a mask film 55 which covers the entire of the semiconductor layer 53, and a mask film 56 which covers a part of the semiconductor layer 54.

In this embodiment, a portion of the resist film positioned above the semiconductor layer 53 is half exposed, so that the mask film 55 which covers the semiconductor layer 53 is thinner than the mask film 56 formed above the semiconductor layer 54. The mask film 56 is disposed so as to expose a portion of the slope portion 54e of the semiconductor layer 54 extending in the channel direction.

Figure 33:
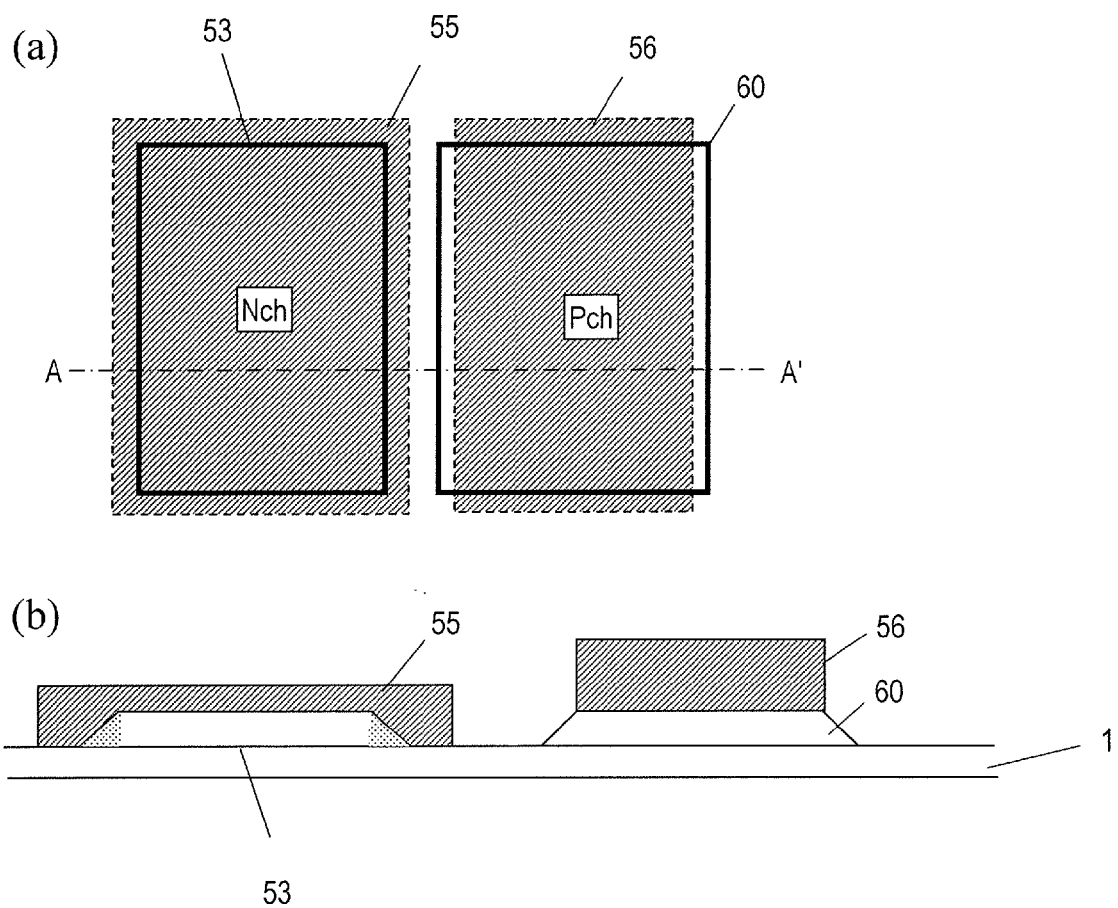
In FIG. 33, (a) and (b) are a plan view and a cross-sectional view, respectively, for generally illustrating the production method of the semiconductor device in the fifth embodiment of the present invention.

Thereafter, as shown in (a) and (b) of FIG. 33, the etching of the semiconductor layer 54 is performed by using the mask films 55 and 56 as masks. As the result of the etching, a portion of the semiconductor layer 54 which is not covered with the mask film 56 is etched. Accordingly, a portion extending in the channel direction of the slope portion 54e into which the p-type impurity is implanted is etched, so as to form a new slope portion. In this way, it is possible to obtain a semiconductor layer 60 which is processed so as to have the final form.

Figure 34A:
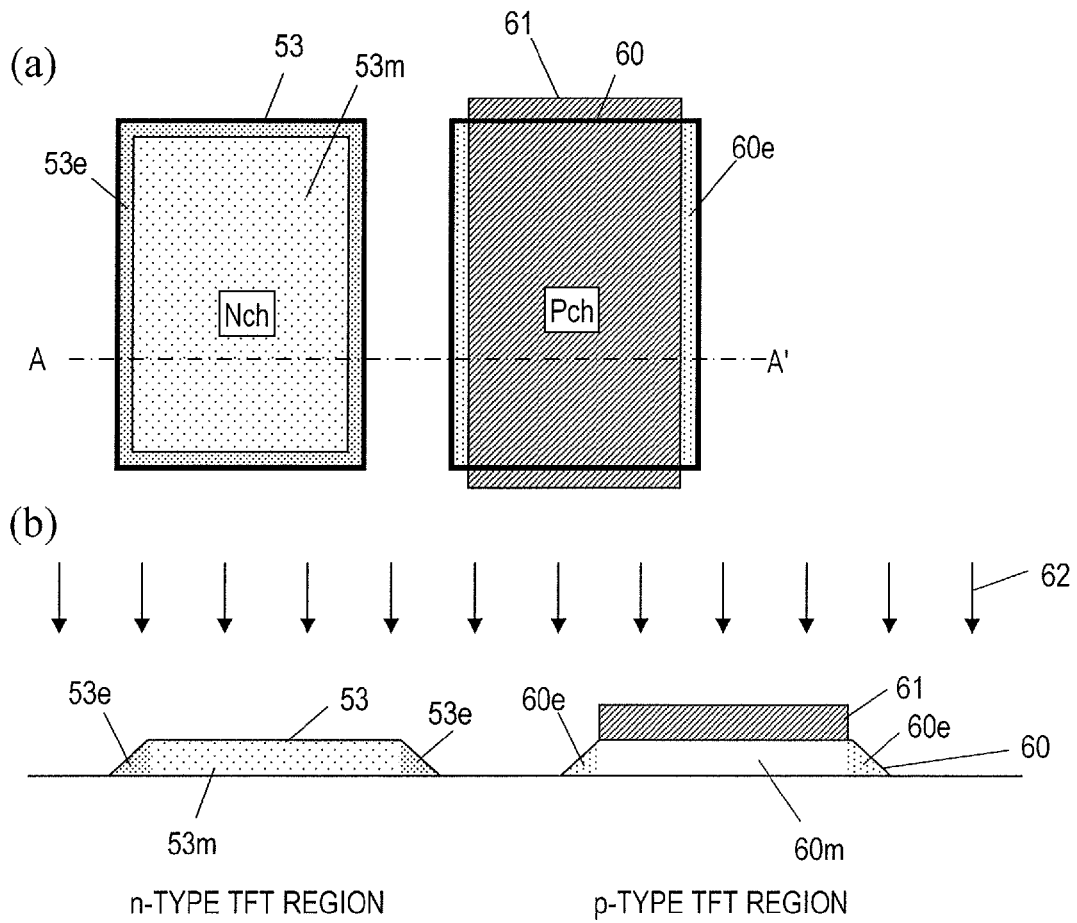
In FIG. 34A, (a) and (b) are a plan view and a cross-sectional view, respectively, for generally illustrating the production method of the semiconductor device in the fifth embodiment of the present invention.

Next, as shown in (a) and (b) of FIG. 34A, the resist of the mask films 55 and 56 is shaved off by ashing, so as to remove the mask film 55. On the other hand, the mask film 56 which is thicker than the mask film 55 is made thinner by ashing, and left as a mask film 61. In this condition, the p-type impurity (boron) 62 is doped with low density into the semiconductor layers 53 and 60 from above the mask film 61.

Accordingly, the p-type impurity 62 is implanted into only the main portion 53m and the slope portion 53e of the semiconductor layer 53 in the n-type TFT. Therefore, the threshold voltage Vth of the n-type TFT can be selectively controlled separately from the p-type TFT. Into the slope portion 53e, the p-type impurity is implanted with low density twice in the doping step shown in FIG. 32 and this doping step, so that the density of p-type impurity is further increased. On the other hand, the p-type impurity is also implanted into a portion of the semiconductor layer 60 in the p-type TFT which is not covered with the ask film 61 (the slope portion 60e). However, the density of p-type impurity of the slope portion 60e is lower than the density of p-type impurity in the slope portion 53e of the n-type TFT, so that it is not important in the operation of TFT. That is, the voltage-current characteristics of the slope portion 60e are not actualized to such a degree that they affect the characteristics of the p-type TFT.

Figure 34B:
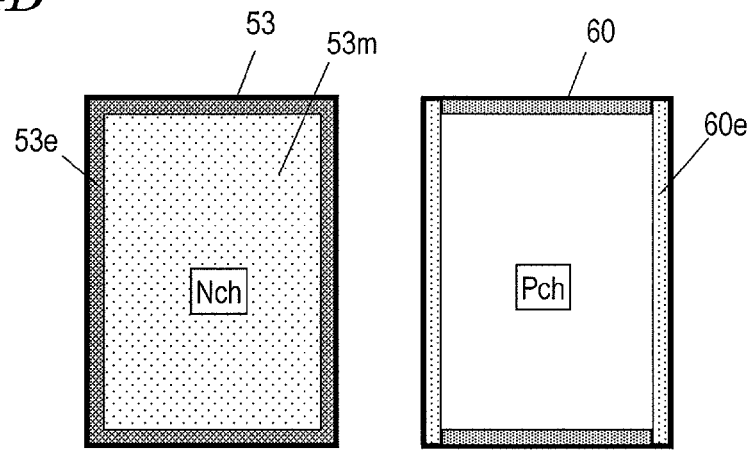
FIG. 34B is a plan view showing a semiconductor layer obtained by the production method of the semiconductor device in the fifth embodiment of the present invention.

Thereafter, the mask film 61 is removed. The thus-obtained semiconductor layers 53 and 60 are shown in FIG. 34B.

Thereafter, by the same method as that described above with reference to FIG. 7(g), for example, the n-type TFT and the p-type TFT are completed, respectively, by using the semiconductor layers 53 and 60.

According to this embodiment, the magnitude correlation of the densities of p-type impurity in the semiconductor layers of the respective TFTs is shown below.

When in the semiconductor layer of the n-type TFT, the density of p-type impurity in a portion of the slope portion which is capable of operating as a parasitic transistor is designated by Cn-e, and the density of p-type impurity in the main portion is designated by Cn-m, and in the semiconductor layer of the p-type TFT, the density of p-type impurity in a portion of the slope portion which is capable of operating as a parasitic transistor is designated by Cp-e, and the density of p-type impurity in the main portion is designated by Cp-m, they are expressed as follows:

$$Cn\text{-}e > Cn\text{-}m = Cp\text{-}e > Cp\text{-}m \quad (6)$$

The "density of p-type impurity in the main portion" indicates the density of p-type impurity in a region of the main portion of the semiconductor layer which will act as the channel region (a region other than the source and drain regions).

The correlation of Expression (6) satisfies both Expressions (3) and (4) described above. Accordingly, it is possible to individually control the threshold voltages Vth of the respective TFTs to optimum values.

In the above-described method, the gray-tone mask is applied to the method of the first embodiment described above with reference to FIG. 2 to FIG. 7. Alternatively, the gray-tone mask may be applied to the method of the third embodiment described above with reference to FIG. 15 to FIG. 20. In either case, by using the gray-tone mask, the mask film which covers the n-type TFT is removed and the mask film provided on the p-type TFT is made thinner in the second etching step for the semiconductor layer, so that it is possible to selectively perform channel doping to the semiconductor layer of the n-type TFT without forming another mask film.

Hereinafter, with reference to the drawings, the production method of the semiconductor device in this embodiment will be specifically described. In the following description, general process steps for fabricating a TFT such as activation annealing and hydrogenation are omitted.

Figure 35:
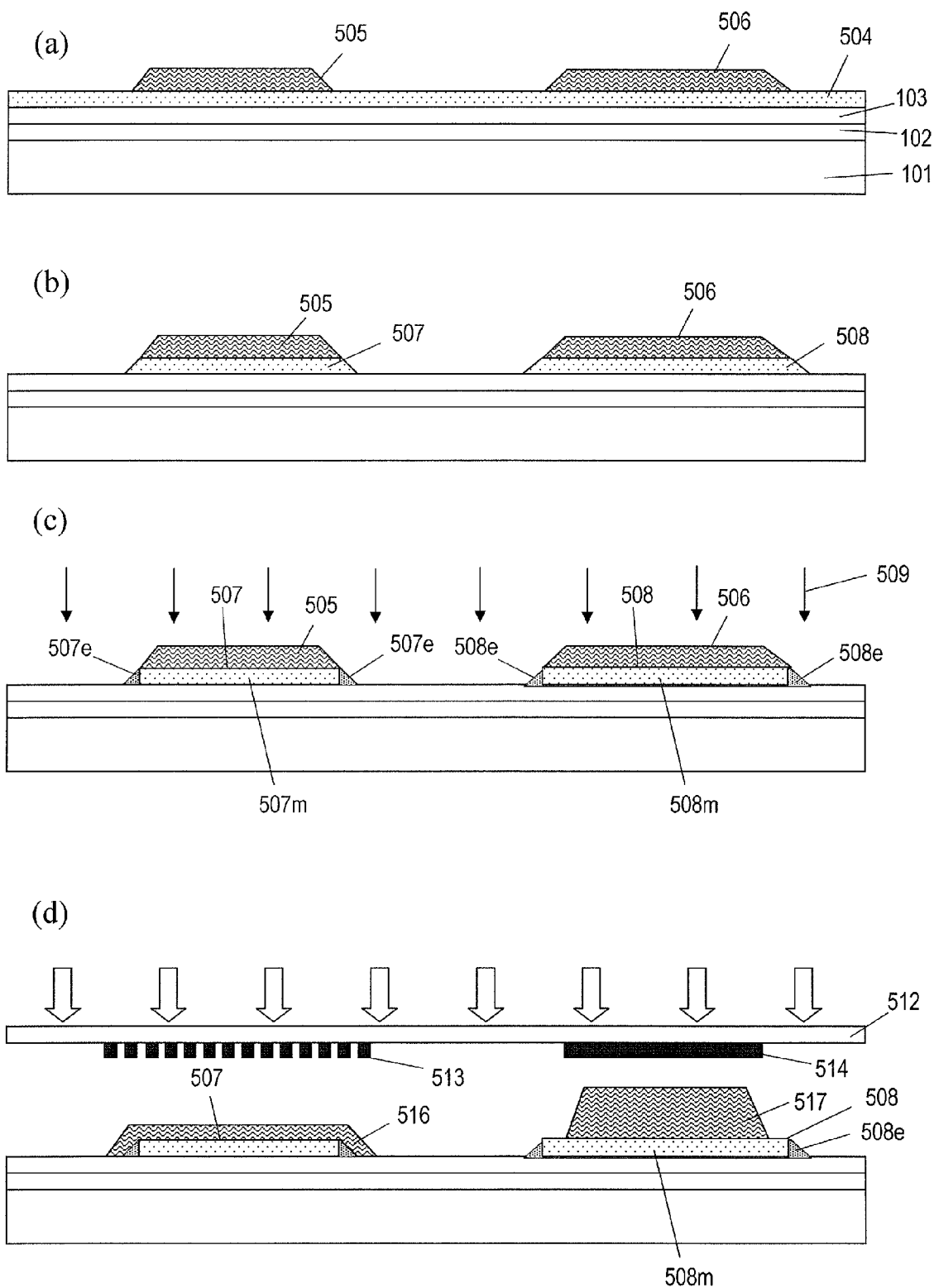
In FIG. 35, (a) to (d) are process cross-sectional views for illustrating an example of the production method of the semiconductor device in the fifth embodiment of the present invention, respectively.
Figure 36:
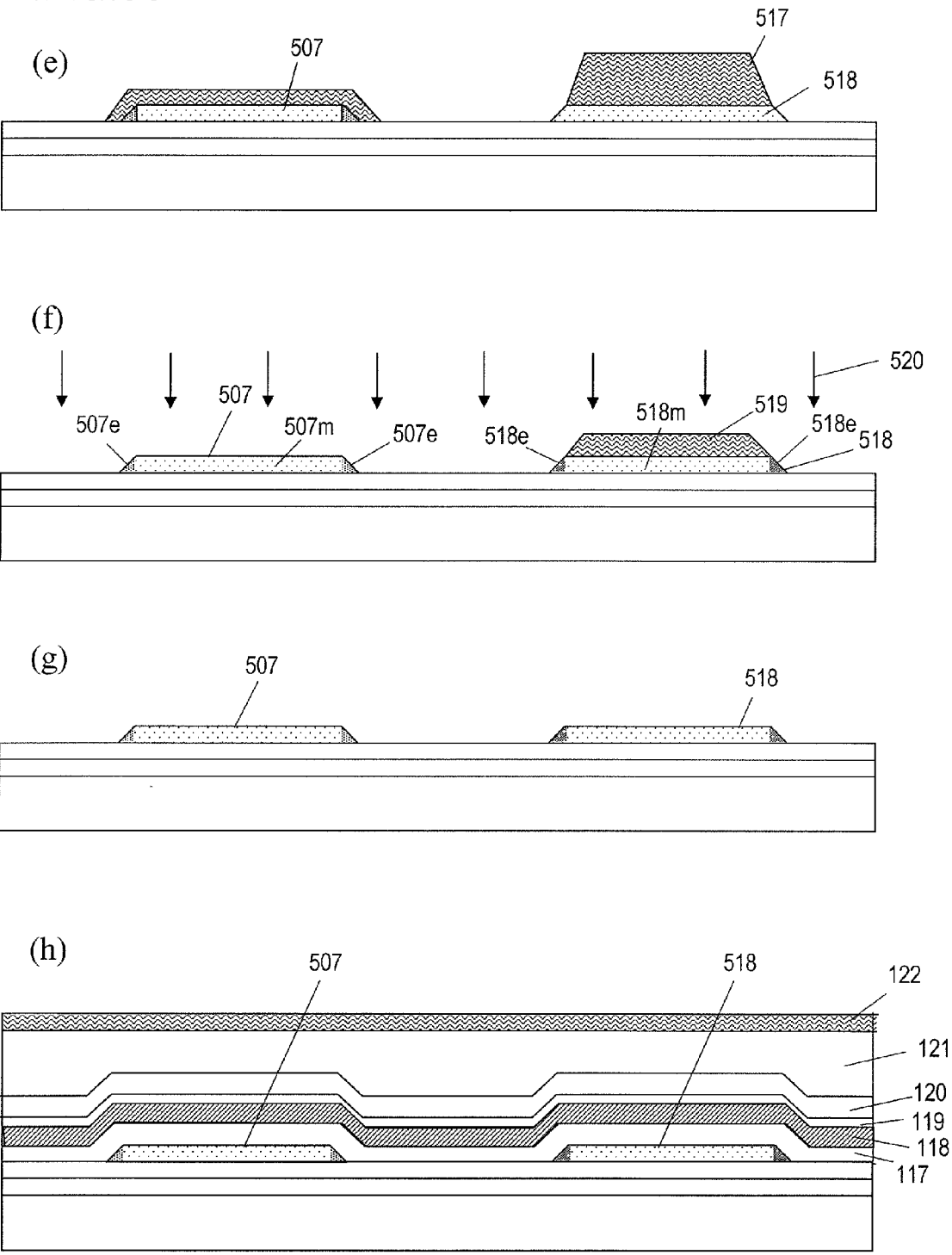
In FIG. 36, (e) to (h) are process cross-sectional views for illustrating an example of the production method of the semiconductor device in the fifth embodiment of the present invention, respectively.
Figure 37:
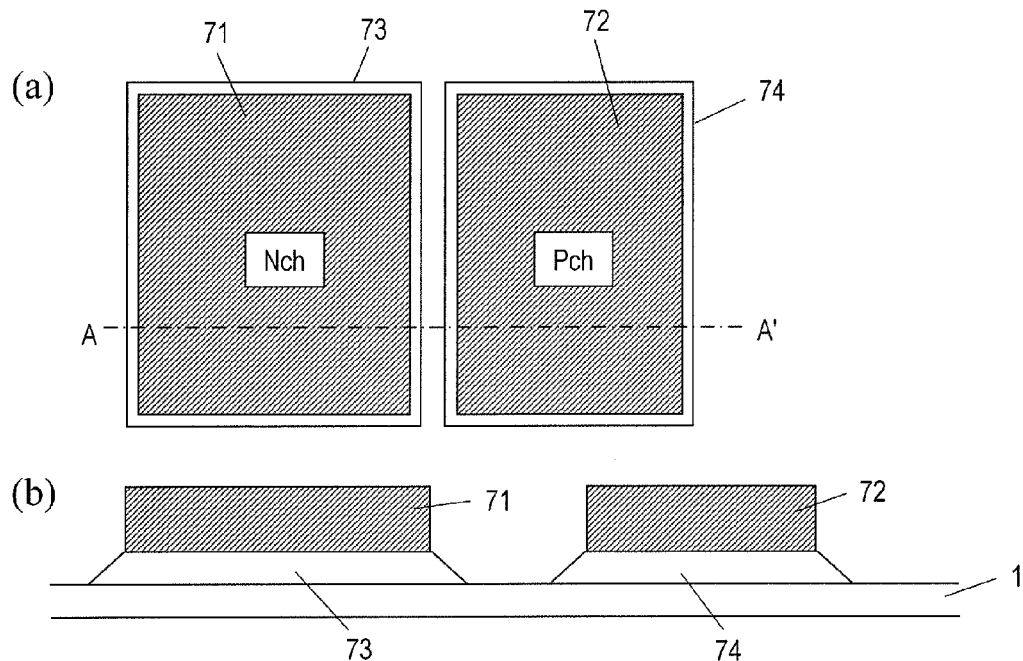
In FIG. 37, (a) and (b) are a plan view and a cross-sectional view, respectively, for generally illustrating the production method of a semiconductor device in a sixth embodiment of the present invention.

Herein (a) to (d) of FIG. 35 and (e) to (h) of FIG. 36 are process cross-sectional view for illustrating an example of the production method of the semiconductor device in this embodiment. These figures show the cross sections taken along the channel width direction. For simplicity, the components which are the same as those in FIG. 7 are designated by the same reference numerals, and the descriptions thereof are omitted.

First, as shown in FIG. 35(a), on a substrate 101, base films 102 and 103 are formed, and then a crystalline semiconductor film 504 is formed thereon. Then, on the crystalline semiconductor film 504, mask films (resist mask films) 505 and 506 are formed by photolithography. The materials and the methods for forming these films may be the same as the materials and the forming methods as described above with reference to FIG. 7(a).

Next, as shown in (b) of FIG. 35, the crystalline semiconductor film 504 is etched in an island-like manner by using the mask films 505 and 506 as a mask. As the result of the etching, a semiconductor layer 507 which will act as an active layer of the n-type TFT and a semiconductor layer 508 which will act as an active layer of the p-type TFT are obtained. The semiconductor layers 507 and 508 have rectangular patterns, for example. The semiconductor layer 507 has the pattern which is the same as the final form of the semiconductor layer of the n-type TFT. On the other hand, the semiconductor layer 508 has the pattern which is larger than the final form of the semiconductor layer of the p-type TFT in the channel width direction. The thicknesses of the semiconductor layers 507 and 508 are the same as those described in the above-described embodiment. Alternatively, the semiconductor layer 507 may have a dog-bone pattern, and the semiconductor layer 508 may have a rectangular pattern.

In this condition, as shown in (c) of FIG. 35, a p-type impurity 509 is doped from above the mask films 505 and 506 with low density. Herein boron is used as the p-type impurity 509. The implanting conditions of boron may be the same as those described above with reference to FIG. 7(c), for example. Accordingly, the p-type impurity 509 is implanted into only portions (slope portions) 507e and 508e of the semiconductor layers 507 and 508 which are not covered with the mask films 305 and 306. Thereafter, the mask films 505 and 506 are removed.

Next, a resist (a positive-type resist in this embodiment) is newly applied so as to cover the semiconductor layers 507 and 508, and the resist is exposed by using a gray-tone mask 512 as shown in (d) of FIG. 35. In this embodiment, the gray-tone mask 512 has a semi-translucent portion (a gray-tone portion) 513 and a light shielding portion (100% mask portion) 514. A portion of the resist positioned above the semiconductor layer 507 is exposed via the gray-tone portion 513 (half-exposure), so as to become thinner. On the other hand, a portion of the resist positioned above the semiconductor layer 508 is light-shielded by the 100% mask portion 514, so that the thickness of the resist at the application is maintained after the exposure.

As the result of the exposure, a mask film 516 which covers the entire of the semiconductor layer 507 and a mask film 517 which covers a part of the semiconductor layer 508 and which is thicker than the mask film 516 are formed. In this embodiment, the mask film 517 has a pattern which is longer in the channel direction and shorter in the channel width direction than the semiconductor layer 508, and the mask film 517 is disposed so as to expose a portion of the slope portion 508e of the semiconductor layer 508 extending in the channel direction (a portion positioned in the periphery of a region which will act as the channel region). It is noted that the mask film 517 may have an opening for exposing an edge portion of a region which will act as the channel region of the semiconductor layer 508, as shown in FIG. 18(a).

Thereafter, as shown in FIG. 36(a), the etching of the semiconductor layer 508 is performed by using the mask films 516 and 517 as a mask. The etching of the semiconductor layer 508 is performed by RIE (Reactive Ion Etching) utilizing CF$_4$ gas and oxygen as etching gases, for example. Accordingly, a semiconductor layer 518 which will act as the active layer of the p-type TFT is obtained. As the result of the etching, a part of the slope portion 508e into which the p-type impurity is implanted of the semiconductor layer 508 (herein a portion extending in the channel direction) is removed. In the case where the mask film 517 has the pattern shown in FIG. 18(a), the pattern of the semiconductor layer 518 is a dog-bone pattern.

Then, as shown in FIG. 36(f), the mask films 516 and 517 formed by the resist are made to be thinner films by ashing (oxygen plasma treatment). In this embodiment, by regulating the ashing time, the mask film 516 is removed, and the mask 517 is left in a thinner film condition (a mask film 519). In such a condition, a p-type impurity 520 is doped into the semiconductor layers 517 and 518 with low density from above the mask film 519. The implanting conditions of boron may be the same as the implanting conditions of boron in the first implanting step shown in FIG. 35(c), for example. Alternatively, in order to obtain a desired threshold voltage, boron may be implanted with higher dose than the dose of boron in the first implanting step. Accordingly, the p-type impurity 520 is implanted into the entire of the semiconductor layer 507 with low density. On the other hand, in the semiconductor layer 518, the p-type impurity 520 is implanted into only a portion 518e which is not covered with the mask film 519 (the slope portion).

As described above, according to this embodiment, the implantation of p-type impurity is performed twice for the slope portion 507e of the semiconductor layer 507. Accordingly, the density of p-type impurity of the slope portion 507e in the semiconductor layer 507 is higher than the densities of p-type impurity of the main portion 507m in the semiconductor layer 507, and the main portion 518m and the slope portion 518e in the semiconductor layer 518.

Next, the mask film 519 is removed. In this way, as shown in FIG. 36(g), the semiconductor layers 507 and 518 in which the doping conditions of the slope portions are different are obtained.

Thereafter, as shown in FIG. 36(h), a gate insulating film 117, a gate electrode film 118, source and drain regions, interlayer insulating films 119 and 120, source and drain electrodes, a resin layer 121, and a pixel electrode film 122 are formed. These films and regions can be formed by the same method as described above with reference to FIG. 7(g), and may have the same configuration. In this way, the n-type TFT and the p-type TFT are completed.

According to this embodiment, the same effects as those in the above-described embodiments can be attained. That is, as described above with reference to FIG. 8, in the voltage-current characteristics in both of the n-type TFT and the p-type TFT, a bump at the rising of the ON-current can be eliminated. As a result, the OFF state of the TFT can be maintained when the gate voltage Vg is 0 V, and also the threshold voltage Vth can be low.

Moreover, according to the production method of this embodiment, the threshold voltages Vth of the p-type TFT and the n-type TFT can be individually controlled without increasing the number of production process steps. Accordingly, both of the TFTs can be easily controlled so that the TFTs are in the OFF state when the gate voltage Vg is zero. As a result, the circuit utilizing the semiconductor device of this embodiment can be further stabilized.

More specifically, by selectively implanting the p-type impurity into the semiconductor layer of the n-type TFT, the density of p-type impurity Cn-m in the main portion of the semiconductor layer of the n-type TFT can be higher than the density of p-type impurity Cp-m in the main portion of the semiconductor layer of the p-type TFT. As a result, it is possible to enlarge the range of voltage values of Vg in which both of the n-type TFT and the p-type TFT are in the OFF state in the condition of Vg=0 V.

In the prior art, when the channel doping is performed only for the semiconductor layer of the n-type TFT, another photolithography step is newly provided and the step is performed by forming a resist mask. On the contrary, in this embodiment, the mask used in the patterning of the semiconductor layer of the p-type TFT (in the second patterning) is formed by utilizing the half exposure with the gray-tone mask, so that the patterning of the semiconductor layer and the channel doping can be performed with a single photo mask. Accordingly, one photolithography step can be shortened in the production process, so that the simplification of production process and the cost reduction can be attained.

If this embodiment is applied to the production method in the third embodiment, in addition to the above-mentioned effects, another effect that the circuit area can be further reduced can be attained, similarly to the third embodiment.

Sixth Embodiment

A semiconductor device in a sixth embodiment of the present invention will be described. The semiconductor device in this embodiment has the same configuration as that of the semiconductor device in the first embodiment described above with reference to FIG. 1. Also in the first embodiment, the p-type impurity is introduced into at least the portion of the slope portion of the n-type TFT which is capable of operating as the parasitic transistor with higher density than the main portion of the p-type TFT.

In this embodiment, similarly to the first embodiment, the half exposure with the gray-tone mask is utilized. In the fifth embodiment, the mask formation by half exposure is applied to the method in the first or third embodiment. On the other hand, in this embodiment, the mask formation by half exposure is applied to the method in the second or fourth embodiment. That is, the mask film used in the second etching step of the semiconductor layer is formed by half exposure with a gray-tone mask. Accordingly, without greatly increasing the number of production process steps, the p-type impurity can be selectively doped (channel doped) into the channel region of the n-type TFT. As a result, the threshold voltages Vth of the p-type TFT and the n-type TFT are individually controlled, so that the circuit characteristics can be further stabilized.

Hereinafter the production method of the semiconductor device in this embodiment will be generally described.

FIG. 37 to FIG. 41A are schematic views for generally illustrating the production method of the semiconductor device in this embodiment. In the respective figures, (a) is a plan view, and (b) is a cross-sectional view taken along a line A-A' shown in the plan view of (a). The line A-A' is parallel to the channel width direction.

First, a semiconductor film is formed on a substrate 1, and mask films (e.g. resist films) 71 and 72 are formed on the semiconductor film. Next, by using the mask films 71 and 72 as a mask, the patterning of the semiconductor film is performed. As the result of the patterning, as shown in (a) and (b) in FIG. 37, a semiconductor layer 73 which will act as an active layer of the n-type TFT and a semiconductor layer 74 which will act as an active layer of the p-type TFT are obtained on the substrate 1.

At this time, the semiconductor layer 74 is processed to be a pattern as the active layer of the p-type TFT (the final form), but the semiconductor layer 73 is processed to be a pattern which is larger than a pattern as the active layer of the p-type TFT (the final form) at least in the channel width direction. Thereafter, the mask films 71 and 72 are removed.

Figure 38:
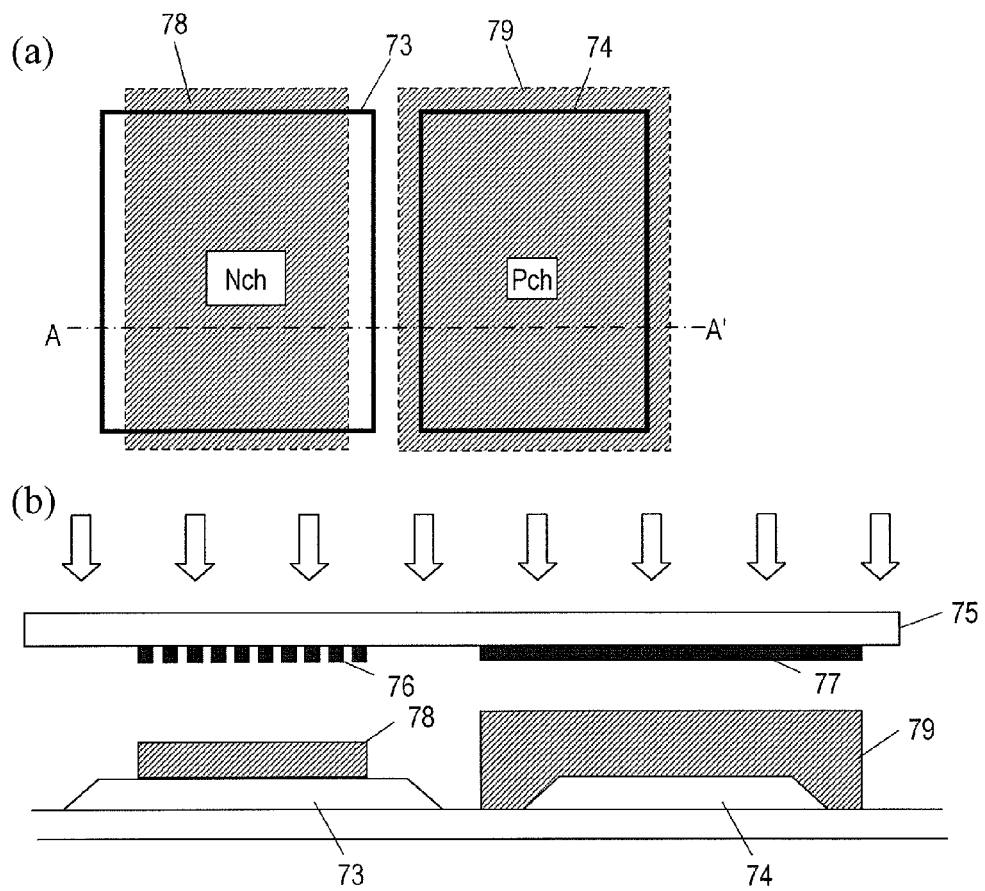
In FIG. 38, (a) and (b) are a plan view and a cross-sectional view, respectively, for generally illustrating the production method of the semiconductor device in the sixth embodiment of the present invention.

Then, a resist film (not shown) is applied on the substrate 1, and as shown in (a) and (b) of FIG. 38, a gray-tone mask 75 having a semi-translucent portion (a gray-tone portion) and a light shielding portion 77 is disposed above the substrate 1. The gray-tone mask 75 is disposed in such a manner that the semi-translucent portion 76 is positioned above the semiconductor layer 73, and the light shielding portion 77 is positioned above the semiconductor layer 74. When the resist film is exposed to light by using the gray-tone mask 75, a mask film 78 which covers a part of the semiconductor layer 73 and a mask film 79 which covers the entire of the semiconductor layer 74 are formed.

In this embodiment, a portion of the resist film positioned above the semiconductor layer 73 is half exposed, so that the mask film 78 which covers the semiconductor layer 73 is thinner than the mask film 79 formed above the semiconductor layer 74. The mask film 78 is disposed so as to expose a portion of the slope portion of the semiconductor layer 73 extending in the channel direction.

Figure 39:
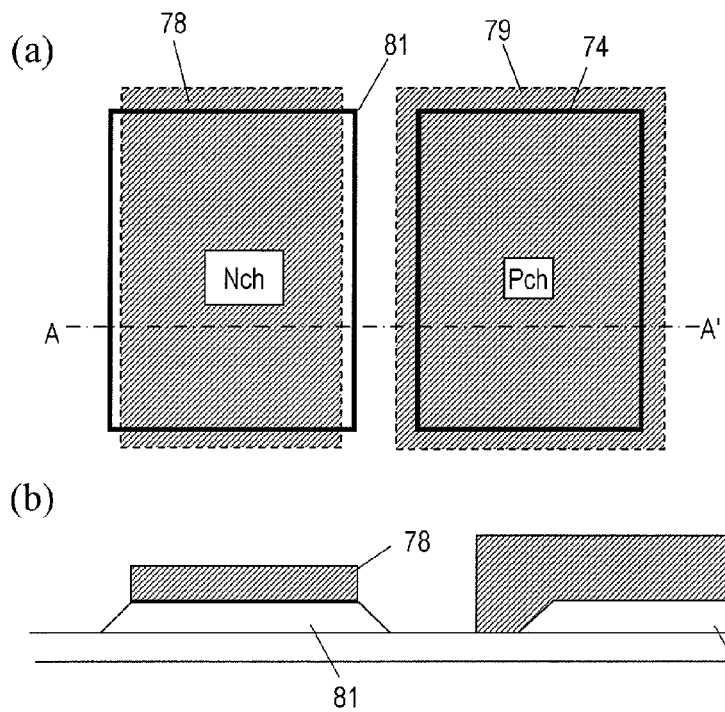
In FIG. 39, (a) and (b) are a plan view and a cross-sectional view, respectively, for generally illustrating the production method of the semiconductor device in the sixth embodiment of the present invention.

Thereafter, as shown in (a) and (b) of FIG. 39, the etching of the semiconductor layer 73 is performed by using the mask films 78 and 79 as masks. As the result of the etching, a portion of the semiconductor layer 73 which is not covered with the mask film 78 is etched. In this way, it is possible to obtain a semiconductor layer 81 which is processed so as to have the final form.

Figure 40:
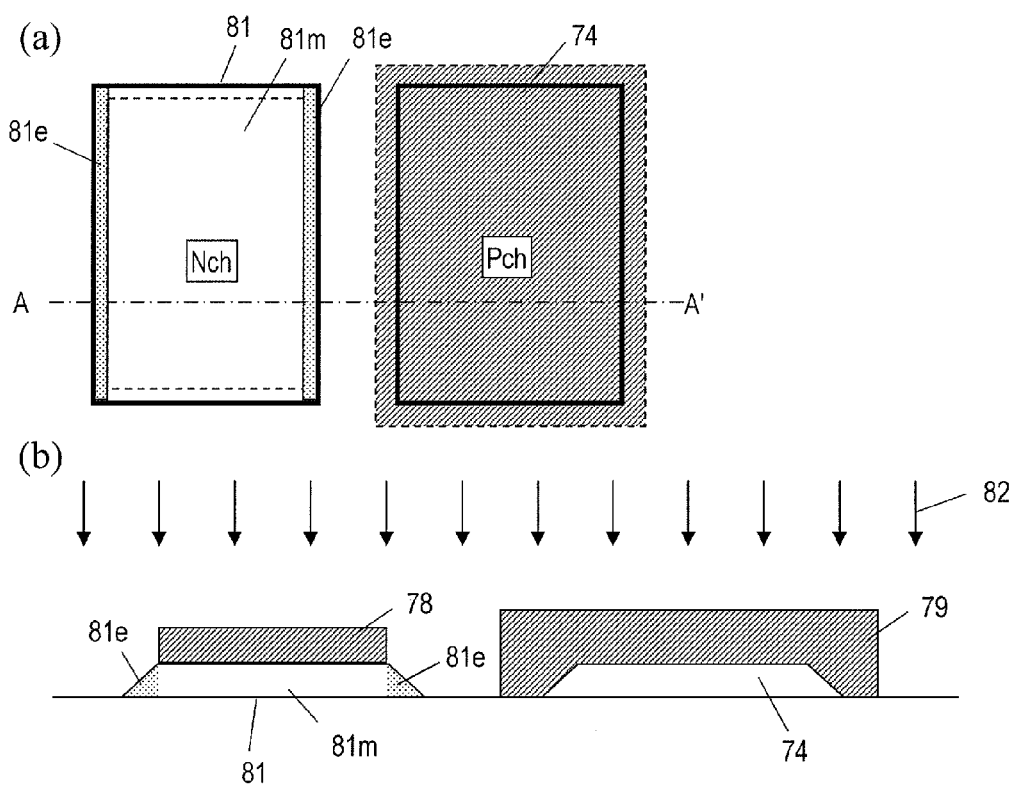
In FIG. 40, (a) and (b) are a plan view and a cross-sectional view, respectively, for generally illustrating the production method of the semiconductor device in the sixth embodiment of the present invention.

In this condition, as shown in (a) and (b) of FIG. 40, a p-type impurity (e.g. boron) 82 is implanted into the semiconductor layer 81 from above the mask films 78 and 79. Accordingly, the p-type impurity 82 is implanted into only the portion (the slope portion) 81e of the semiconductor layer 81 which is not covered with the mask film 78. The p-type impurity 82 is not implanted into the portion (the main portion) 81m of the semiconductor layer 81 which is covered with the mask film 78. In addition, since the entire of the semiconductor layer 74 is covered with the mask film 79, the p-type impurity 82 is not implanted into the semiconductor layer 74.

Figure 41A:
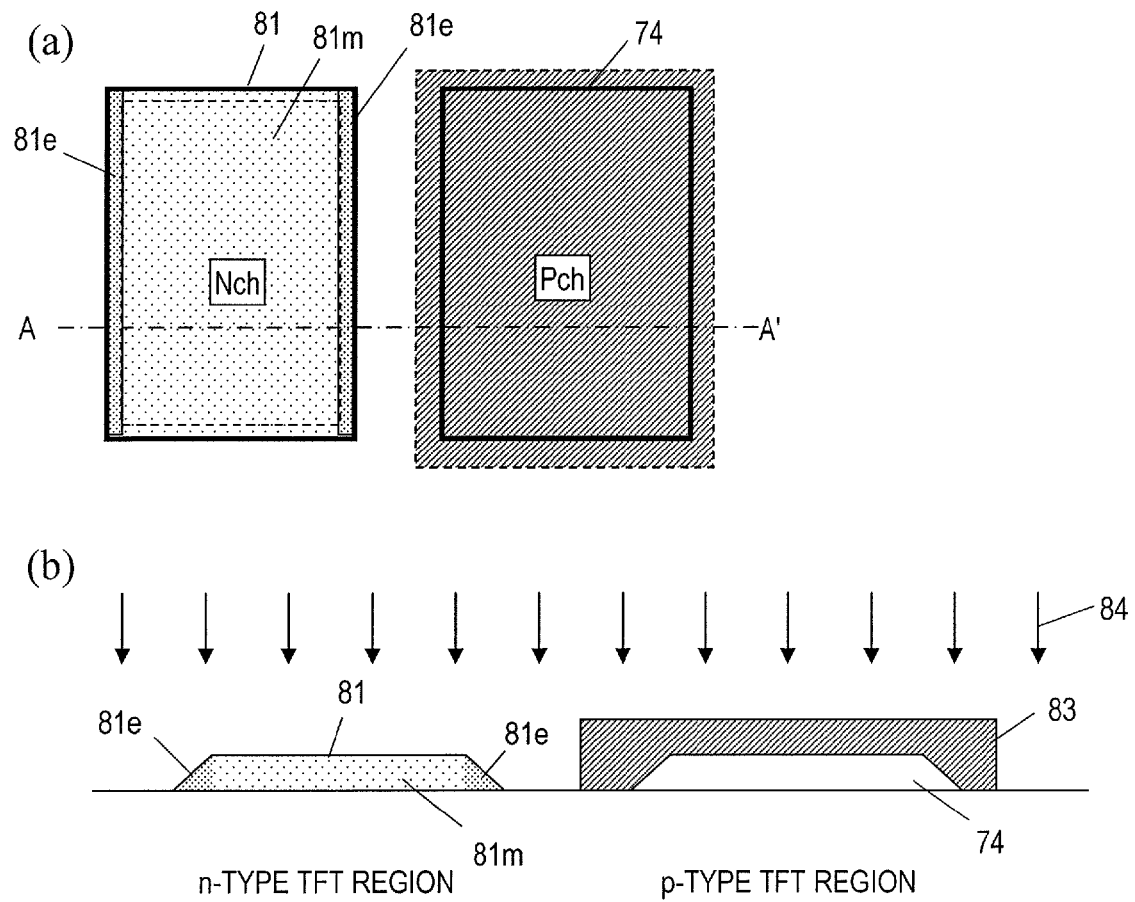
In FIG. 41A, (a) and (b) are a plan view and a cross-sectional view, respectively, for generally illustrating the production method of the semiconductor device in the sixth embodiment of the present invention.

Next, as shown in (a) and (b) of FIG. 41A, the resist of the mask films 78 and 79 is shaved off by ashing, so as to remove the mask film 78. On the other hand, the mask film 79 which is thicker than the mask film 78 is made thinner by ashing, and left as a mask film 83. In this condition, the p-type impurity (boron) 82 is doped with low density into the semiconductor layers 81 and 74 from above the mask film 83.

Accordingly, the p-type impurity 84 is implanted into only the main portion 81m and the slope portion 81e of the semiconductor layer 81 in the n-type TFT. Therefore, the threshold voltage Vth of the n-type TFT can be selectively controlled separately from the p-type TFT. Into the slope portion 84e, the p-type impurity is implanted twice with low density in the doping step shown in FIG. 40 and this doping step, so that the density of p-type impurity is further increased. On the other hand, since the semiconductor layer 74 of the p-type TFT is covered with the mask film 83, the p-type impurity 84 is not implanted into the semiconductor layer 74.

Figure 41B:
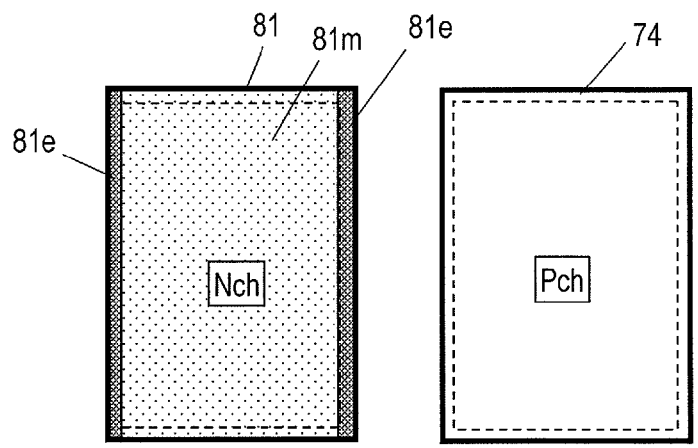
FIG. 41B is a plan view showing a semiconductor layer obtained by the production method of the semiconductor device in the sixth embodiment of the present invention.
Figure 48:
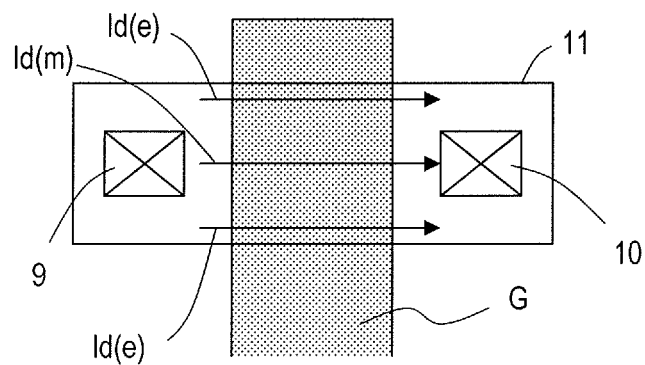
FIG. 48 is a plan view of a semiconductor layer of an n-type TFT.
Figure 49:
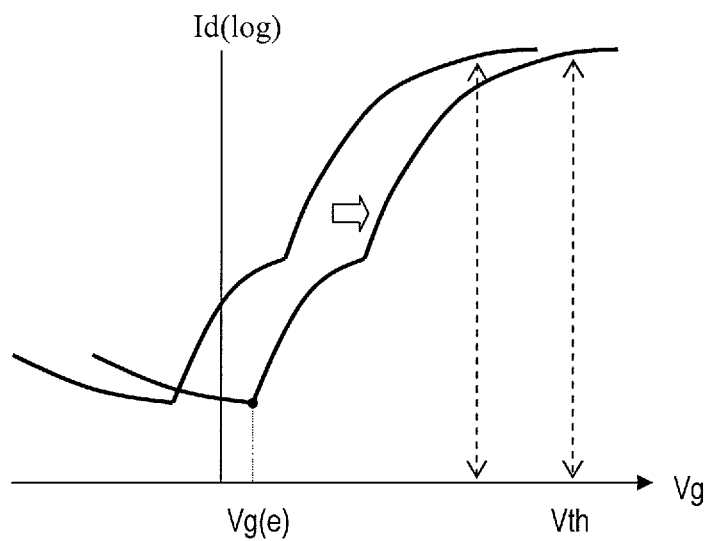
FIG. 49 is a view for illustrating the adjustment of the threshold voltage Vth in the conventional n-type TFT.

Thereafter, the mask film 83 is removed. The thus-obtained semiconductor layers 81 and 74 are shown in FIG. 41B.

Thereafter, by the same method as that described above with reference to FIG. 7(g), for example, the n-type TFT and the p-type TFT are completed, respectively, by using the semiconductor layers 81 and 74.

According to this embodiment, the magnitude correlation of the densities of p-type impurity in the semiconductor layers of the respective TFTs is shown below.

When in the semiconductor layer of the n-type TFT, the density of p-type impurity in a portion of the slope portion which is capable of operating as a parasitic transistor is designated by Cn-e, and the density of p-type impurity in the main portion is designated by Cn-m, and in the semiconductor layer of the p-type TFT, the density of p-type impurity in a portion of the slope portion which is capable of operating as a parasitic transistor is designated by Cp-e, and the density of p-type impurity in the main portion is designated by Cp-m, they are expressed as follows:

$$Cn\text{-}e > Cn\text{-}m > Cp\text{-}m = Cp\text{-}e \quad (7)$$

The correlation of Expression (7) satisfies all of Expressions (3) to (5) described above. Accordingly, it is possible to individually control the threshold voltages Vth of the respective TFTs to optimum values.

In the above-described method, the gray-tone mask is applied to the method of the second embodiment described above with reference to FIG. 9 to FIG. 13. Alternatively, the gray-tone mask may be applied to the method of the fourth embodiment described above with reference to FIG. 23 to FIG. 28. In either case, by using the gray-tone mask, the mask film which covers the n-type TFT is removed and the mask film provided on the p-type TFT is made thinner in the second etching step for the semiconductor layer, so that it is possible to selectively perform channel doping to the semiconductor layer of the n-type TFT without forming another mask film.

Hereinafter, with reference to the drawings, the production method of the semiconductor device in this embodiment will be specifically described. In the following description, general process steps for fabricating a TFT such as activation annealing and hydrogenation are omitted.

Herein (a) to (d) of FIG. 42 and (e) to (h) of FIG. 43 are process cross-sectional view for illustrating an example of the production method of the semiconductor device in this embodiment. These figures show the cross sections taken along the channel width direction. For simplicity, the components which are the same as those in FIG. 7 are designated by the same reference numerals, and the descriptions thereof are omitted.

First, as shown in FIG. 42(a), on a substrate 101, base films 102 and 103 are formed, and then a crystalline semiconductor film 604 is formed thereon. Then, on the crystalline semiconductor film 604, mask films (resist mask films) 605 and 606 are formed by photolithography. The materials and the methods for forming these films may be the same as the materials and the forming methods as described above with reference to FIG. 7(a).

Next, as shown in FIG. 42(b), the crystalline semiconductor film 604 is etched in an island-like manner by using the mask films 605 and 606 as a mask. As the result of the etching, a semiconductor layer 607 which will act as an active layer of the n-type TFT and a semiconductor layer 608 which will act as an active layer of the p-type TFT are obtained. The semiconductor layers 607 and 608 have rectangular patterns, for example. The semiconductor layer 608 has the pattern which is the same as the final form of the semiconductor layer of the p-type TFT. On the other hand, the semiconductor layer 607 has the pattern which is larger than the final form of the semiconductor layer of the n-type TFT in the channel width direction. The thicknesses of the semiconductor layers 607 and 608 are the same as those described in the above-described embodiment. Alternatively, the semiconductor layer 608 may have a dog-bone pattern, and the semiconductor layer 607 may have a rectangular pattern (see FIG. 23). Thereafter the mask films 605 and 606 are removed.

Next, a resist (a positive-type resist in this embodiment) is newly applied so as to cover the semiconductor layers 607 and 608, and the resist is exposed by using a gray-tone mask 609 as shown in FIG. 42(c). In this embodiment, the gray-tone mask 609 has a semi-translucent portion (a gray-tone portion) 611 and a light shielding portion (100% mask portion) 610. A portion of the resist positioned above the semiconductor layer 607 is exposed via the gray-tone portion 611 (half-exposure), so as to become thinner. On the other hand, a portion of the resist positioned above the semiconductor layer 608 is light-shielded by the 100% mask portion 610, so that the thickness of the resist at the application is maintained after the exposure.

As the result of the exposure, a mask film 613 which covers a part of the semiconductor layer 607 and a mask film 614 which covers the entire of the semiconductor layer 608 and which is thicker than the mask film 613 are formed. In this embodiment, the mask film 613 has a pattern which is longer in the channel direction and shorter in the channel width direction than the semiconductor layer 607, and the mask film 613 is disposed so as to expose a portion of the slope portion of the semiconductor layer 607 extending in the channel direction (a portion positioned in the periphery of a region which will act as the channel region). It is noted that the mask film 613 may have an opening for exposing an edge portion of a region which will act as the channel region of the semiconductor layer 607, as shown in FIG. 25(a).

Thereafter, as shown in FIG. 42(d), the etching of the semiconductor layer 607 is performed by using the mask films 613 and 614 as a mask. The etching of the semiconductor layer 607 is performed by RIE (Reactive Ion Etching) utilizing $CF_4$ gas and oxygen as etching gases, for example. Accordingly, a semiconductor layer 615 which will act as the active layer of the n-type TFT is obtained. In the case where the mask film 613 has the pattern shown in FIG. 25(a), the pattern of the semiconductor layer 615 is a dog-bone pattern.

In this condition, as shown in FIG. 43(e), a p-type impurity 616 is doped from above the mask films 613 and 614 with low density. Herein boron is used as the p-type impurity 616. The implanting conditions of boron may be the same as those described above with reference to FIG. 7(c), for example. Accordingly, the p-type impurity 616 is implanted into only a portion (a slope portion) 615e of the semiconductor layer 615 which is not covered with the mask film 613.

Then, ashing (oxygen plasma treatment) is performed, so that the mask films 613 and 614 formed by the resist are made to be thinner films. In this embodiment, by regulating the ashing time, the mask film 613 is removed, and the mask 614 is left in a thinner film condition (a mask film 618).

Next, in such a condition, a p-type impurity 619 is doped into the semiconductor layers 615 and 608 with low density from above the mask film 618. Herein boron is used as the p-type impurity 619. The implanting conditions of boron may be the same as the implanting conditions of boron in the first implanting step shown in FIG. 43(e). Alternatively, in order to obtain a desired threshold voltage, boron may be implanted with higher dose than the dose of boron in the first implanting step. Accordingly, the p-type impurity 619 is implanted into the entire of the semiconductor layer 615 with low density. On the other hand, since the semiconductor layer 608 is covered with the mask film 618, the p-type impurity 619 is not implanted into the semiconductor layer 608.

As described above, according to this embodiment, the implantation of p-type impurity is performed twice for the slope portion 615e of the semiconductor layer 615. Accordingly, the density of p-type impurity of the slope portion 615e in the semiconductor layer 615 is higher than the densities of p-type impurity of the main portion 615m in the semiconductor layer 615, and the main portion and the slope portion in the semiconductor layer 608. In addition, the densities of p-type impurity of the main portion and the slope portion in the semiconductor layer 608 are equal.

Next, the mask film 618 is removed. In this way, as shown in FIG. 43(g), the semiconductor layers 615 and 608 in which the doping conditions of the slope portions are different are obtained.

Thereafter, as shown in FIG. 43(h), a gate insulating film 117, a gate electrode film 118, source and drain regions, interlayer insulating films 119 and 120, source and drain electrodes, a resin layer 121, and a pixel electrode film 122 are formed. These films and regions can be formed by the same method as described above with reference to FIG. 7(g), and may have the same configuration. In this way, the n-type TFT and the p-type TFT are completed.

According to this embodiment, the same effects as those in the above-described embodiments can be attained. That is, as described above with reference to FIG. 8, in the voltage-current characteristics in both of the n-type TFT and the p-type TFT, a bump at the rising of the ON-current can be eliminated. As a result, the OFF state of the TFT can be maintained when the gate voltage Vg is 0 V, and also the threshold voltage Vth can be low.

Moreover, according to the production method in this embodiment, the threshold voltages Vth of the p-type TFT and the n-type TFT can be individually controlled without increasing the number of production process steps. Accordingly, both of the TFTs can be easily controlled so that the TFTs are in the OFF state when the gate voltage Vg is zero. As a result, the circuit utilizing the semiconductor device of this embodiment can be further stabilized.

More specifically, by selectively implanting the p-type impurity into the main portion of the semiconductor layer of the n-type TFT, it is possible to enlarge the range of voltage values of Vg in which both of the n-type TFT and the p-type TFT are in the OFF state in the condition of Vg=0 V.

In the prior art, when the channel doping is performed only for the semiconductor layer of the n-type TFT, another photolithography step is newly provided and the step is performed by forming a resist mask. On the contrary, in this embodiment, the mask used in the patterning of the semiconductor layer of the n-type TFT (in the second patterning) and in the selective doping to the slope portion is formed by utilizing the half exposure with the gray-tone mask. Accordingly, the patterning of the semiconductor layer and the channel doping can be performed with a single photo mask. Therefore, one photolithography step can be shortened in the production process, so that the simplification of production process and the cost reduction can be attained.

In addition, in the above-described fifth embodiment, the p-type impurity is implanted into the slope portion of the semiconductor layer in the p-type TFT with low density. In this embodiment, in any of the doping steps, the p-type impurity is not implanted into the slope portion of the semiconductor layer in the p-type TFT. Accordingly, the implanting conditions in the doping step of the p-type impurity can be set with higher degrees of freedom. Thus, the margin of the production process can be further increased.

In addition, when the present invention is applied to the production method of the fourth embodiment, in addition to the above-mentioned effects, the reduction of circuit area can be attained similarly to the fourth embodiment.

In the first to sixth embodiments, the semiconductor films for forming the semiconductor layers in the respective TFTs are preferably crystalline semiconductor films. A crystalline semiconductor film can be formed by crystallizing an amorphous semiconductor film. The method of crystallization is not specifically limited. For example, the crystallization can be performed by irradiating the amorphous semiconductor layer with excimer laser (laser crystallization), or the crystallization may be performed by using a catalyst element which promotes the crystallization of amorphous semiconductor film.

If the amorphous semiconductor film is crystallized by using a catalyst element, preferably, the crystallized semiconductor film has higher crystallinity than a semiconductor film (LTPS) crystallized by other methods (e.g. laser crystallization). When a TFT is formed by using the semiconductor layer with high crystallinity, the rising characteristics of the TFT at the turning to the ON state (sub-threshold characteristics) can be enhanced. That is, the change of drain current with respect to the voltage across the gate and source electrodes in the vicinity of the threshold voltage can be further steeper. Such a TFT can be suitably used especially in a memory circuit (an image memory) for which high sub-threshold characteristics are required.

Hereinafter, an example of a process of forming a semiconductor film (e.g. the semiconductor film 104 in FIG. 7(a), the semiconductor film 204 in FIG. 13(a), or the like) by the crystallization method utilizing a catalyst element will be described.

First, an amorphous semiconductor film (herein an amorphous silicon film) is formed by plasma CVD, for example, on a substrate.

Next, a catalyst element is added to at least a part of the amorphous semiconductor film. As the catalytic element, one or a plurality of elements selected from a group of nickel (Ni), iron (Fe), cobalt (Co), tin (Sn), lead (Pd), palladium (Pd), and copper (Cu) can be used. Although the catalytic effect is lower than these elements, ruthenium (Ru), rhodium (Rh), osmium (Os), iridium (Ir), platinum (Pt), gold (Au), or the like may be used.

Herein onto the amorphous semiconductor film, a solution containing a catalyst element (e.g. nickel) of 5 ppm, for example, on weight conversion (a solution of nickel acetate) is applied by spin coating. The amount of the catalyst element to be added is extremely small. When the concentration of catalyst element on the surface of the amorphous semiconductor film is measured by total reflection X-ray fluorescence analysis (TRXTF), it is about $5 \times 10^{12}$ atoms/cm$^2$, for example.

Instead of the spin coating, a thin film containing a catalyst element (a nickel film in this embodiment) may be formed on the amorphous semiconductor film by vapor deposition or sputtering.

Next, under an inert gas atmosphere, for example, in an atmosphere of nitrogen, heat treatment is performed for the amorphous semiconductor film to which the catalyst element is added. As the heat treatment, it is preferred to perform annealing at temperatures of 550 to 620° C. for thirty minutes to four hours, for example. The heat treatment may be performed by using a furnace, or may be performed by using an RTA (Rapid Thermal Annealing) device which utilizing a lamp or the like as a heat source.

During the heat treatment, the nickel which is added to the surface of the amorphous semiconductor film is dispersed in the amorphous silicon layer. At the same time, silicidation occurs and the crystallization of the amorphous silicon layer progresses by using the silicide as seeds. As a result, from the amorphous semiconductor film, a crystalline semiconductor film containing a crystalline region (herein a crystalline silicon film) is formed. It is sufficient that the crystalline semiconductor film may include a crystalline region, and a part of it may remain in the amorphous condition.

The thus-obtained crystalline semiconductor film may be irradiated with laser light, and re-crystallized, so that the crystallinity may further increased. For the irradiation of laser light, a XeCl excimer laser (308 nm in wavelength) or a KrF excimer laser (248 nm in wavelength) may be used.

Thereafter, by using the semiconductor film which is formed by the above-described method, semiconductor layers of n-type and p-type TFTs are formed by the method described above with reference to FIG. 7 and FIG. 13.

It is preferred that, before the patterning or after the patterning of the semiconductor film, heat treatment is performed, so that the catalyst element contained at least in the region which will act as the channel region of the respective semiconductor layer is moved (gettered) to another region (a gettering region). The gettering region is formed by doping an element (e.g. phosphorus) belonging to the group 5B of the periodic table which has an effect of moving the catalyst element to a part of the semiconductor film, for example. The heat treatment for gettering is performed at temperatures of 600 to 750° C. and about for 30 seconds to 20 minutes, for example.

Alternatively, after the impurity element is doped to the source and drain regions or the like of the semiconductor layer, the heat treatment may be performed, so that the impurity element can be activated and the gettering of the catalyst element can be performed.

The semiconductor layer formed by using the above-described crystallization method contains the catalyst element. In addition, at least the channel region of the semiconductor layer is mainly constituted by a region in which the <111> crystal zone of the crystal is oriented. The reason why will be described below.

In general, if the amorphous semiconductor film is crystallized without using any catalyst element, the plane orientation of the crystalline semiconductor film tends to be directed to (111) by the influence of an insulator as the base of the semiconductor film (especially in the case of amorphous silicon dioxide). On the contrary, if the amorphous semiconductor film is crystallized after the catalyst element is added, a semiconductor compound of the catalyst element acts as the driving force of the crystal growth, so that adjacent amorphous regions are successively crystallized in one direction. At this time, since the catalyst element compound has a character that it strongly grows toward the <111> direction, the <111> crystal zone appears.

According to the above-described method, 50% or more of the region in which the <111> crystal zone of the semiconductor layer is oriented constitutes a region of (110) plane orientation, or (211) plane orientation. In addition, the size (the domain diameter) of each crystal domain (a region of substantially the same plane direction) is not less than 2 μm and not more than 10 μm. The values of the plane direction and the ratio of the plane directions, and the domain diameter of the crystal domain are measured by EBSP.

Seventh Embodiment

Hereinafter, a semiconductor device in a seventh embodiment of the present invention will be described. This embodiment is an active-matrix liquid crystal display device. In the liquid crystal display device in this embodiment, a driving circuit including an n-type TFT and a p-type TFT is formed integrally with the active matrix substrate (driver monolithic).

FIG. 44(*a*) is a schematic view of an active matrix substrate 1000 in a liquid crystal display panel of this embodiment. FIG. 44(*b*) shows a schematic structure of one pixel. In FIG. 44(*a*), the structure of the active matrix substrate 1000 is shown, but a liquid crystal layer and a counter substrate are omitted. A liquid crystal display device can be obtained by providing a backlight, a power source, and the like to a liquid crystal display panel formed by using such an active matrix substrate 1000.

The active matrix substrate 1000 includes a frame area in which a gate driver 1002 and a source driver 1004 are provided, and a display area 1004 in which a plurality of pixels are disposed. A region corresponding to a pixel in the active matrix substrate 1000 is designated by the reference numeral 1005. It is noted that the source driver 1001 is not necessarily formed integrally with the active matrix substrate 1000. A source driver IC and the like which are separately produced may be mounted by a known method.

As shown in FIG. 44(*b*), the active matrix substrate 1000 has a pixel electrode P corresponding to one pixel in the liquid crystal display panel. The pixel electrode P is connected to a source bus line 1006S via a pixel-switching TFT. A gate electrode of a TFT is connected to a gate bus line 1006G.

To the gate bus line 1006G, the output of the gate drive 1002 is connected, and scanned in a line sequential manner. To the source bus line 1006S, the output of the source driver 1001 is connected, so as to supply a display signal voltage (a gray scale voltage).

In the source driver 1001 and the gate driver 1002, a plurality of CMOSs are provided for high-speed driving. For example, at least one of the gate driver 1002 and the source driver 1001 may have a shift register constituted by using a CMOS. In this embodiment, at least one of these CMOSs has the same configuration as the n-type TFT and the p-type TFT in any one of the first embodiment to the sixth embodiment.

Figure 53:
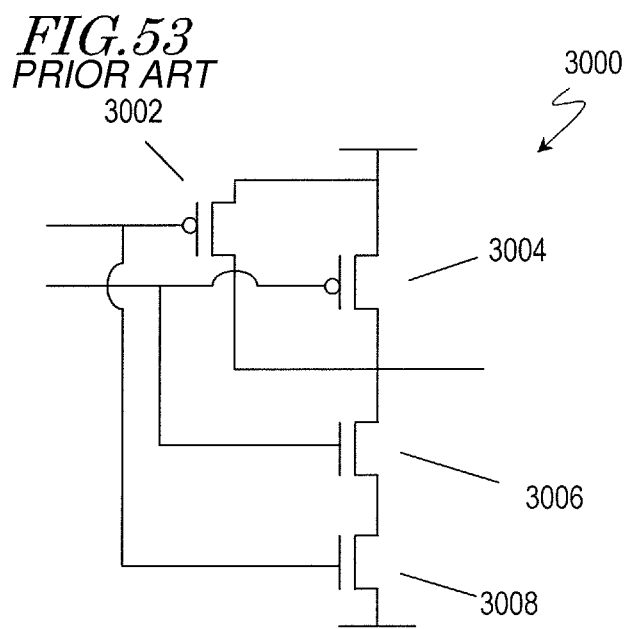
FIG. 53 is a diagram showing an example of a circuit utilizing a CMOS (an NAND circuit).

A NAND circuit is shown in FIG. 53 as an exemplary circuit using the CMOS. The TFT in any one of the above-described embodiments can be applied to p-type TFTs 3002 and 3004, and n-type TFTs 3006 and 3008 used in the NAND circuit 3000.

The semiconductor device in this embodiment may be a liquid crystal display device in which a memory circuit is provided for each pixel. Such a liquid crystal display device includes, for each pixel, a switching transistor, a pixel electrode, a memory circuit for storing an input image signal from the switching transistor to the pixel electrode, and a liquid crystal cell driven for display based on the input image signal. A signal voltage stored in the memory circuit is always applied across the liquid crystal of the corresponding pixel. Accordingly, in the case where the same static image screen is continuously displayed, the image screen can be displayed by using the signal voltage stored in the memory circuit without inputting any image signal to the display device from the external.

FIG. 45 is a diagram showing an exemplary circuit of each pixel 2000 in the semiconductor device of this embodiment.

Each pixel 2000 in the semiconductor device of this embodiment is provided with an n-type transistor 2005 connected to a source line 2003 and a gate line 2004, and a memory circuit for storing an input image signal from the transistor 2005 to the pixel. The memory circuit is an SRAM circuit constituted by p-type transistors 2007 and 2008 and n-type transistors 2009 and 2010. The p-type transistor 2007 and the n-type transistor 2009 constituting the SRAM circuit are disposed adjacently, and have the same configuration as that in any one of the above-described embodiments. Similarly, the p-type transistor 2008 and the n-type transistor 2010 are disposed adjacently, and have the same configuration as that in any one of the above-described embodiments.

A gate terminal of the transistor 2005 is connected to the gate line 2004 of the liquid crystal display device, a drain terminal thereof is connected to the source line 2003 of the liquid crystal display device, and a source terminal thereof is connected to the memory circuit. A wiring 2001 is a power supply line for the memory circuit and the voltage value thereof is to be charged to the liquid crystal 2006.

The signal voltage input from the source line 2003 is applied to an electrode 2012 provided for the liquid crystal 2006. Across the liquid crystal 2006, an electric field determined by a potential difference between the electrode 2012 and a counter electrode 2011 is applied.

Next, the operation of the circuit shown in FIG. 45 will be described. For the time period of 1/(30×the number of scanning lines) or 1/(60×the number of scanning lines), a voltage pulse is applied to the gate line 2004, so that the transistor 2005 is set in the ON state. During the time period, an image signal is charged to the liquid crystal 2006 and the gate of the transistor 2009 from the source line 2003. Now, if the image signal is an ON voltage (High), an electric field is applied to the liquid crystal 2006, so that the orientation is changed, and the transistor 2009 is tuned ON and the transistor 2010 is turned OFF. When the voltage of the gate line 2004 is an OFF voltage (Low), the transistor 2005 is turned OFF but the liquid crystal 2006 is charged via the transistor 2008, so that the orientation thereof is not changed. When the OFF voltage (Low) is input from the source line 2003 in the condition where the transistor 2005 is in the ON state, the electric field is not applied across the liquid crystal 2006, so that the transistor 2009 is in the OFF state, and the transistor 2012 is in the ON state. Even after the transistor 2005 is turned OFF, the liquid crystal 2006 is discharged via the transistor 2012 which is in the ON state, so that the electric field is not applied.

In the example shown in FIG. 45, as the memory circuit, an SRAM circuit with a simple configuration is used, but the configuration of the SRAM circuit is not limited to this. In the example shown in the figure, the SRAM circuit includes four TFTs, but alternatively may include more TFTs. Instead of the SRAM circuit, a DRAM circuit can be used.

INDUSTRIAL APPLICABILITY

The applicable range of the present invention is extremely wide, and the present invention can be applied to a semiconductor device provided with an n-type TFT and a p-type TFT or electronic equipment in any field having such a semiconductor device. For example, the CMOS circuit formed by embodying the present invention can be used in a peripheral circuit of a display device such as an active-matrix liquid crystal display device or an organic EL display device. In addition, the present invention can be suitably applied to a display device having a memory circuit for each pixel.

Such a display device can be utilized for a display screen of a mobile phone or a portable game machine, a monitor of a digital camera, or the like, for example. Accordingly, the present invention can be applied to all electronic equipment in which a liquid crystal display device or an organic EL display device is incorporated.

REFERENCE SIGNS LIST

1 Substrate
2 Base film
3 Gate insulating film
4 Interlayer insulating film
6 Protective film
8 Pixel electrode film
9(n), 9(p), 10(n), 10(p) Contact portions
11 Semiconductor layer of n-type TFT
20 Semiconductor layer of p-type TFT
11e, 20e Slope portions of semiconductor layer
11m, 20m Main portions of semiconductor layer
100 n-type TFT
200 p-type TFT
G(n), G(p) Gate electrodes
S(n), S(p) Source electrodes
D(n), D(p) Drain electrodes

The invention claimed is:

1. A semiconductor device comprising an n-channel first thin film transistor and a p-channel second thin film transistor on one and the same substrate, wherein the first thin film transistor includes: a first semiconductor layer having a channel region, a source region, and a drain region; a gate electrode disposed to overlap the channel region; and a gate insulating film disposed between the semiconductor layer and the gate electrode, the second thin film transistor includes: a second semiconductor layer having a channel region, a source region, and a drain region; a gate electrode disposed to overlap the channel region; and a gate insulating film disposed between the semiconductor layer and the gate electrode, the first and the second semiconductor layers are formed from one and the same film, each of the first and the second semiconductor layers has a slope portion positioned in the periphery and a main portion which is a portion excluding the slope portion, and a p-type impurity is introduced into the entirety of the slope portion of the first semiconductor layer and only a part of the slope portion of the second semiconductor layer with higher density than the main portion of the first semiconductor layer and the main portion of the second semiconductor layer.

2. The semiconductor device of claim 1, wherein the density of p-type impurity in the main portion of the second semiconductor layer is lower than the density of p-type impurity in the main portion of the first semiconductor layer.

3. The semiconductor device of claim 1, wherein when viewed from the normal direction of a surface of the one and the same substrate, the slope portion of the second semiconductor layer has a portion extending in a channel direction, and the density of p-type impurity in at least a portion of the portion extending in the channel direction which overlaps the gate electrode is lower than the density of p-type impurity in the slope portion of the first semiconductor layer.

4. The semiconductor device of claim 1, wherein when viewed from a normal direction of a surface of the one and the same substrate, the second semiconductor layer has a narrow portion positioned between the source region and the drain region, and the density of p-type impurity in a portion positioned in the periphery of the narrow portion in the slope portion of the second semiconductor layer is lower than the density of p-type impurity in the slope portion of the first semiconductor layer.

5. The semiconductor device of claim 1, wherein the thickness of the gate insulating film is equal to or less than the thickness of the first and the second semiconductor layers.

6. The semiconductor device of claim 1, wherein the thickness of the gate insulating film is equal to or less than 50 nm.

7. The semiconductor device of claim 1, wherein the first and the second semiconductor layers contain a catalyst element having a function of promoting the crystallization of an amorphous semiconductor film.

8. The semiconductor device of claim 7, wherein the catalyst element includes one or a plurality of elements selected from Ni, Co, Sn, Pb, Pd, Fe, and Cu.

9. The semiconductor device of claim 7, wherein at least the channel region in the first and the second semiconductor layer is mainly constituted by a region in which the <111> crystal zone of crystal planes is oriented.

10. A production method of a semiconductor device comprising an n-channel first thin film transistor and a p-channel second thin film transistor on one and the same substrate, the production method comprising: (a) a step of forming a semiconductor film on the substrate; (b) a step of forming a first mask film and a second mask film on the semiconductor film; (c) a step of etching the semiconductor film by using the first and the second mask films as a mask, thereby forming a first semiconductor layer which will act as an active region of the first thin film transistor and a second semiconductor layer which will act as an active region of the second thin film transistor, the first semiconductor layer including a main portion covered with the first mask film and a slope portion positioned in the periphery of the first semiconductor layer and not covered with the first mask film, and the second semiconductor layer including a main portion covered with the second mask film and a slope portion positioned in the periphery of the second semiconductor layer and not covered with the second mask film; (d) a step of introducing a p-type impurity into the slope portion of the first semiconductor layer and the slope portion of the second semiconductor layer by using the first and the second mask films as a mask; (e) a step of removing the first and the second mask films; (f) a step of forming a third mask film which covers the entirety of the first semiconductor layer and a fourth mask film which covers only a part of the main portion of the second semiconductor layer; (g) a step of etching at least a part of the slope portion of the second semiconductor layer into which the p-type impurity is introduced by using the third and the fourth mask films as a mask; (h) a step of introducing an n-type impurity into a part of the first semiconductor layer, thereby forming source and drain regions; and (i) a step of introducing a p-type impurity into a part of the second semiconductor layer, thereby forming source and drain regions.

11. The production method of a semiconductor device of claim 10, wherein the step (g) is a step of etching only a part of the slope portion of the second semiconductor layer into which the p-type impurity is introduced.

12. The production method of a semiconductor device of claim 10, wherein in the step (f), the fourth mask film is thicker than the third mask film, and
the production method further comprises:
(j) a step of removing the third mask film and making the fourth mask film thinner, after the step (g), and
(k) a step of introducing a p-type impurity into the entire of the first semiconductor layer and a portion of the second semiconductor layer which is not covered with the fourth mask film which is made thinner.

13. The production method of a semiconductor device of claim 10, wherein the density Cn-e of p-type impurity in a portion of the slope portion of the first semiconductor layer which overlaps the gate electrode, the density Cn-m of p-type impurity in the main portion of the first semiconductor, and the density Cp-m of p-type impurity in the second semiconductor layer satisfy the relational expression of Cn-e>Cn-m>Cp-m.

14. The production method of a semiconductor device of claim 10, further comprising a step of forming a gate insulating film on the first and second semiconductor layers, wherein
the thickness of the gate insulating film is equal to or less than the thickness of the first and the second semiconductor layers.

15. The production method of a semiconductor device of claim 10, wherein the thickness of the gate insulating film is equal to or less than 50 nm.

16. The production method of a semiconductor device of claim 10, further comprising, before the step (a),
a step of preparing an amorphous semiconductor film to which a catalyst element for promoting crystallization is at least partially added, and
a step of performing heat treatment for the amorphous semiconductor film and crystallizing at least a part of the amorphous semiconductor film, thereby obtaining the semiconductor film.

17. The semiconductor device of claim 1, further comprising an SRAM circuit, wherein
the SRAM circuit includes the first thin film transistor and the second thin film transistor.

18. A display device comprising:
the semiconductor device of claim 17; and
a plurality of pixels; wherein
each of the plurality of pixels includes:
a pixel electrode;
a memory circuit connected to the pixel electrode to store an image signal; and
a display cell configured to perform the display based on the image signal; wherein
the SRAM circuit is provided in the memory circuit.

* * * * *